United States Patent
Matsumoto et al.

(10) Patent No.: US 8,648,363 B2
(45) Date of Patent: *Feb. 11, 2014

(54) ORGANIC EL DISPLAY UNIT, METHOD OF MANUFACTURING THE SAME, AND SOLUTION USED IN METHOD

(71) Applicant: Sony Corporation, Tokyo (JP)

(72) Inventors: Toshiki Matsumoto, Kanagawa (JP); Tomoyuki Higo, Tokyo (JP); Tadahiko Yoshinaga, Kanagawa (JP); Toshiaki Imai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/780,895

(22) Filed: Feb. 28, 2013

(65) Prior Publication Data

US 2013/0187138 A1 Jul. 25, 2013

Related U.S. Application Data

(63) Continuation of application No. 13/078,441, filed on Apr. 1, 2011, now Pat. No. 8,405,100.

(30) Foreign Application Priority Data

Apr. 9, 2010 (JP) ................................. 2010-090724
Jun. 21, 2010 (JP) ................................. 2010-140561

(51) Int. Cl.
*H01L 33/00* (2010.01)

(52) U.S. Cl.
USPC ................. 257/89; 257/91; 257/103; 257/40; 257/59; 257/72; 257/E33.005; 257/E33.014; 257/E33.063; 257/E33.065; 438/28; 438/29; 438/35; 438/99

(58) Field of Classification Search
USPC ............ 257/89, 91, 103, 40, 59, 72, E33.005, 257/E33.014, E33.063, E33.065; 438/28, 438/29, 35, 99
See application file for complete search history.

(56) References Cited

U.S. PATENT DOCUMENTS

| 7,833,633 B2 | 11/2010 | Lee et al. | |
|---|---|---|---|
| 8,405,100 B2 * | 3/2013 | Matsumoto et al. | ............ 257/89 |
| 2006/0105201 A1 | 5/2006 | Lee et al. | |

FOREIGN PATENT DOCUMENTS

JP   2006-140434   6/2006

* cited by examiner

*Primary Examiner* — Tu-Tu Ho
(74) *Attorney, Agent, or Firm* — Dentons US LLP

(57) ABSTRACT

An organic electroluminescence display unit including: a lower electrode for each device; a first hole injection/transport layer provided on the lower electrode for each device; a second organic light emitting layer of the first color provided on the first hole injection/transport layer for the second organic electroluminescence device; a second hole injection/transport layer provided on the entire surfaces of the second organic light emitting layer and the first hole injection/transport layer for the first organic electroluminescence device, and being made of a low molecular material; a blue first organic light emitting layer provided on the entire surface of the second hole injection/transport layer; and an electron injection/transport layer having at least one of electron injection characteristics and electron transport characteristics, and an upper electrode that are provided in sequence on the entire surface of first organic light emitting layer.

16 Claims, 12 Drawing Sheets

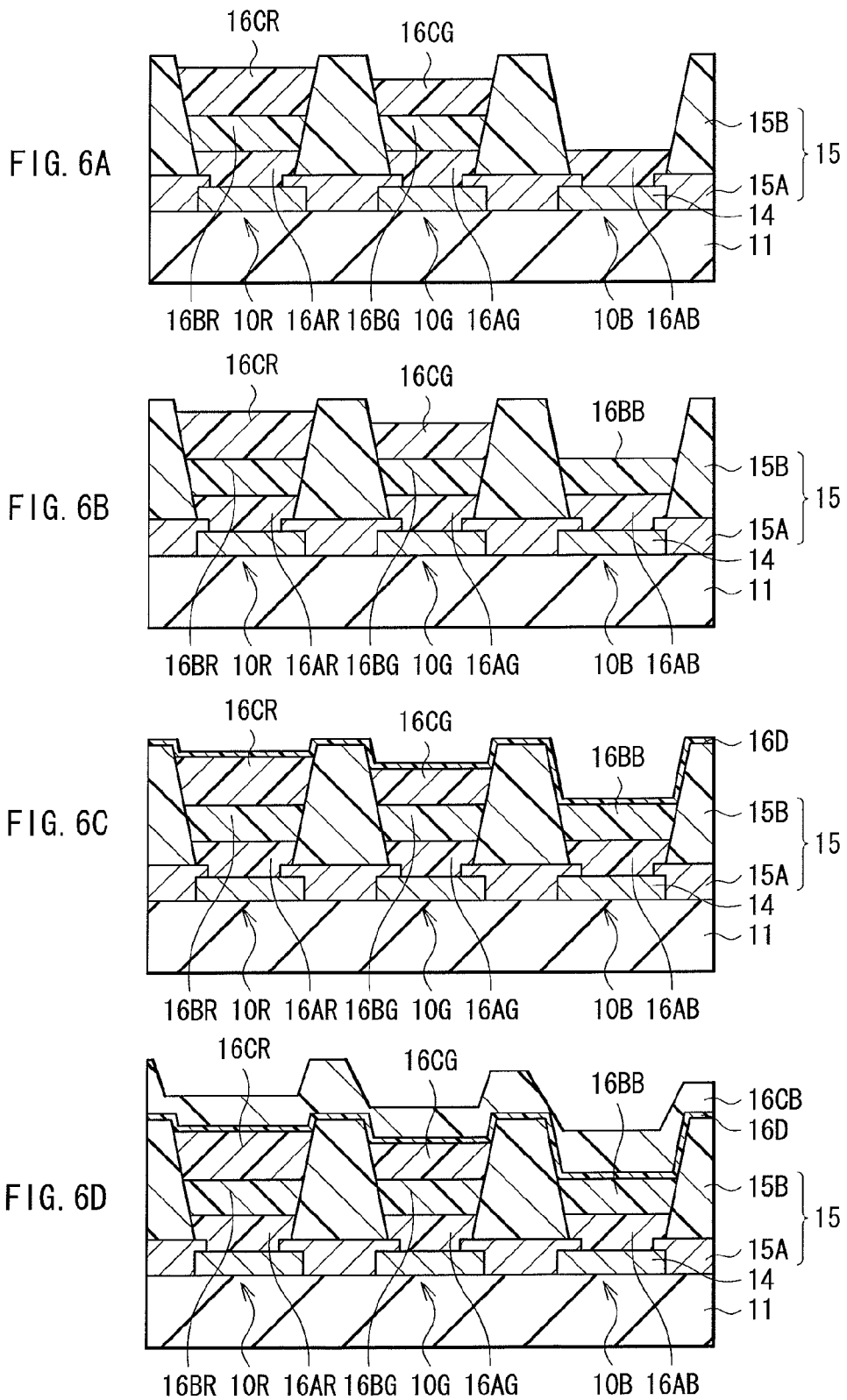

ORGANIC EL DISPLAY UNIT, METHOD OF MANUFACTURING THE SAME, AND SOLUTION USED IN METHOD

RELATED APPLICATION DATA

This application is a continuation of U.S. patent application Ser. No. 13/078,441 filed Apr. 1, 2011, the entirety of which is incorporated herein by reference to the extent permitted by law. The present application claims the benefit of priority to Japanese Patent Application Nos. JP 2010-090724 filed on Apr. 9, 2010 and JP 2010-140561 filed Jun. 21, 2010 in the Japan Patent Office, the entirety of which is incorporated by reference herein to the extent permitted by law.

BACKGROUND OF THE INVENTION

1. Field of the Invention

The present invention relates to an organic electroluminescence (EL) display unit that emits light using organic EL phenomenon, and a method of manufacturing the organic EL display unit.

2. Description of the Related Art

As development of the information communication industry accelerates, there is a demand for display devices having advanced performance. Organic EL devices that are receiving attention as next-generation display devices have the advantage of not only having a wide viewing angle and superior contrast as a spontaneous-emission display device, but also having a fast response time.

A light emitting layer and the like composing the organic EL device are largely classified into low molecular materials and polymer materials. The low molecular materials are generally known to indicate higher emission efficiency and longer life, and are also considered to have, in particular, high blue-color capability.

In addition, as a method for forming an organic layer of the organic EL device, a low-molecular material is formed by a dry process (evaporation method) such as a vacuum evaporation method, and the polymer material is formed by a wet process (coating method), such as a spin coat method, an inkjet method, a nozzle coat method.

The vacuum evaporation method has the advantages of not needing to dissolve the formation material of the organic thin film in a solvent, and not needing a procedure for removing the solvent after film formation. However, the vacuum evaporation method has disadvantages, such as separate coatings by metal masking being difficult, application onto a large screen substrate being difficult since equipment manufacturing costs for manufacturing a large-scale panel in particular are high, and mass production also being difficult. Therefore, the inkjet method and the nozzle coat method in which enlarging the area of the display screen is comparatively easy are receiving attention.

However, among the polymer materials used in the inkjet method and the nozzle coat method, blue light emitting materials in particular have low emission efficiency and life characteristics, and are not practical. Therefore, patterning by the wet process has been considered difficult.

For example, in Japanese Unexamined Patent Application Publication No. 2006-140434, a display unit is disclosed in which a blue light emitting layer and subsequent layers as common layers are formed by the vacuum evaporation method in the upper sections of a red light emitting layer and a green light emitting layer formed by the wet process including the inkjet method. As a result of such a structure, micropatterning of the blue light emitting layer becomes unnecessary, and the possibility of size increase becomes high.

SUMMARY OF THE INVENTION

However, the organic EL display unit formed by the method disclosed in Japanese Unexamined Patent Application Publication No. 2006-140434 has two significant issues in terms of practical use. One issue is the light emitting characteristics of the blue organic EL device. Since the blue hole injection layer/transport layer is formed by a coating method such as inkjet, a barrier is formed on the light emitting interface by residual solvent and environmental contamination of the interface. The emission efficiency of the blue organic EL device decreases, and a reduction in life and the like occur. A second issue is the light emitting characteristics of the red organic EL device and of the green organic EL device. In the case where the blue light emitting layer is formed by the evaporation method on the red light emitting layer and the green light emitting layer formed by a coating method such as inkjet, carrier balance is disrupted by the interface barrier between the film formed by the coating method and the film formed by the evaporation method. Thus, the emission efficiency of the red organic EL device and of the green organic EL device decrease, life decreases, and emission chromaticity also changes. Further improvement has been demanded for the foregoing reasons.

In view of the foregoing issues, in the invention, it is desirable to provide an organic EL display unit capable of improving emission efficiency and life characteristics of a blue organic EL device, while inhibiting characteristics changes on a red light emitting layer and a green light emitting layer, and a method of manufacturing the organic EL display unit.

According to an embodiment of the invention, there is provided an organic EL display unit including the following elements A to F:

A. a lower electrode provided on a substrate for each of a blue first organic EL device and a second organic EL device of first color different from blue;

B. a first hole injection/transport layer provided on the lower electrode for each of the first organic EL device and the second organic EL device, and having at least one of hole injection characteristics and hole transport characteristics;

C. a second organic light emitting layer of the first color provided on the first hole injection/transport layer for the second organic EL device;

D. a second hole injection/transport layer provided on the entire surfaces of the second organic light emitting layer and the first hole injection/transport layer for the first organic EL device, and being made of a low molecular material;

E. a blue first organic light emitting layer provided on the entire surface of the second hole injection/transport layer; and F. an electron injection/transport layer having at least one of electron injection characteristics and electron transport characteristics, and an upper electrode that are provided in sequence on the entire surface of first organic light emitting layer.

Here, the low molecular material is, for example, a monomer having a weight average molecular weight of 50 thousand or less. Although a desirable range of the molecular weight is indicated, the present invention does not necessarily exclude low molecular materials having a molecular weight exceeding the foregoing range.

In the organic EL display unit of the present invention, the second hole injection/transport layer made of a low molecular material is provided on the entire surface of the first hole injection/transport layer for the blue first organic EL device and the second organic light emitting layer of the first color. Thereby, efficiency of hole injection into the first organic light emitting layer is improved.

According to an embodiment of the invention, there is provided a method of manufacturing an organic EL display unit including the following procedures A to F:

A. a step of forming a lower electrode on a substrate for each of a blue first organic EL device and a second organic EL device of first color different from blue;
B. a step of forming a first hole injection/transport layer having at least one of hole injection characteristics and hole transport characteristics on the lower electrode for each of the first organic EL device and the second organic EL device, by a coating method;
C. a step of forming a second organic light emitting layer of the first color on the first hole injection/transport layer for the second organic EL device, by a coating method;
D. a step of forming a second hole injection/transport layer made of a low molecular material on the entire surfaces of the second organic light emitting layer and the first hole injection/transport layer for the first organic EL device, by an evaporation method;
E. a step of forming a blue first organic light emitting layer on the entire surface of the second hole injection/transport layer, by an evaporation method; and
F. a step of forming an electron injection/transport layer that having at least one of electron injection characteristics and electron transport characteristics, and an upper electrode in sequence on the entire surface of first organic light emitting layer.

In the method of manufacturing an organic EL display unit, the second hole injection/transport layer made of a low molecular material is provided on the entire surface of the first hole injection/transport layer for the blue first organic EL device and the second organic light emitting layer of the first color by evaporation method. Thereby, interface with the blue organic light emitting layer is improved and efficiency of hole injection into the first organic light emitting layer is improved.

According to an embodiment of the invention, there is provided a solution that is a solution for forming, by coating, a second organic light emitting layer in an organic EL display unit having the foregoing configuration. The solution is composed of a polymer material and a low molecular material dissolved in an organic solvent.

According to the organic EL display device and the method of manufacturing the organic EL display device, the second hole injection/transport layer made of a low molecular material is formed by evaporation method on the entire surface of the first hole injection/transport layer for the blue first organic EL device and the second organic light emitting layer of the first color. Thereby, the interface with the blue organic light emitting layer is improved, and efficiency of hole injection into the first organic light emitting layer is improved. In the result, emission efficiency and life characteristics of the first organic EL device are able to be improved. Thus, further increased emission efficiency and longer life of the organic EL display device composed of the first organic EL devices and the second organic EL devices being formed in an arrangement are able to be obtained. Further, the second hole injection/transport layer is deposited on the second organic light emitting layer. Since the second hole injection/transport layer functions as an electron transport layer, in addition to having hole injection/transport functions, electron injection characteristics to the second organic light emitting layer are not inhibited. Thereby, reduction in emission efficiency and life, and changes in emission chromaticity of the red organic EL device and the green organic EL device are able to be suppressed.

Other and further objects, features and advantages of the invention will appear more fully from the following description.

BRIEF DESCRIPTION OF THE DRAWINGS

FIGS. 6A to 6D are cross-sectional views illustrating procedures following those in FIGS. 5A to 5C.

DETAILED DESCRIPTION OF THE PREFERRED EMBODIMENTS

Embodiments of the invention will be hereinafter described in detail with reference to the drawings. The description will be given in the following order:

1. First embodiment (an organic EL display unit in which a second hole injection/transport layer is formed on a red/green light emitting layer and a blue hole transport layer)
2. Second embodiment (an organic EL display unit in which a blue hole transport layer is not provided, and a second hole injection/transport layer is formed on a blue hole injection layer)

First Embodiment

Figure 1:
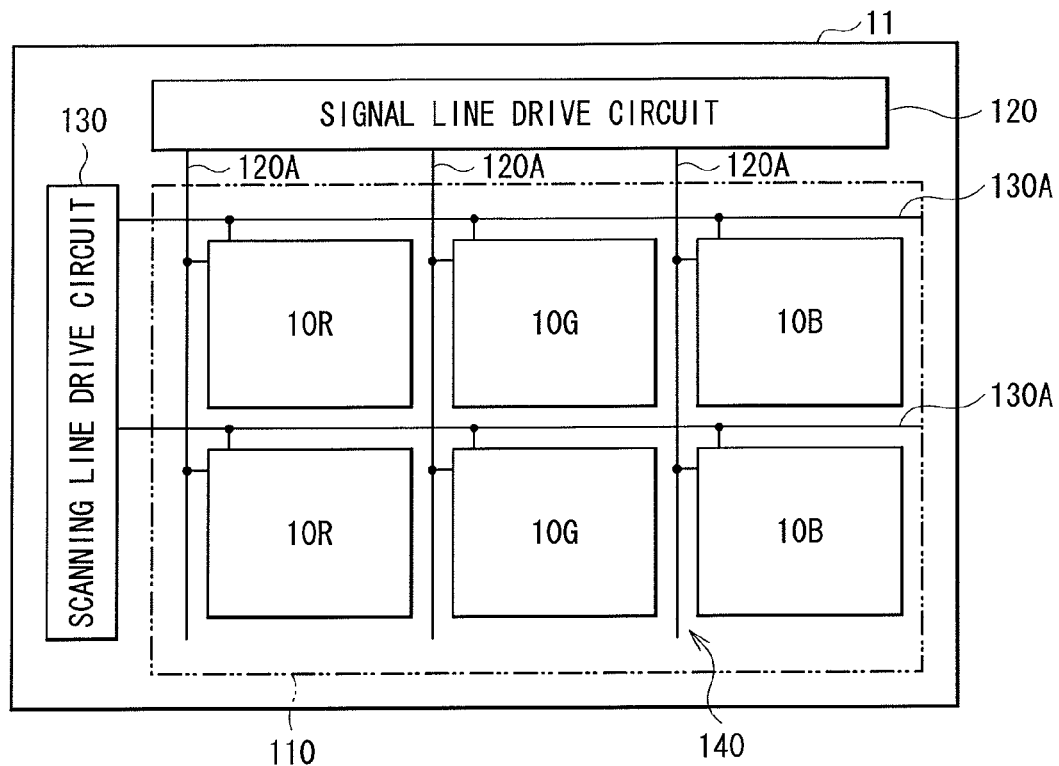
FIG. 1 is a diagram illustrating a configuration of an organic EL display unit according to a first embodiment of the present invention.

FIG. 1 illustrates a configuration of an organic EL display unit according to a first embodiment of the present invention. The organic EL display unit is used as an organic EL television device and the like. In the organic EL display unit, for example, as a display region 110, a plurality of red organic EL devices 10R, green organic EL devices 10G, and blue organic EL devices 10B, described hereinafter, are arranged in matrix form on a substrate 11. A signal line drive circuit 120 and a scanning line drive circuit 130 that are drivers for picture display are provided in the periphery of the display region 110.

Figure 2:
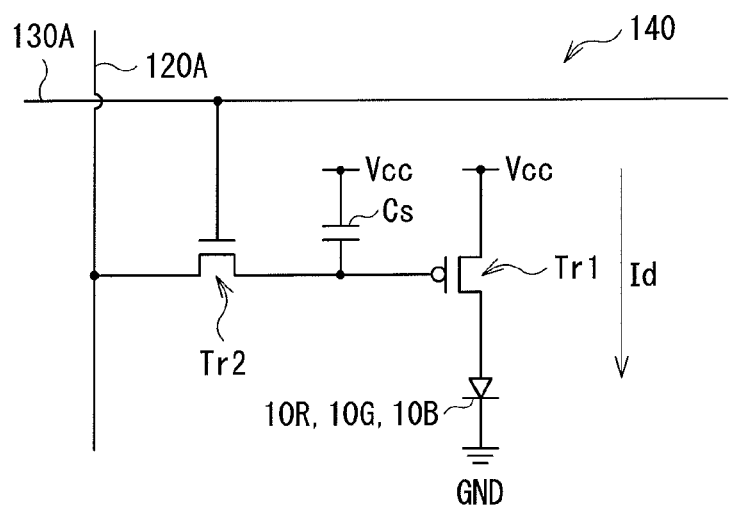
FIG. 2 is a diagram illustrating an example of a pixel drive circuit shown in FIG. 1.

A pixel drive circuit 140 is provided within the display region 110. FIG. 2 illustrates an example of the pixel drive circuit 140. The pixel drive circuit 140 is an active drive circuit formed in a layer located below a lower electrode 14, described hereinafter. That is, the pixel drive circuit 140 has a drive transistor Tr1 and a writing transistor Tr2, a capacitor (retentive capacity) Cs between the drive transistor Tr1 and the writing transistor Tr2, and a red organic EL device 10R (or a green organic EL device 10G or a blue organic EL device 10B) serially connected to the drive transistor Tr1 between a first power supply line (Vcc) and a second power supply line (GND). The drive transistor Tr1 and the writing transistor Tr2 are composed of a typical thin film transistor (TFT). The structure thereof is not particularly limited, and may be, for example, an inversely staggered structure (so-called bottom gate type) or a staggered structure (top gate type).

In the pixel drive circuit 140, a plurality of signal lines 120A are arranged in a column direction and a plurality of scanning lines 130A are arranged in a row direction. The intersection between each signal line 120A and each scanning line 130A corresponds to any one of the red organic EL device 10R, the green organic EL device 10G, and the blue organic EL device 10B (sub pixel). Each signal line 120A is connected to the signal line drive circuit 120. Image signals are supplied from the signal line drive circuit 120 to a source electrode of the writing transistor Tr2, through the signal line 120A. Each scanning line 130A is connected to the scanning line drive circuit 130. Scanning signals are sequentially supplied from the scanning line drive circuit 130 to a gate electrode of the writing transistor Tr2, through the scanning line 130A.

Further, in the display region 110, the red organic EL devices (second organic EL devices) 10R that generate red light, the green organic EL devices (second organic EL devices) 10G that generate green light, and the blue organic EL devices (first organic EL devices) 10B that generate blue light are sequentially arranged to form a matrix as a whole. A combination of adjacent red organic EL device 10R, green organic EL device 10G, and blue organic EL device 10B compose a single pixel.

Figure 3:
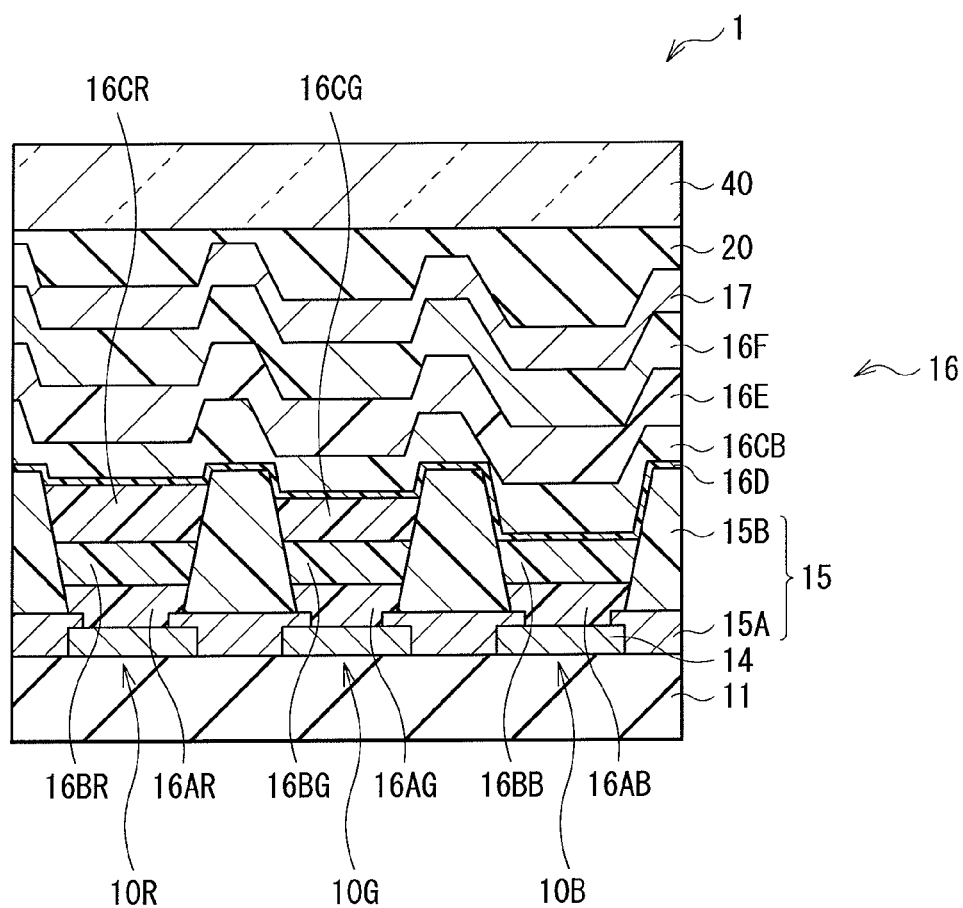
FIG. 3 is a cross-sectional view illustrating a structure of a display region shown in FIG. 1.

FIG. 3 illustrates a cross-sectional structure of the display region 110 illustrated in FIG. 1. The red organic EL device 10R, the green organic EL device 10G, and the blue organic EL device 10B each have a structure in which, a lower electrode 14 as an anode, a partition wall 15, an organic layer 16 including a light emitting layer 16C, which will be described hereinafter, and an upper electrode 17 as a cathode are layered in sequence from a substrate 11 side, with the foregoing drive transistor Tr1 of the pixel drive circuit 140 and a planarizing insulating film (not illustrated) in between.

The red organic EL device 10R, the green organic EL device 10G, and the blue organic EL device 10B such as these are coated with a protective layer 20. Further, a sealing substrate 40 made of glass or the like is bonded over the entire surface of the protective layer 20, with an adhesive layer composed of thermoset resin, ultraviolet curing resin, or the like in between, thereby sealing the red organic EL device 10R, the green organic EL device 10G, and the blue organic EL device 10B.

The substrate 11 is a supporting body in which the red organic EL devices 10R, the green organic EL devices 10G, and the blue organic EL devices 10B are formed in an arrangement on one main surface thereof. The substrate 11 may be a known substrate and, for example, quartz, glass, metal foil, or a resin film or sheet is used. Specially, quartz or glass is preferable. In the case where resin is used, examples of the material include methacrylate resins represented by polymethyl methacrylate (PMMA), polyesters such as polyethylene terephthalate (PET), polyethylene naphthalate (PEN), and polybutylene naphthalate (PBN), and polycarbonate resin. However, in this case, a stacked structure and surface treatment are needed to inhibit water permeability and gas permeability.

The lower electrode 14 is provided on the substrate 11 for each red organic EL device 10R, green organic EL device 10G, and blue organic EL device 10B. The lower electrode 14 has, for example, a lamination direction thickness (hereinafter simply referred to as thickness) from 100 nm to 1000 nm both inclusive. Examples of the material of the lower electrode 14 include a simple substance or an alloy of metal elements such as chromium (Cr), gold (Au), platinum (Pt), nickel (Ni), copper (Cu), tungsten (W), and silver (Ag). Further, the lower electrode 14 may have a stacked structure composed of a metal film made of a simple substance or an alloy of the foregoing metal elements, and a transparent conductive film made of an oxide of indium and tin (ITO), indium zinc oxide (InZnO), an alloy of zinc oxide (ZnO) and aluminum (Al), or the like. In the case where the lower electrode 14 is used as an anode, the lower electrode 14 is preferably made of a material having high hole injection characteristics. However, even a material, such as an aluminum (Al) alloy, in which a hole injection barrier resulting from the presence of an oxide membrane on the surface and a small work function become an issue is able to be used as the lower electrode 14 by providing an appropriate hole injection layer.

The partition wall 15 ensures insulation between the lower electrode 14 and the upper electrode 17, and forms the light emitting region into a desired shape. Further, in a manufacturing procedure described hereinafter, the partition wall 15 also provides a function as a partition wall during coating by the inkjet or nozzle coat method. The partition wall 15 has, for example, an upper partition wall 15B made of a photosensitive resin, such as positive-type photosensitive polybenzoxazole or positive-type photosensitive polyimide, on a lower partition wall 15A made of an inorganic insulating material, such as $SiO_2$. An aperture is provided in the partition wall 15 in correspondence with the light emitting region. Although the organic layer 16 and the upper electrode 17 may be provided not only in the aperture, but also on the partition wall 15, light-emission occurs only in the aperture of the partition wall 15.

The organic layer 16 of the red organic EL device 10R has, for example, a structure in which a hole injection layer 16AR, a hole transport layer 16BR, a red light emitting layer 16CR, a common hole transport layer (second hole injection/transport layer) 16D, a blue light emitting layer 16CB, an electron transport layer 16E, and an electron injection layer 16F are layered in sequence from the lower electrode 14 side. The organic layer 16 of the green organic EL device 10G has, for example, a structure in which a hole injection layer 16AG, a hole transport layer 16BG, a green light emitting layer 16CG, the common hole transport layer 16D, the blue light emitting layer 16CB, the electron transport layer 16E, and the electron injection layer 16F are layered in sequence from the lower electrode 14 side. The organic layer 16 of the blue organic EL device 10B has, for example, a structure in which a hole injection layer 16AB, a hole transport layer 16BB, the common hole transport layer 16D, the blue light emitting layer 16CB, the electron transport layer 16E, and the electron injection layer 16F are layered in sequence from the lower electrode 14 side. Among these, the common electron hole transport layer 16D, the blue light emitting layer 16CB, the electron transport layer 16E, and the electron injection layer 16F are provided as common layers for the red organic EL device 10R, the green organic EL device 10G, and the blue organic EL device 10B.

The hole injection layers 16AR, 16AG, and 16AB are intended to improve efficiency of hole injection into each light emitting layer 16C (the red light emitting layer 16CR, the green light emitting layer 16CG, and the blue light emitting layer 16CB) and are buffer layers for preventing leakage. The hole injection layers 16AR, 16AG, and 16AB are respectively provided on the lower electrode 14 for the red organic EL device 10R, the green organic EL device 10G, and the blue organic EL device 10B.

The thickness of the hole injection layers 16AR, 16AG, and 16AB is, for example, preferably 5 nm to 100 nm, both inclusive, and more preferably 8 nm to 50 nm, both inclusive. The component material of the hole injection layers 16AR, 16AG, and 16AB is selected appropriately depending the relationship with the materials of the electrodes and adjacent layers. Examples of the component material include polyaniline, polythiophene, polypyrrole, polyphenylene vinylene, polythienylene vinylene, polyquinoline, polyquinoxaline, or a derivative thereof, conductive polymer such as a polymer containing an aromatic amine structure in the main chain or the side chain, metal phthalocyanine (such as copper phthalocyanine), carbon, and the like.

In the case where the material used for the hole injection layers 16AR, 16AG, and 16AB is a polymer material, the weight average molecular weight (Mw) thereof is within a range of 10 thousand to 300 thousand, both inclusive, and preferably about 5 thousand to 200 thousand, both inclusive, in particular. Further, although an oligomer with an Mw of about 2 thousand to 10 thousand, both inclusive, may be used, if the Mw is less than 5 thousand, the hole injection layer may dissolve when layers subsequent to the hole transport layer are formed. Further, if the Mw exceeds 300 thousand, the material may gel, and film formation may become difficult.

Examples of a typical conductive polymer used as the component material of the hole injection layers 16AR, 16AG, and 16AB include polyaniline, oligoaniline, and a polydioxythiophene such as poly(3,4-ethylenedioxythiophene) (PEDOT). In addition, examples thereof include polymer commercially available as Nafion (registered trademark) manufactured by H. C. Starck, polymer commercially available in a dissolved state as Liquion (registered trademark), L Source (registered trademark) manufactured by Nissan Chemical Industries, Ltd., and conductive polymer Belazole (registered trademark) manufactured by Soken Chemical and Engineering Co. Ltd.

The hole transport layers 16BR and 16BG of the red organic EL device 10R and green organic EL device 10G are intended to improve efficiency of hole transport to the red light emitting layer 16CR and the green light emitting layer 16CG. The hole transport layers 16BR and 16BG are respectively provided on the hole injection layers 16AR and 16AG for the red organic EL device 10R and the green organic EL device 10G.

The thickness of the electron hole transport layers 16BR and 16BG is, for example, preferably 10 nm to 200 nm, both inclusive, and more preferably 15 nm to 150 nm, both inclusive, though depending on the overall structure of the device. As the polymer material composing the hole transport layers 16BR and 16BG, a light emitting material that is able to be dissolved in an organic solvent, such as polyvinyl carbazole, polyfluorene, polyaniline, polysilane, or a derivative thereof, a polysiloxane derivative containing an aromatic amine structure in the side chain or the main chain, polythiophene or a derivative thereof, or polypyrrole is able to be used.

In the case where the material used in the hole transport layers 16BR and 16BG is a polymer material, the weight average molecular weight (Mw) is preferably within a range of 50 thousand to 300 thousand, both inclusive, and preferably 100 thousand to 200 thousand, both inclusive, in particular. If the Mw is less than 50 thousand, the low molecular component within the polymer material is lost during formation of the light emitting layer 16C, and dots are formed in the hole injection layer 16A and the hole transport layer 16B. Thus, the initial performance of the organic EL device may decrease, and deterioration of the device may occur. Meanwhile, if the Mw exceeds 300 thousand, the material may gel, and film formation may become difficult. The weight average molecular weight (Mw) is a value that is the weight average molecular weight of polystyrene conversion determined by gel permeation chromatography (GPC) using tetrahydrofuran as a solvent.

The red light emitting layer 16CR and the green light emitting layer 16CG are intended to generate light due to electron-hole recombination by applying an electric field. The thickness of the red light emitting layer 16CR and the green light emitting layer 16CG are, for example, preferably 10 nm to 200 nm, both inclusive, and more preferably 15 nm to 150 nm, both inclusive, though depending on the overall structure of the device. The red light emitting layer 16CR and the green light emitting layer 16CG are composed of a mixture in which low molecular material is added to polymer (light emitting) material. The low molecular material herein is preferably a material that is a monomer or an oligomer in which two to ten, both inclusive, of the monomer are bonded, and having a weight average molecular weight of 50 thousand or less. Low molecular materials having a weight average molecular weight exceeding the foregoing range are not necessarily excluded.

Although as will hereinafter be described in detail, the red light emitting layer 16CR and the green light emitting layer 16CG are formed, for example, by a coating method such as inkjet. During formation, the polymer material and the low molecular material are dissolved using at least one type of organic solvent, such as toluene, xylene, anisole, cyclohexanone, mesitylene(1,3,5-trimethylbenzene), pseudocumene (1,2,4-trimethylbenzene), dihydrobenzofuran, 1,2,3,4-tetramethylbenzene, tetraline, cyclohexylbenzene, 1-methylnaphthalene, p-anisyl alcohol, dimethylnaphthalene, 3-methylbiphenyl, 4-methylbiphenyl, 3-isopropylbiphenyl, or monoisopropylnaphthalene. The red light emitting layer 16CR and the green light emitting layer 16CG are formed using this mixture.

Examples of the polymer material composing the red light emitting layer 16CR and the green light emitting layer 16CG include a polyfluorene polymer derivative, a (poly)paraphenylene vinylene derivative, a polyphenylene derivative, a polyvinyl carbazole derivative, a polythiophene derivative, a perylene dye, a coumarin dye, a rhodamin dye, and the foregoing polymers doped with an organic EL material. As the doping material, rubrene, perylene, 9,10-diphenylanthracene, tetraphenyl butadiene, nile red, coumarin 6, or the like is able to be used.

A low molecular material is preferably added to the polymer material composing the red light emitting layer 16CR and the green light emitting layer 16CG. Thereby, efficiency of injecting holes and electrons into the red light emitting layer 16CR and the green light emitting layer 16CG from the blue light emitting layer 16CB that is a common layer is improved. The principle thereof will be described below.

In an organic EL light emitting device of related art, the blue light emitting layer 16CB composed of a low molecular material is formed as a common layer on the upper sections of the red light emitting layer 16CR and the green light emitting layer 16CG composed only of a polymer. The difference between the energy levels of the red light emitting layer 16CR and the green light emitting layer 16CG, and the energy level of the blue light emitting layer 16CB is large. Thus, injection efficiency of the holes or the electrons between the blue light emitting layer 16CB and the red light emitting layer 16CR, and between the blue light emitting layer 16CB and the green light emitting layer 16CG is extremely low. Further, as described above, there is an issue in that the intended characteristics of a light emitting layer made of a polymer material may not be sufficiently obtained. According to the present embodiment, to improve the injection characteristics of the hole or the electron, a low molecular material (a monomer or an oligomer) that reduces the difference between the energy levels of the red light emitting layer 16CR and the green light emitting layer 16CG, and the energy level of the blue light emitting layer 16CB is added to the red light emitting layer 16CR and the green light emitting layer 16CG. Here, a relationship between the highest occupied molecular orbital (HOMO) levels and the lowest unoccupied molecular orbital (LUMO) levels of the red light emitting layer 16CR and the green light emitting layer 16CG, the HOMO level and the LUMO level of the blue light emitting layer 16CB, and the HOMO level and the LUMO level of the low molecular material to be added to the red light emitting layer 16CR and the green light emitting layer 16CG is considered. As a specific low molecular material to be added, a compound having a value lower than the respective LUMO of the red light emitting layer 16CR and the green light emitting layer 16CG, a value higher than the LUMO of the blue light emitting layer 16CB, a value higher than the respective HOMO of the red light emitting layer 16CR and the green light emitting layer 16CG, and a value lower than the HOMO of the blue light emitting layer 16CB is selected.

Further, the low molecular material to be added to the red light emitting layer 16CR and the green light emitting layer 16CG means a material other than a compound composed of molecules of a high molecular weight polymer or condensation polymer generated by low molecular weight compound repeating the same reaction or a similar reaction in a chain reaction, and a material of which the molecular weight is in effect uniform. Further, new chemical bonding between molecules as a result of heating does not occur, and the material exists as a single molecule. The weight average molecular weight (Mw) of such a low molecular material is preferably 50 thousand or less, since a material having a molecular weight that is smaller to a certain degree than a material having a large molecular weight of, for example, 50 thousand or more has diverse characteristics, and adjustment of the mobility of the holes or electrons, band gap, the solubility in a solvent, and the like is facilitated. In addition, the amount of low molecular weight material to be added is preferably that the mixture ratio of polymer material to low molecular material used in the red light emitting layer 16CR or the green light emitting layer 16CG is between 10:1 and 1:2, both inclusive in weight ratio. In the case where the mixture ratio of polymer material to low molecular material is less than 10:1, the effect obtained by adding the low molecular material decreases. Further, in the case where the mixture ratio exceeds 1:2, the characteristics of the polymer material as a light emitting material is difficult to obtain.

As described above, carrier balance of the holes and the electrons is able to be more easily adjusted by the low molecular material being added to the red light emitting layer 16CR and the green light emitting layer 16CG. In the result, reduction in the characteristics of electron injection and hole transport to the red light emitting layer 16CR and the green light emitting layer 16CG caused by formation of the common hole transport layer 16D, the blue light emitting layer 16CB, and the electron transport layer 16E, which will be described hereinafter, is inhibited. That is, reduction in emission efficiency and life of the red organic EL device 10R and the green organic EL device 10G, increase in drive voltage, and changes in emission chromaticity are inhibited.

As such a low molecular material, for example, benzene, styrylamine, triphenylamine, porphyrin, triphenylene, azatriphenylene, tetracyanquinodimethane, triazole, imidazole, oxadiazole, polyarylalkane, phenylenediamine, arylamine, oxazole, anthracene, fluorenone, hydrazone, stibene, or a derivative thereof, or a heterocyclic conjugated monomer or oligomer, such as a polysilane compound, a vinylcarbazole compound, a thiophene compound, or an aniline compound, is able to be used.

Specific examples of the low molecular material include, but are not limited to, α-naphthylphenylphenylenediamine, porphyrin, metal tetraphenylporyphyrin, metal naphthalocyanine, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano-4,4,4-tris(3-methylphenylphenylamino)triphenylamine, N,N,N',N'-tetrakis(p-tolyl)-p-phenylenediamine, N,N,N',N'-tetraphenyl-4,4'-diaminobiphenyl, N-phenylcarbazole, 4-di-p-tolylaminostilbene, poly(paraphenylene vinylene), poly(thiophene vinylene), and poly(2,2-thienylpyrrole).

More preferably, low molecular materials expressed by following Formula 1 to Formula 3 are given.

Formula 1

(1)

In the formula, A1 to A3 represent an aromatic hydrocarbon group, a heterocyclic group, or a derivative thereof Formula 2

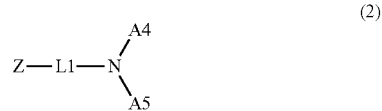

(2)

In the formula, Z represents a nitrogen-containing hydrocarbon group or a derivative thereof. L1 represents a group in which one to four bivalent aromatic ring groups are bonded, and specifically, a bivalent group in which one to four aromatic rings are bonded, or a derivative thereof A4 and A5 represent an aromatic hydrocarbon group, an aromatic heterocyclic group, or a derivative thereof. However, A4 and A5 may bond to each other and form a ring-shaped structure.)

Formula 3

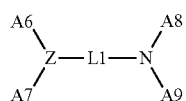
(3)

In the formula, L2 represents a group in which two to six bivalent aromatic ring groups are bonded, and specifically, a bivalent group in which two to six aromatic rings are bonded or a derivative thereof A6 to A9 represent a group in which one to ten aromatic hydrocarbon groups, heterocyclic groups, or a derivative thereof are bonded.

Specific examples of the compound indicated in Formula 1 include compounds expressed in following Formulas (1-1) to (1-48).

Formula (1-1) to Formula (1-48)

(1-1)
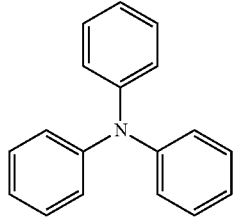

(1-2)
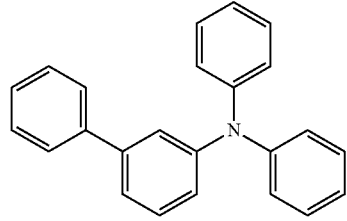

(1-3)
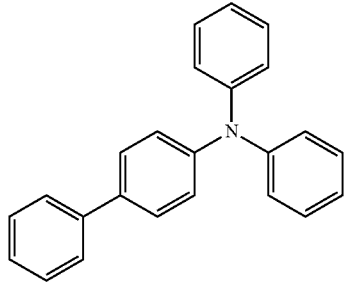

(1-4)
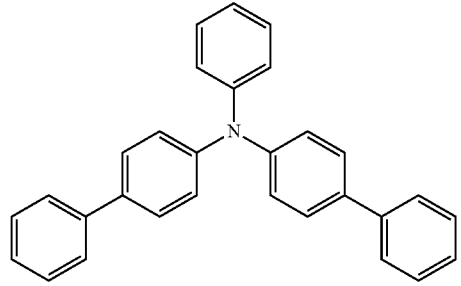

(1-5)
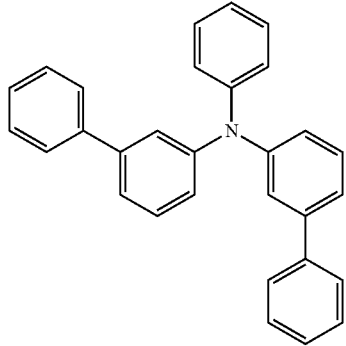

(1-6)
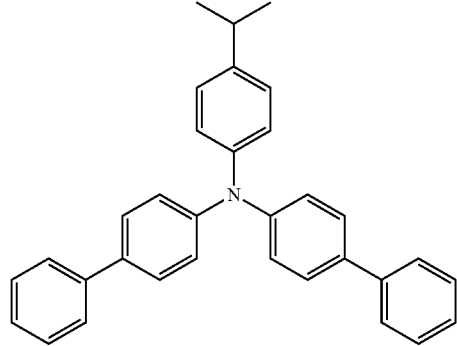

(1-7)
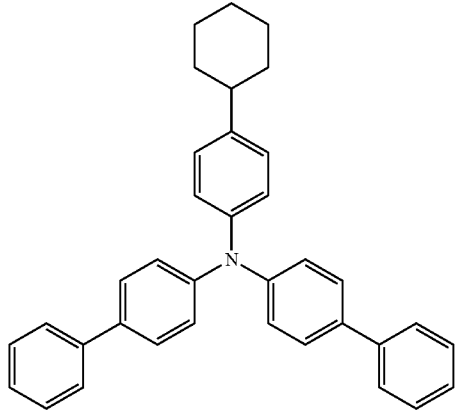

(1-8)
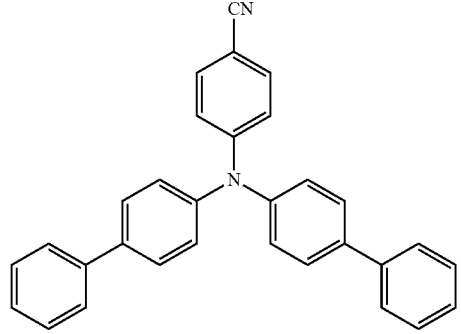

-continued
(1-9)
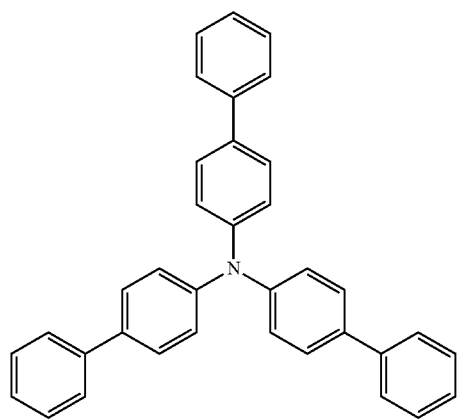
(1-10)
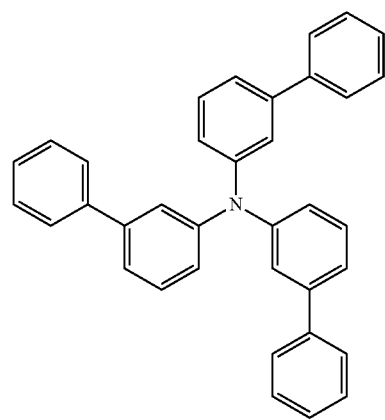
(1-11)
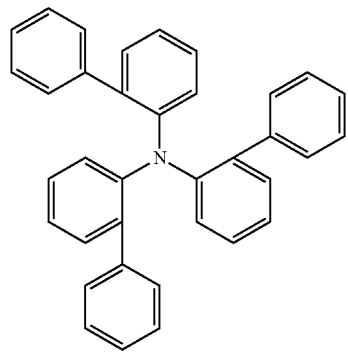
(1-12)
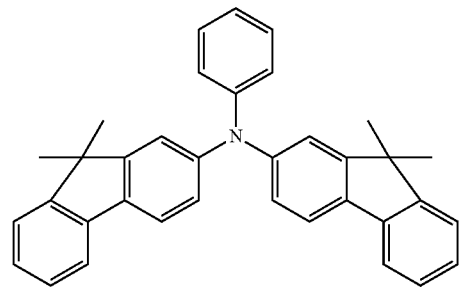
(1-13)
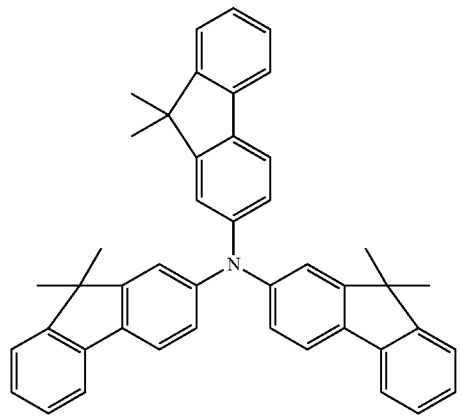
(1-14)
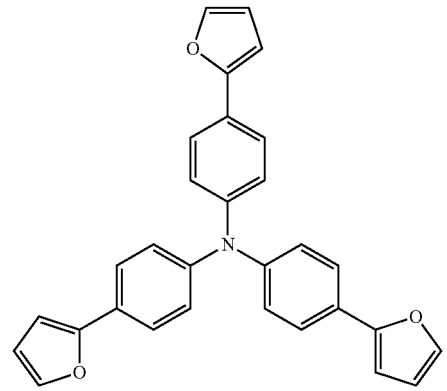

(1-15)
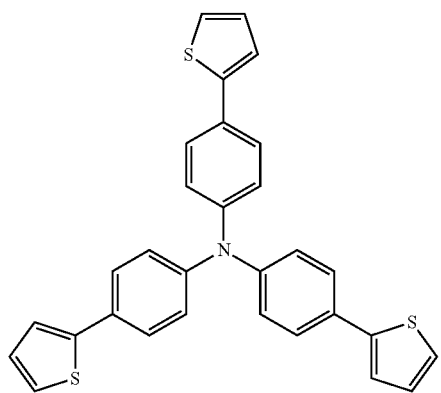
(1-16)
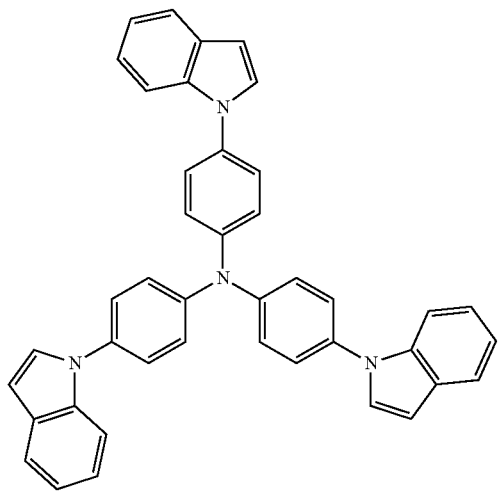
(1-17)
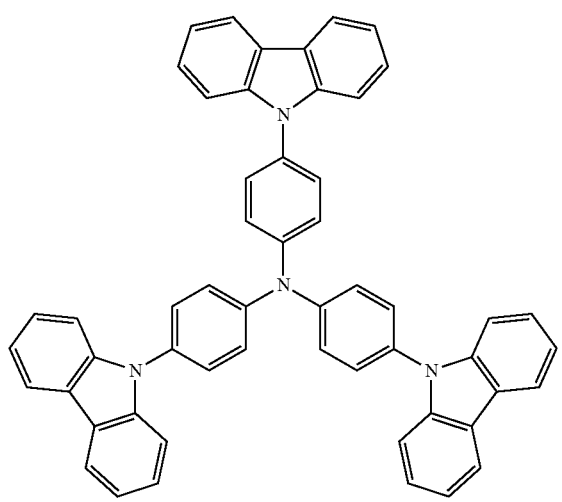
(1-18)
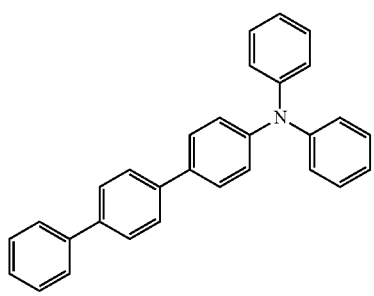
(1-19)
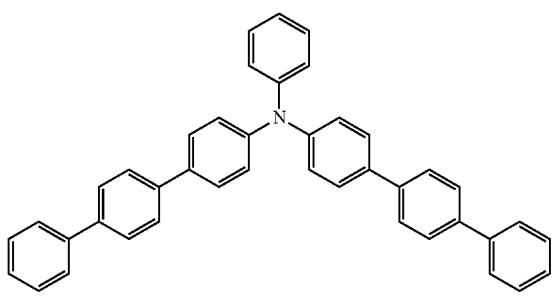

-continued
(1-20)
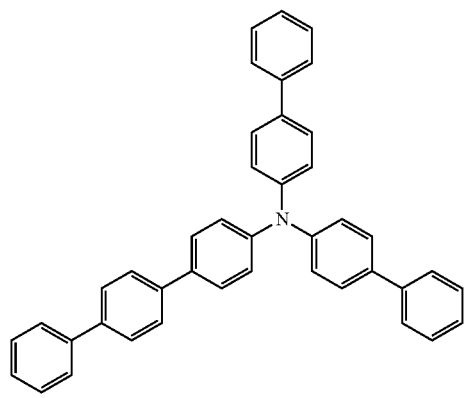
(1-21)
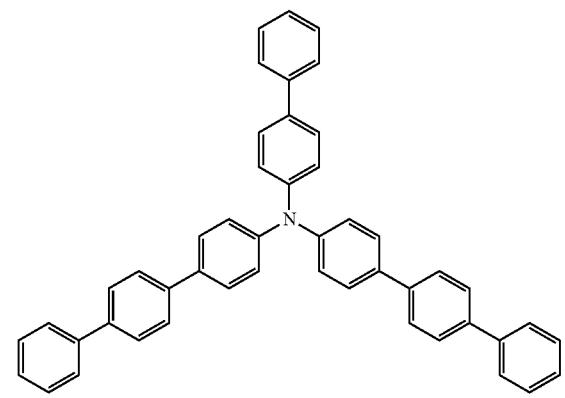
(1-22)
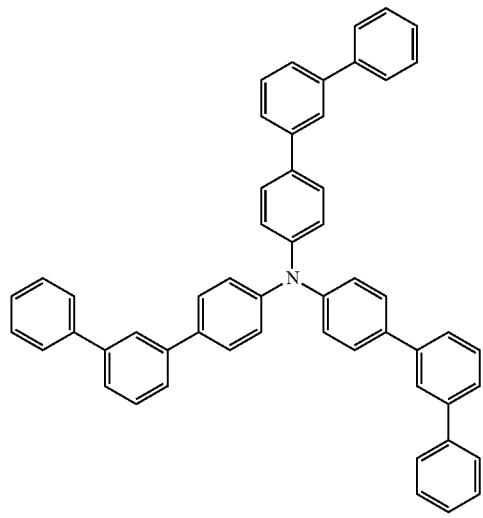
(1-23)
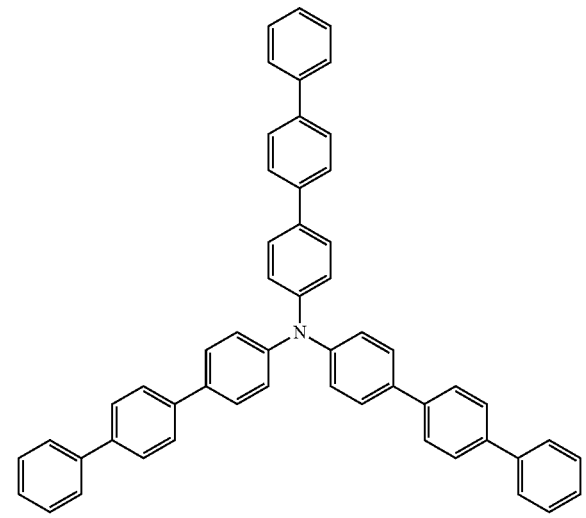
(1-24)
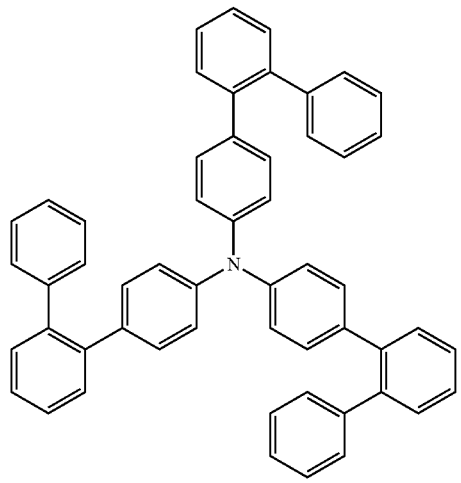
(1-25)
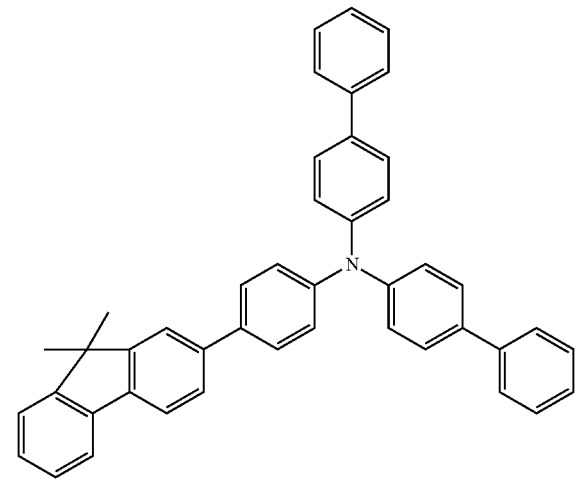

-continued
(1-26)
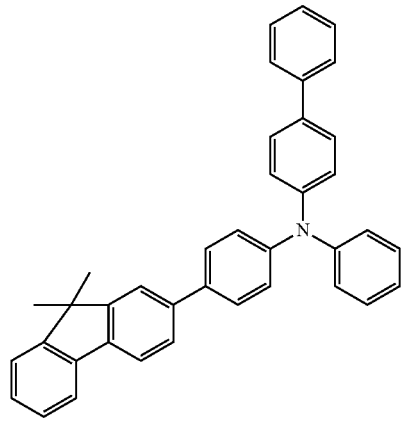
(1-27)
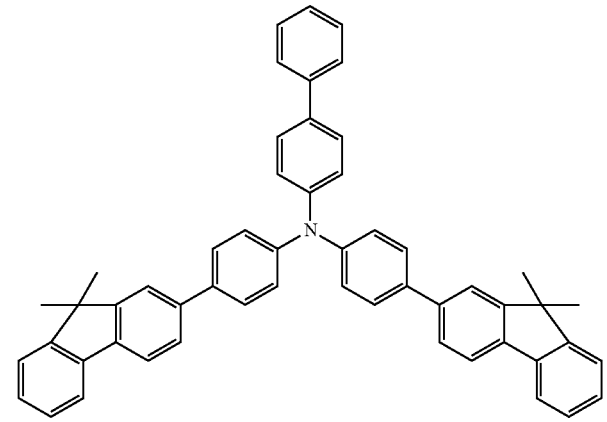
(1-28)
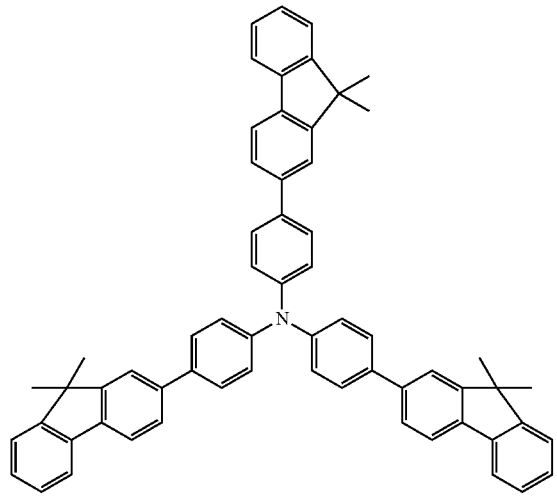
(1-29)
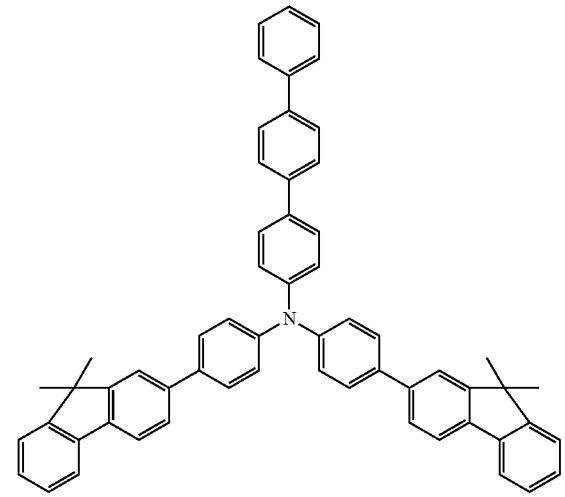
(1-30)
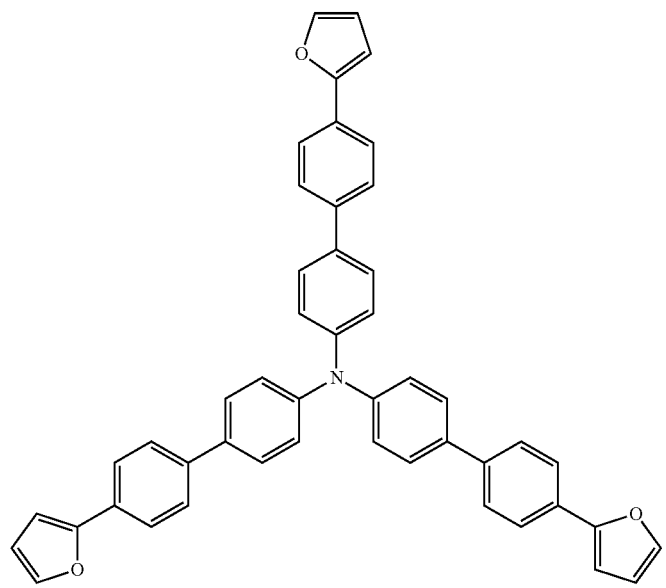

-continued
(1-31)
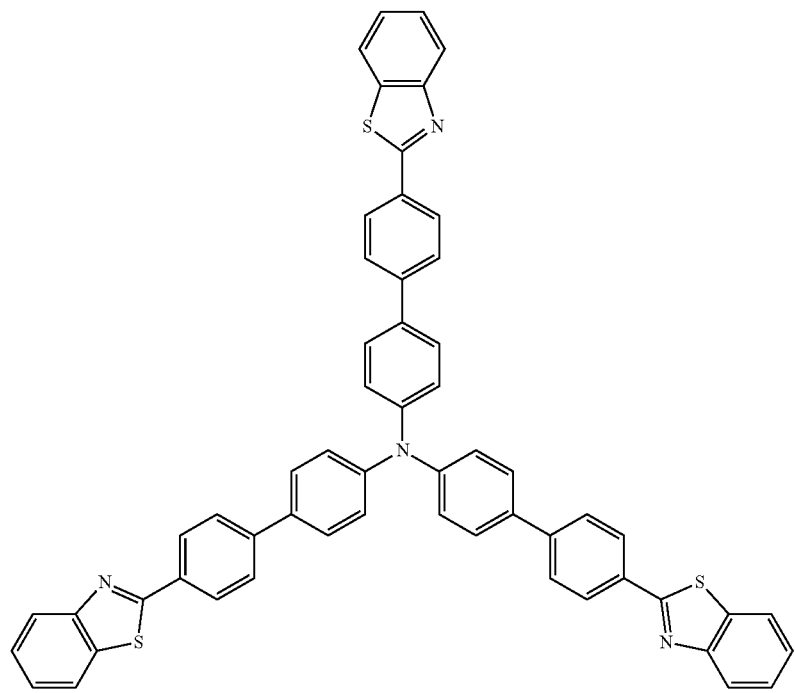
(1-32)
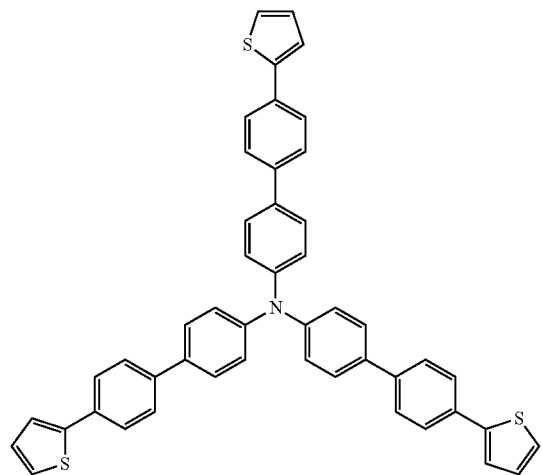
(1-33)
(1-34)
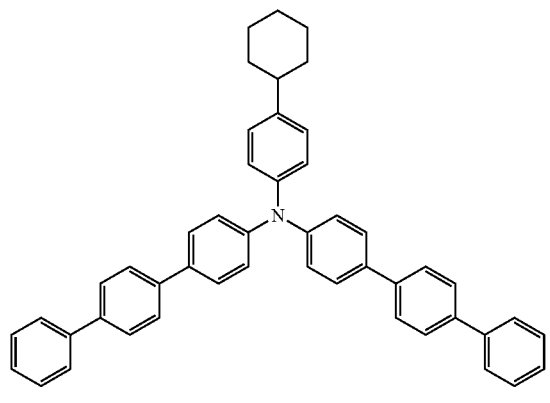
(1-35)
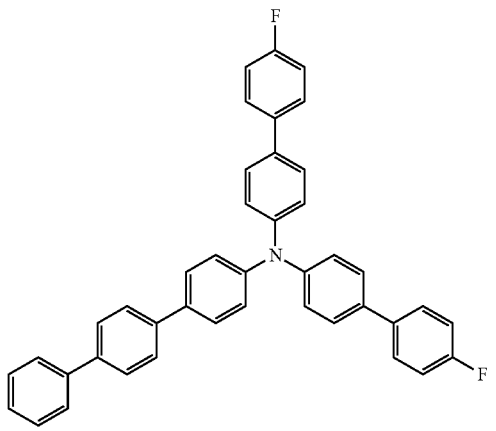

-continued (1-36)

(1-37)

(1-38)

-continued
(1-39)
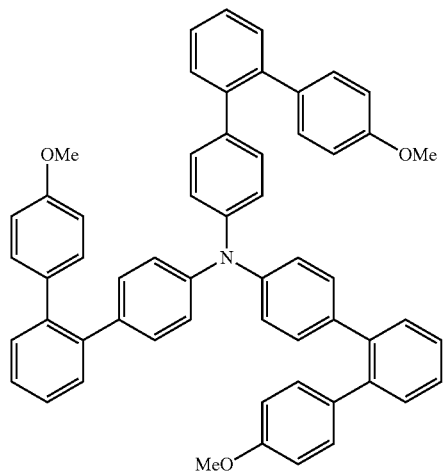
(1-40)
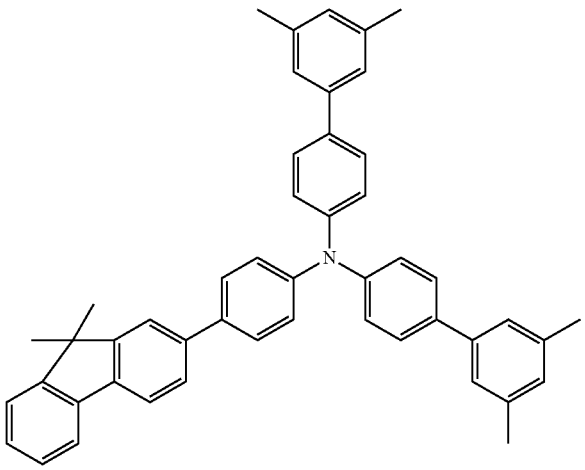
(1-41)
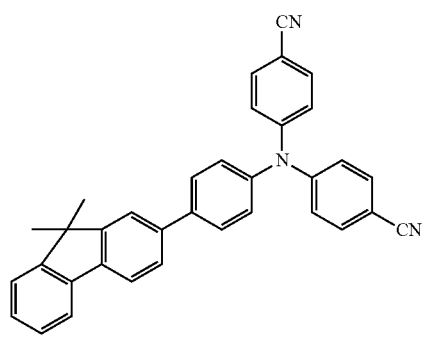
(1-42)
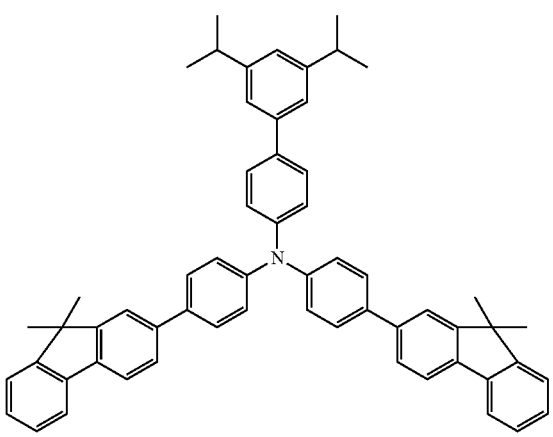
(1-43)
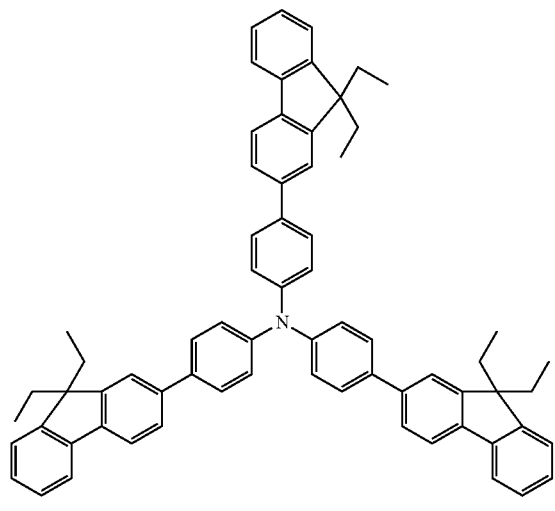
(1-44)
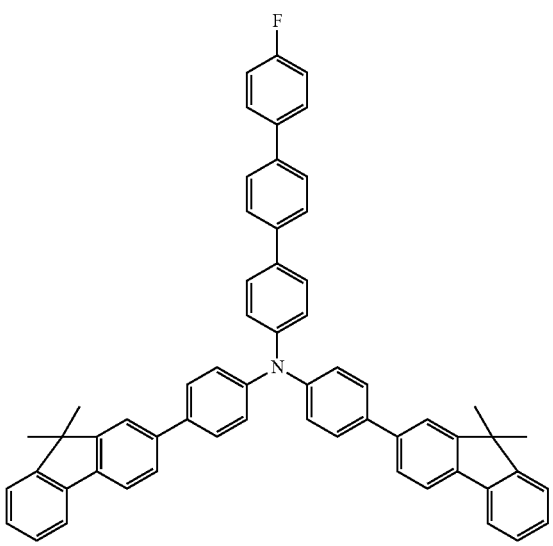

(1-45)
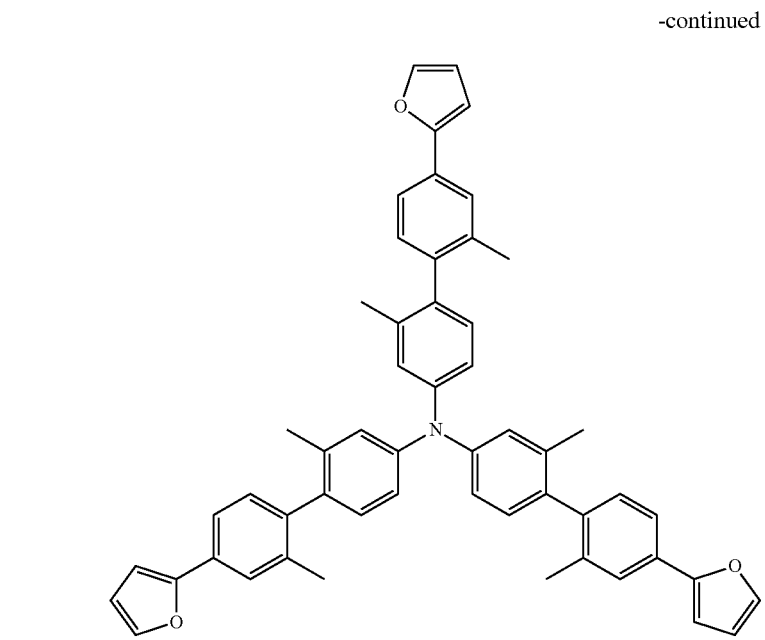
(1-46)
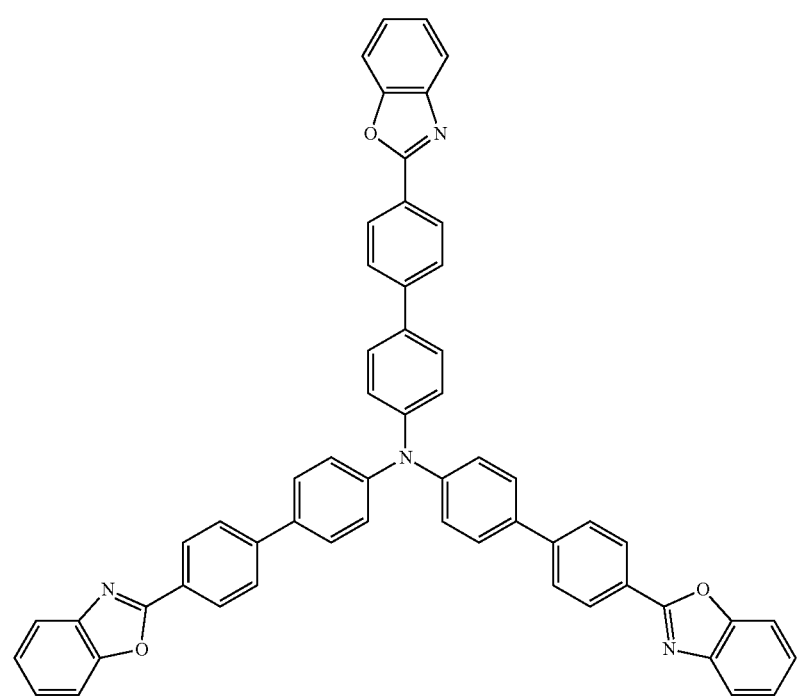

(1-47)
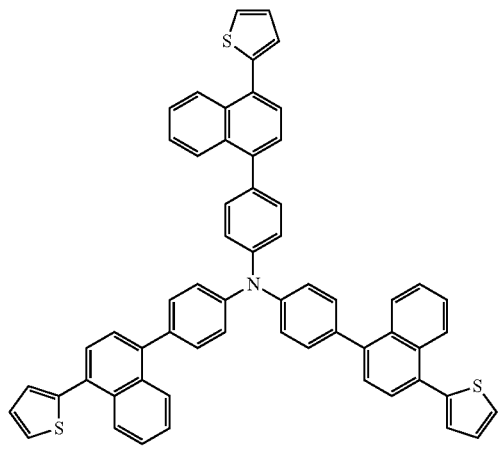
(1-48)
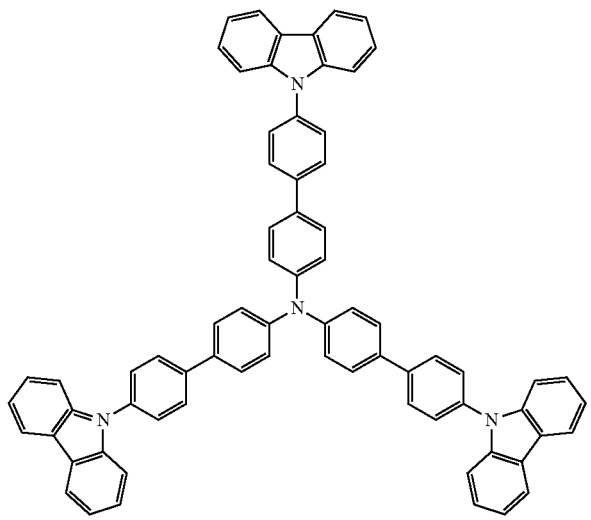
Specific examples of the compound indicated in Formula 2 include compounds expressed in following Formulas (2-1) to (2-69). Here, although compounds containing, for example, a carbazole group or an indole group are given as the nitrogen-containing hydrocarbon group bonding to L1, this is not limited thereto. For example, an imidazole group may be used.
Formula (2-1) to Formula (2-69)
(2-1)
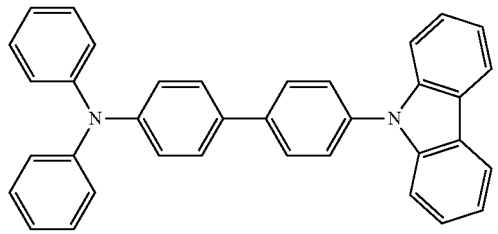
(2-2)
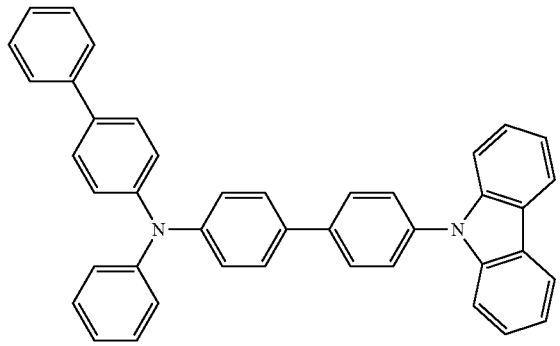
(2-3)
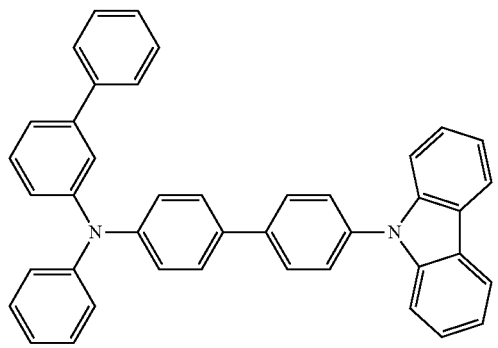
(2-4)
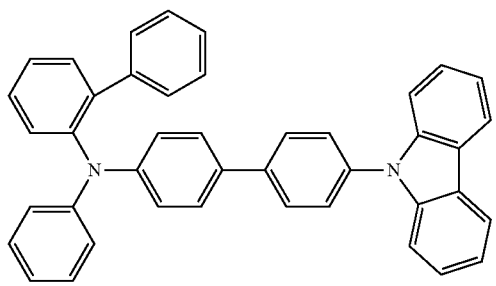

(2-5)
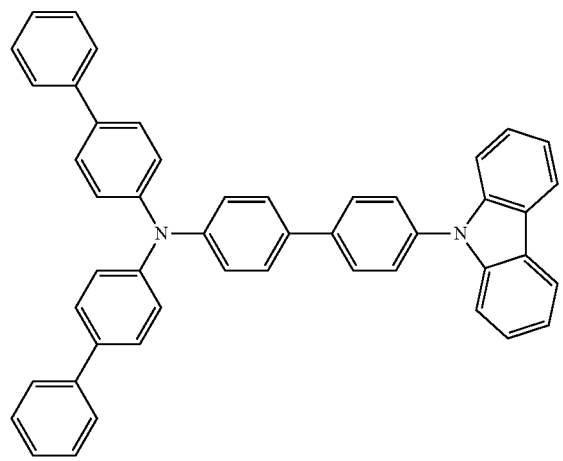
(2-6)
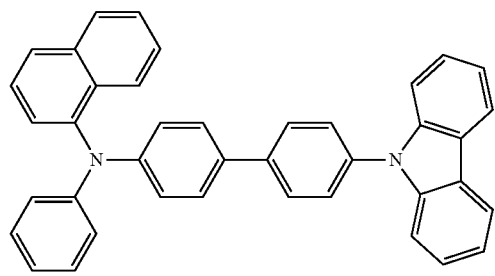
(2-7)
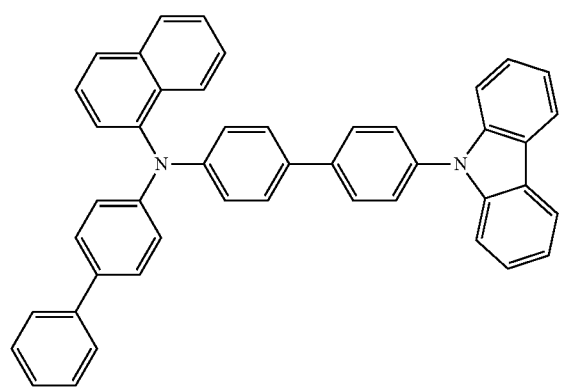
(2-8)
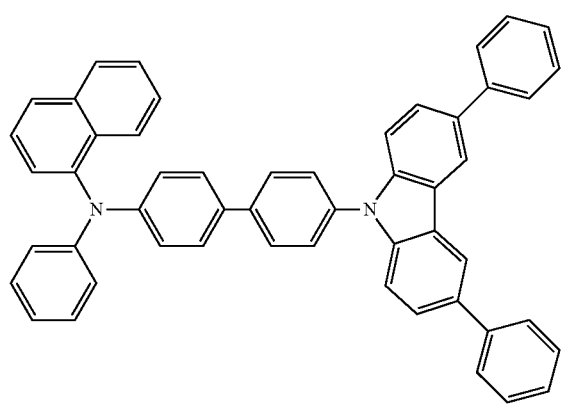
(2-9)
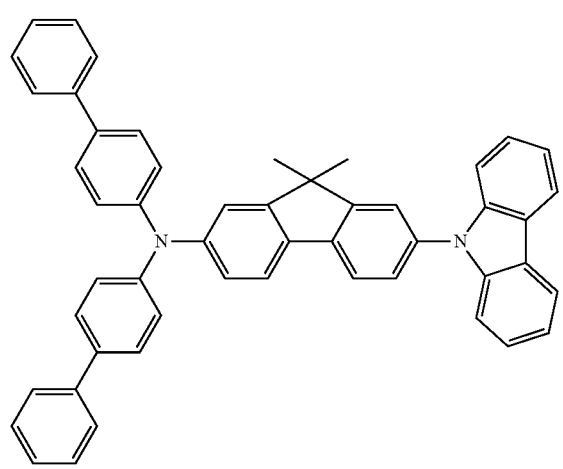
(2-10)
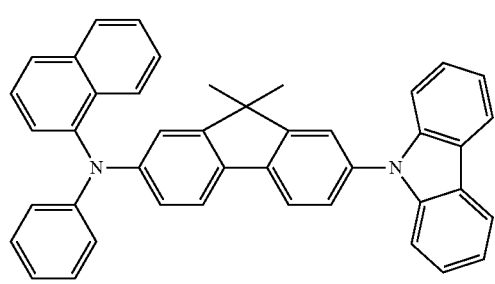

-continued
(2-11)
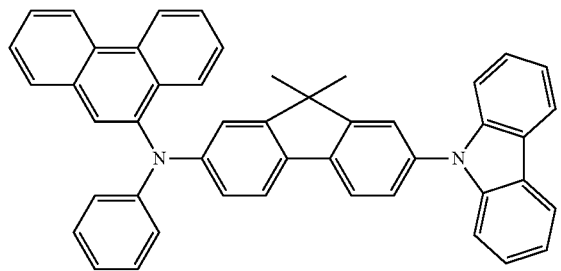
(2-12)
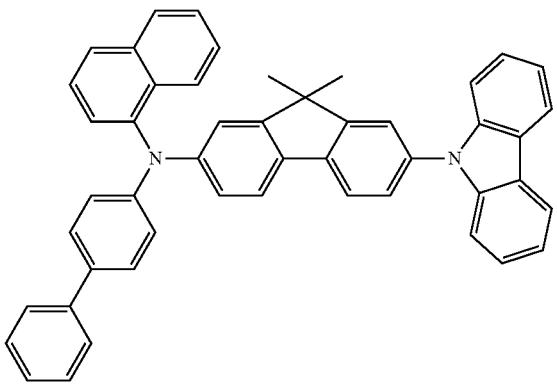
(2-13)
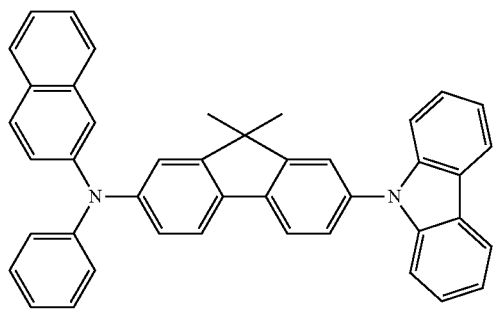
(2-14)
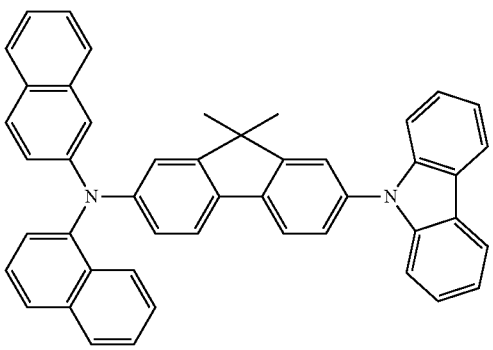
(2-15)
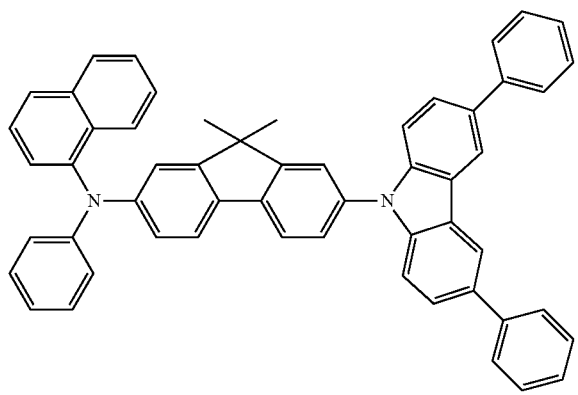
(2-16)
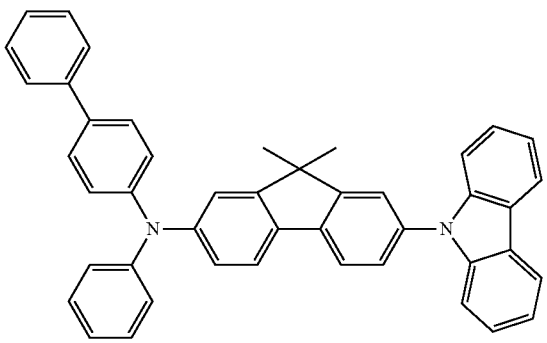
(2-17)
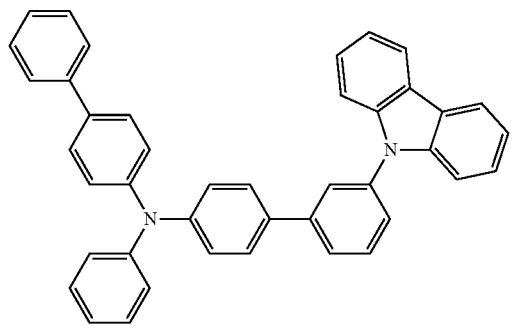
(2-18)
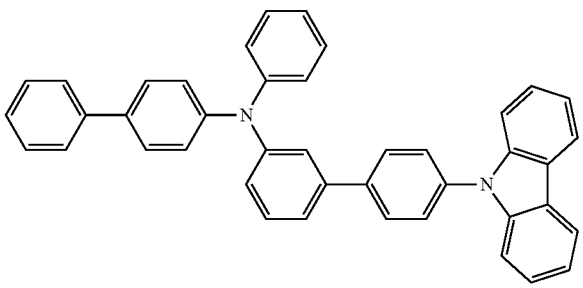

-continued
(2-19)
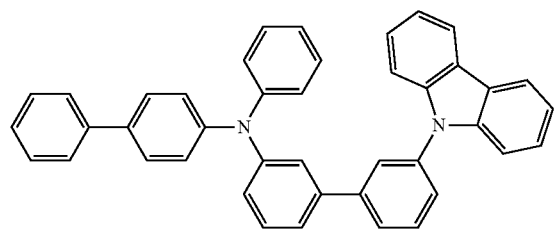
(2-20)
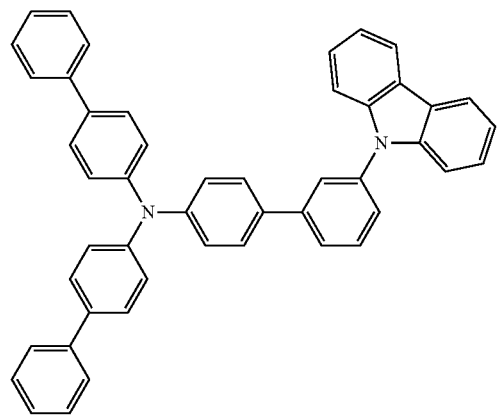
(2-21)
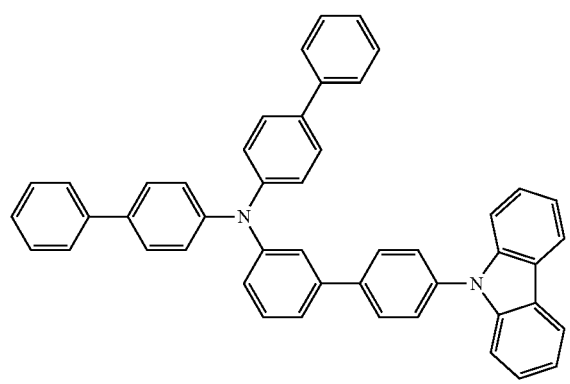
(2-22)
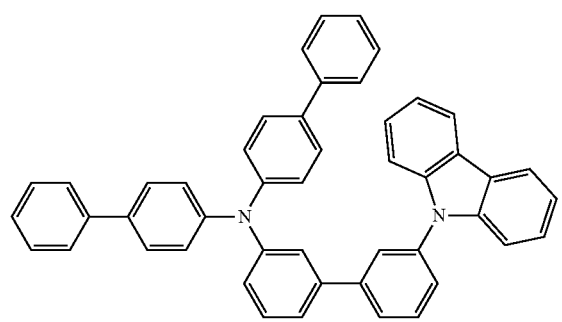
(2-23)
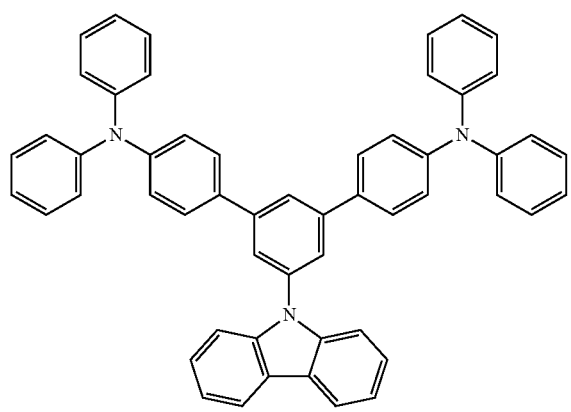
(2-24)
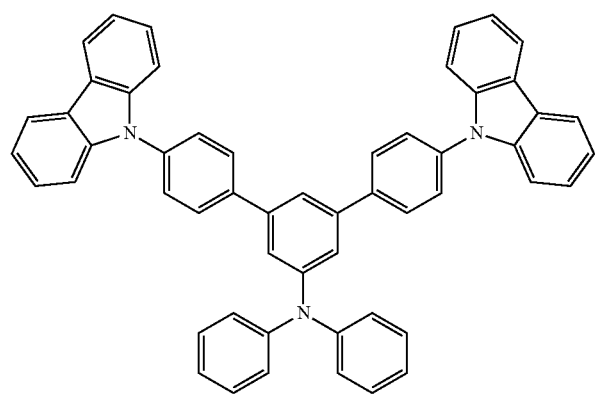

(2-25)
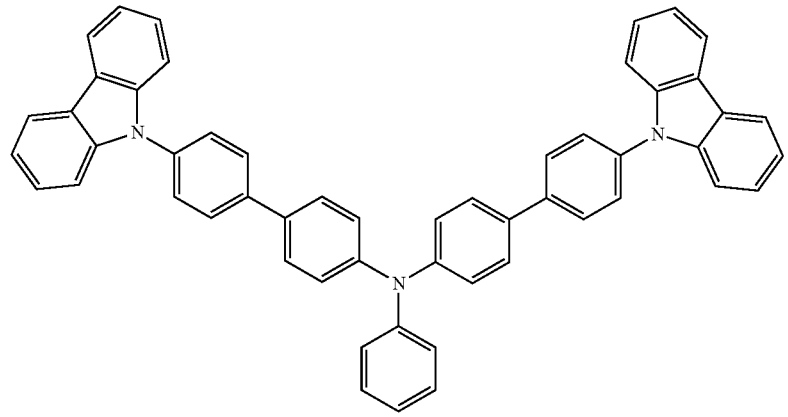
(2-26)
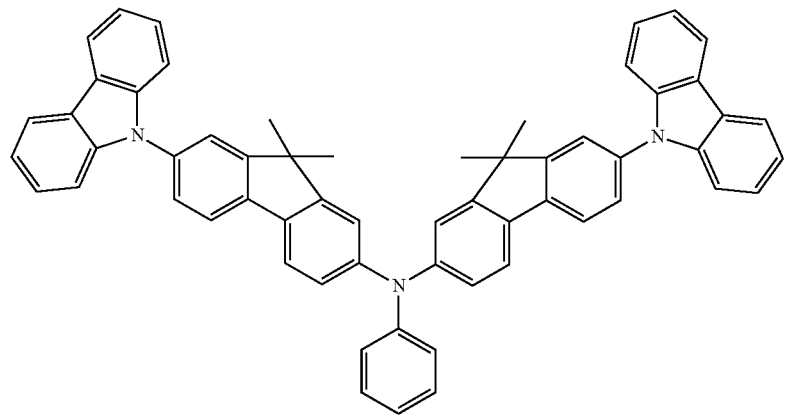
(2-27) (2-28)
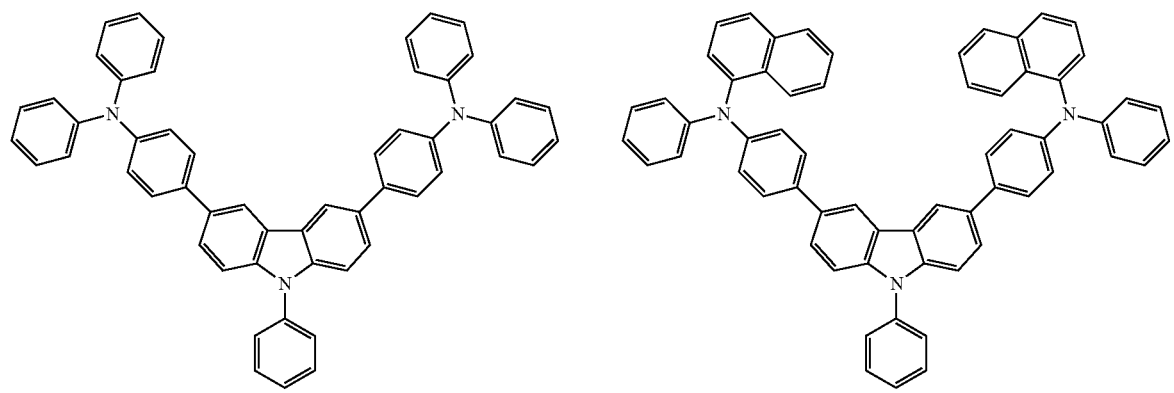
(2-29) (2-30)
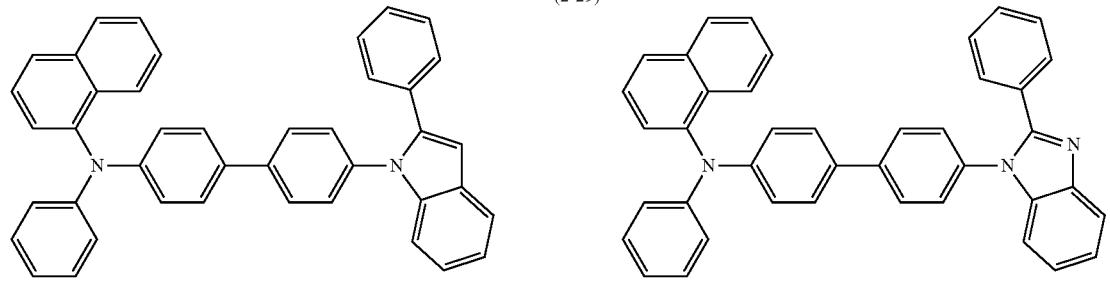

-continued
(2-31)
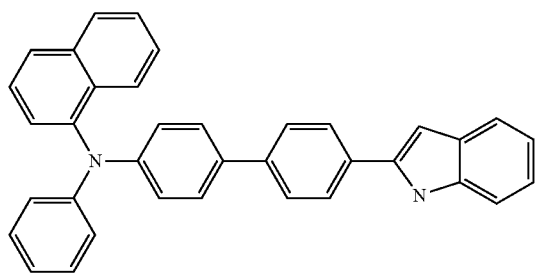
(2-32)
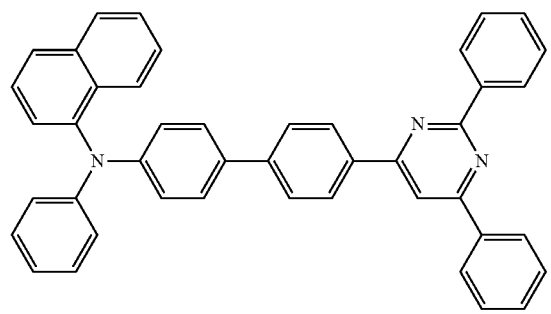
(2-33)
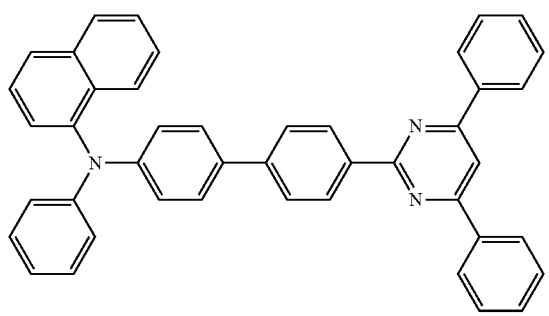
(2-34)
(2-35)
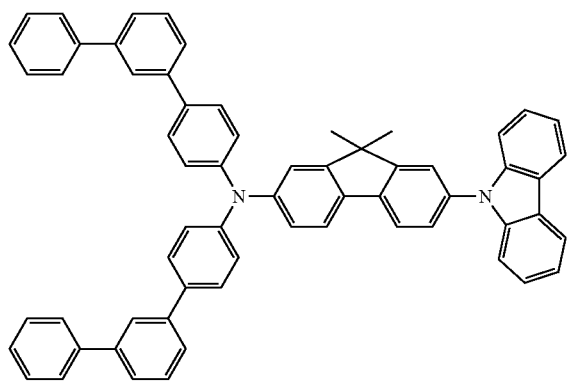
(2-36)
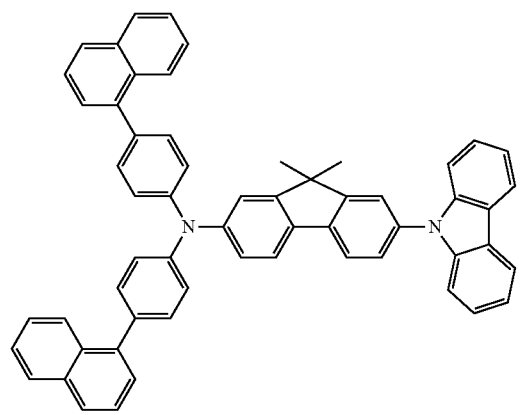
(2-37)
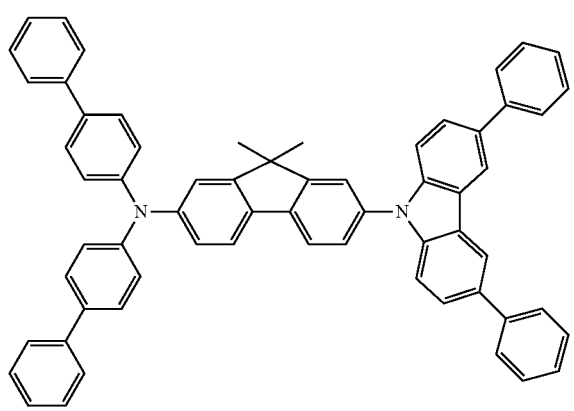
(2-38)
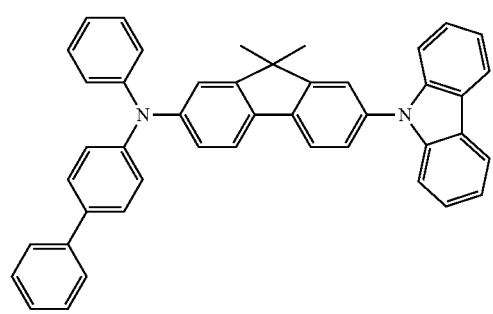

-continued
(2-39)
(2-40)
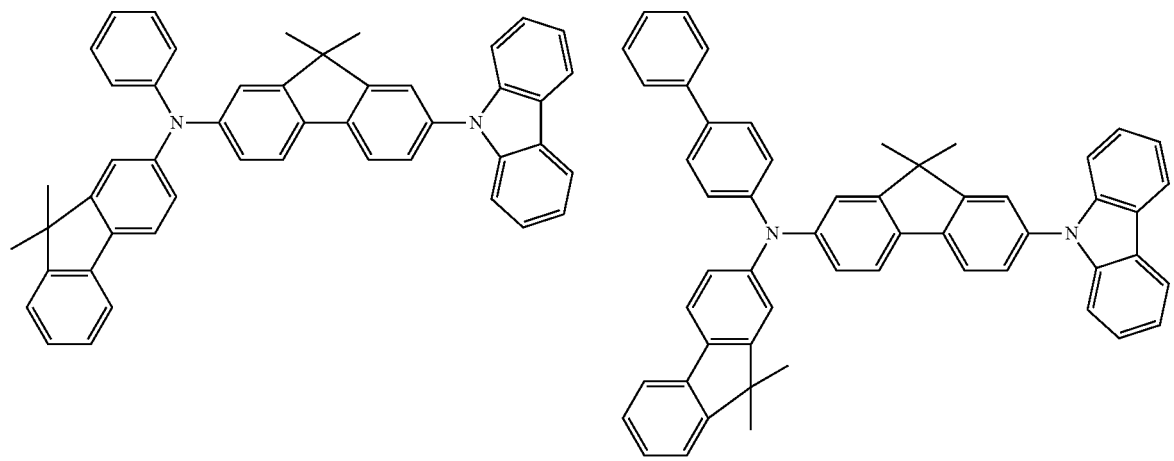
(2-41)
(2-42)
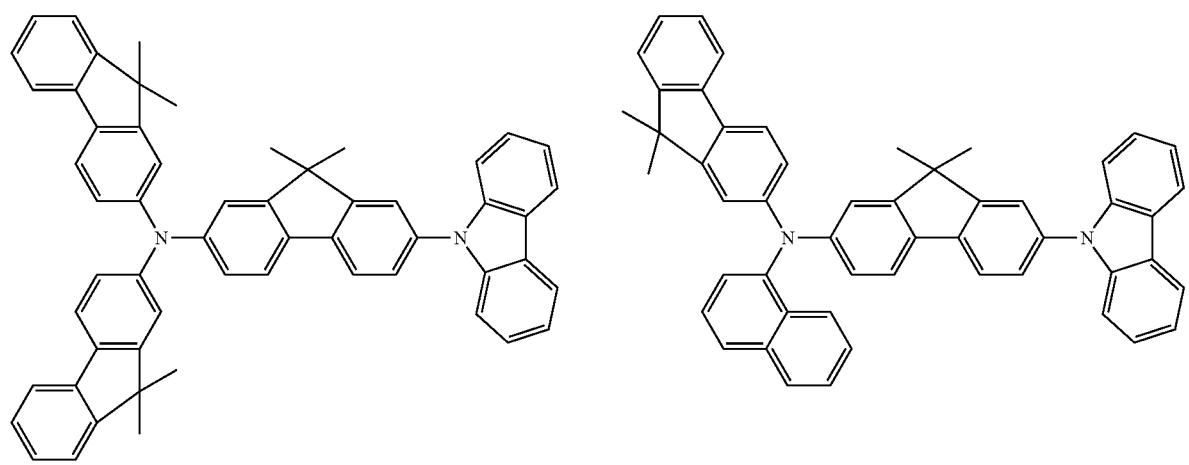
(2-43)
(2-44)
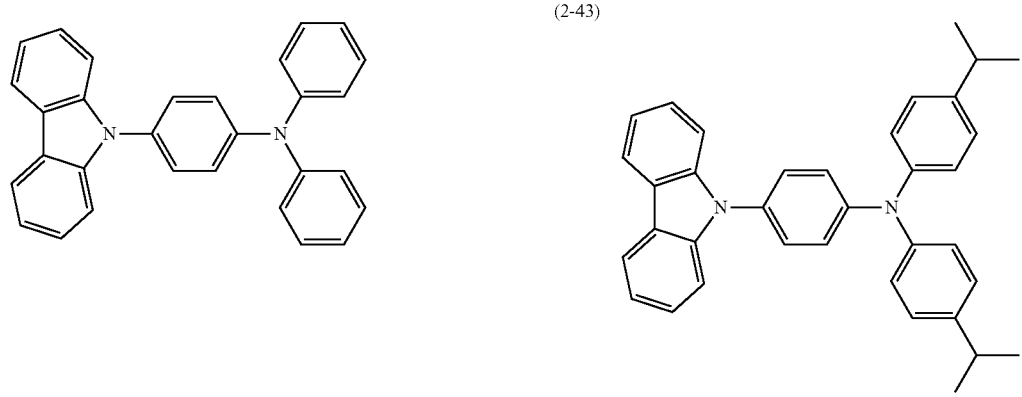

-continued
(2-45)
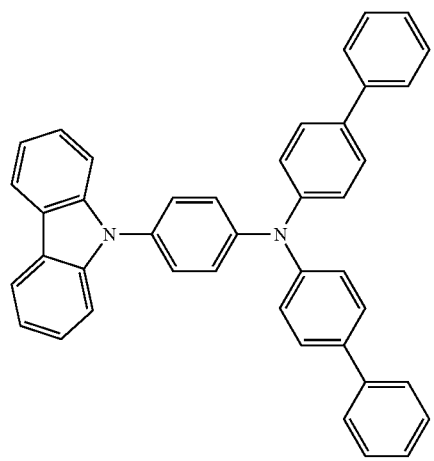
(2-46)
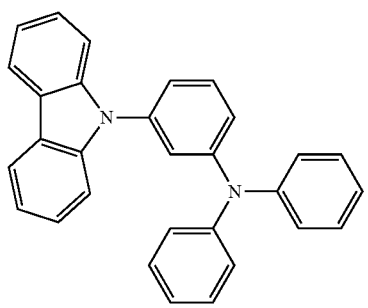
(2-47)
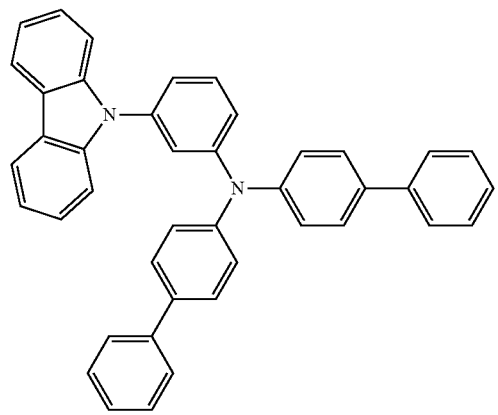
(2-48)
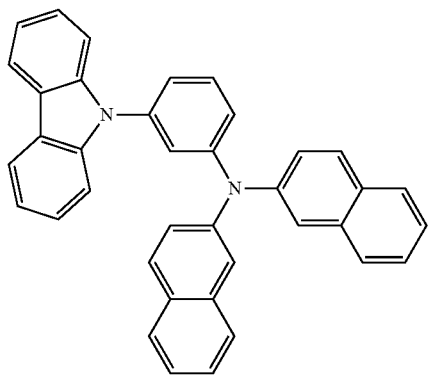
(2-49)
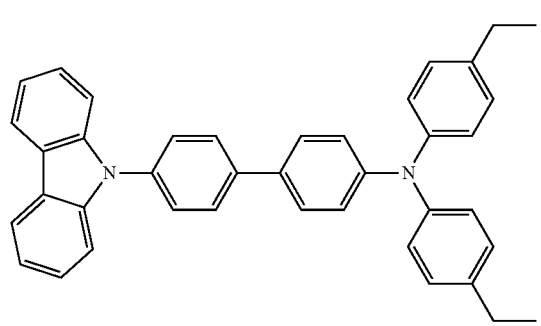
(2-50)
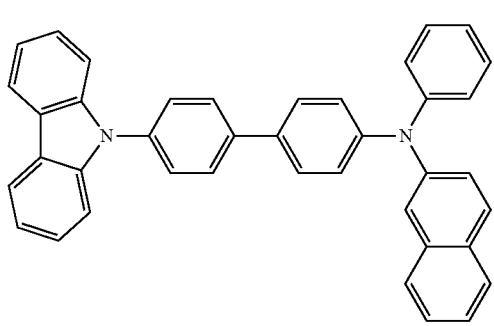
(2-51)
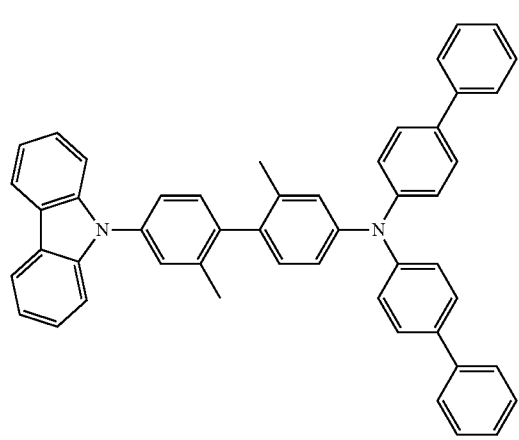
(2-52)
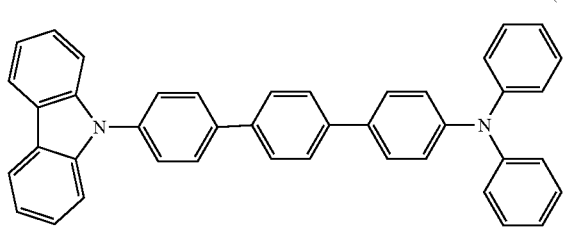

-continued
(2-53) 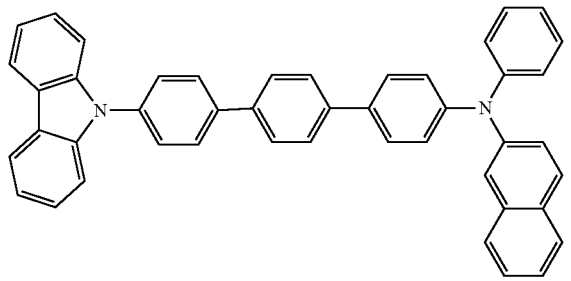
(2-54) 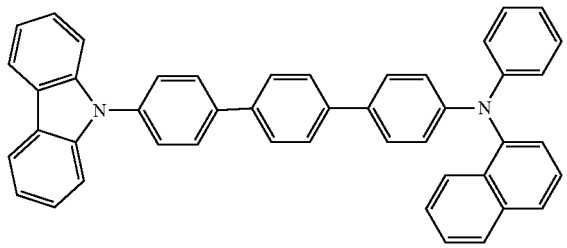
(2-55) 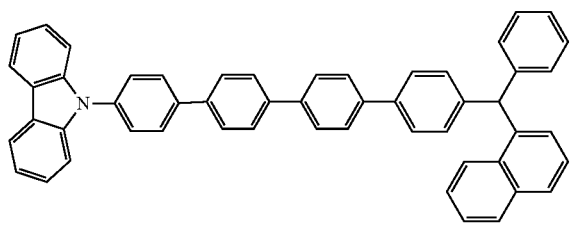
(2-56) 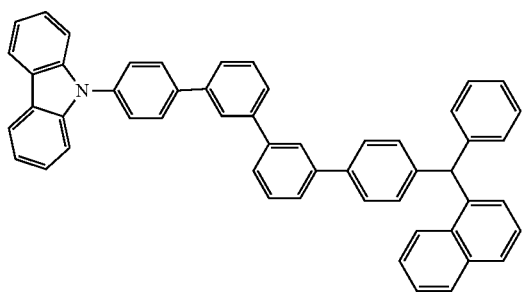
(2-57) 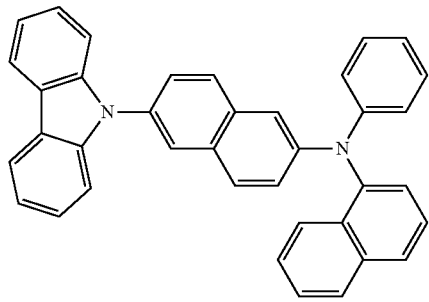
(2-58) 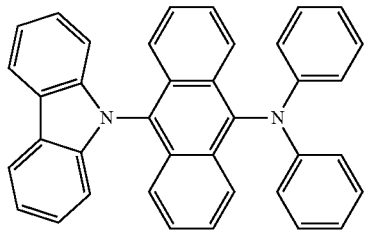
(2-59) 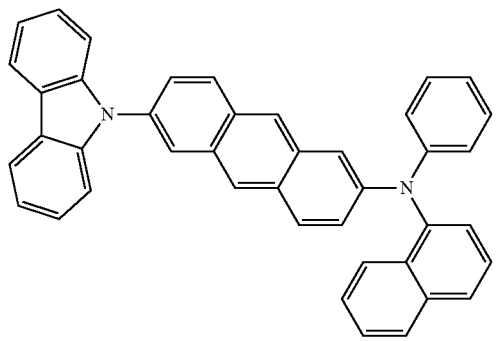
(2-60) 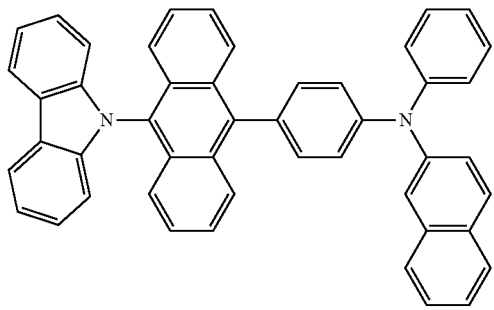
(2-61) 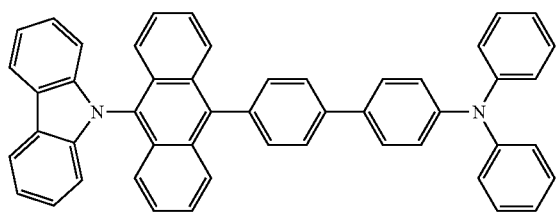
(2-62) 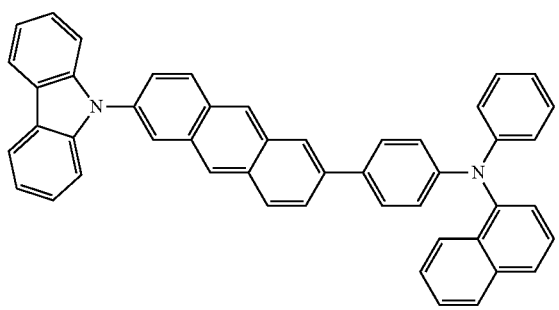

-continued
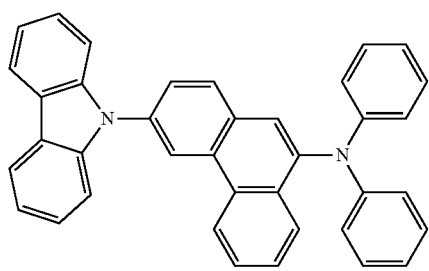 (2-63)
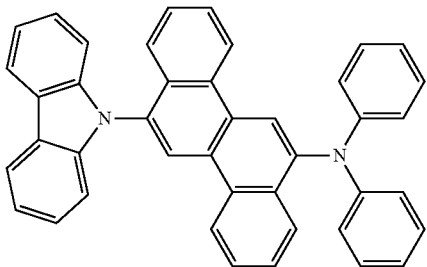 (2-64)
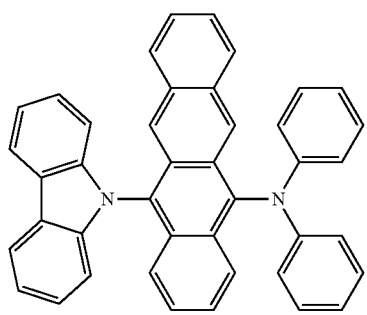 (2-65)
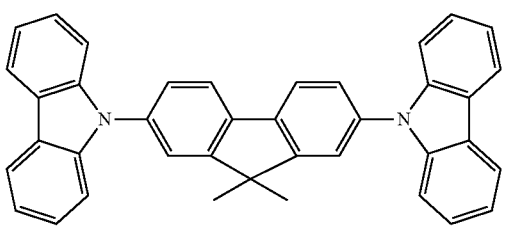 (2-66)
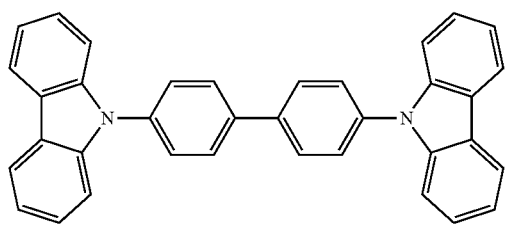 (2-67)
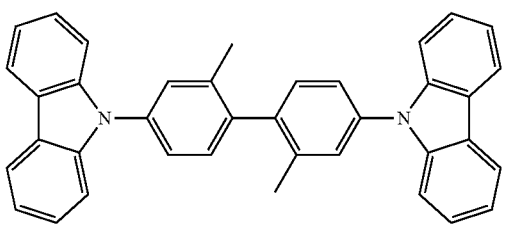 (2-68)
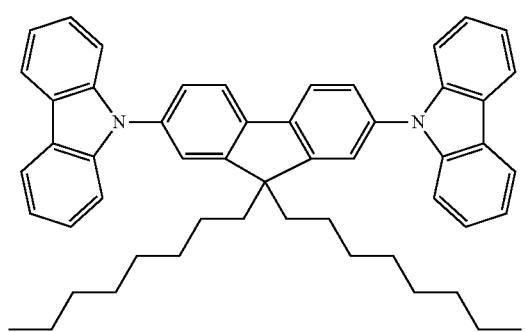 (2-69)

Specific examples of the compound indicated in Formula 3 include compounds expressed in following Formulas (3-1) to (3-45).
Formula (3-1) to Formula (3-45)
(3-1)
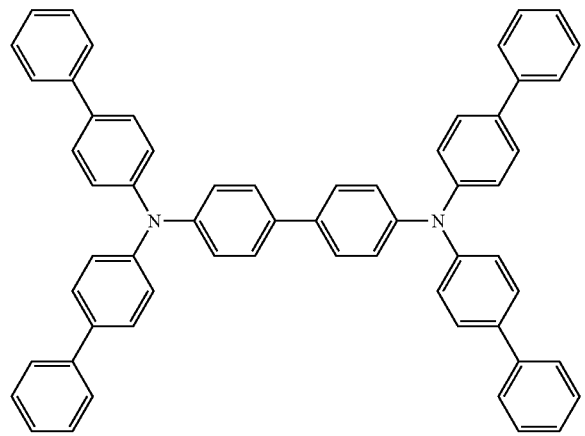
(3-2)
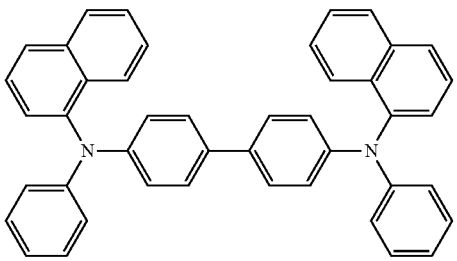
(3-3)
(3-4)
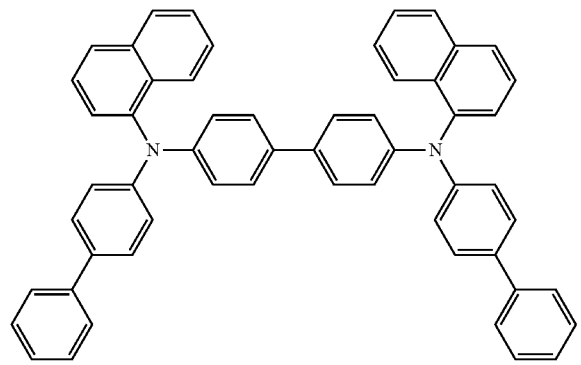
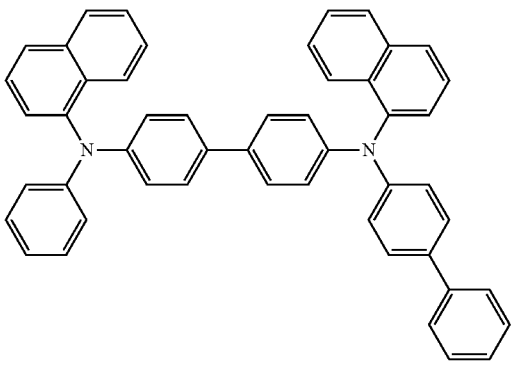
(3-5)
(3-6)
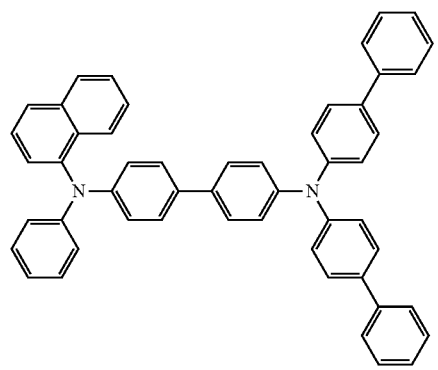
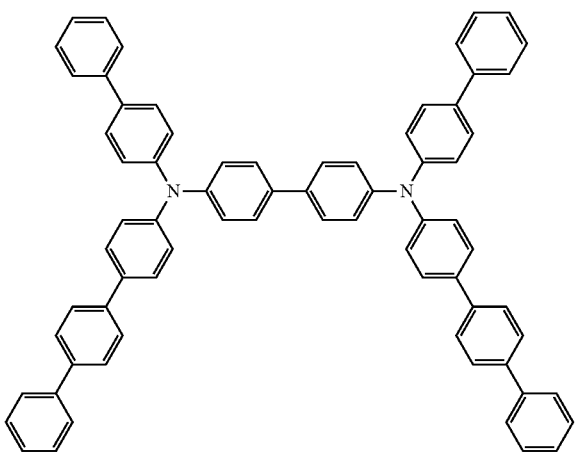

-continued
(3-7)
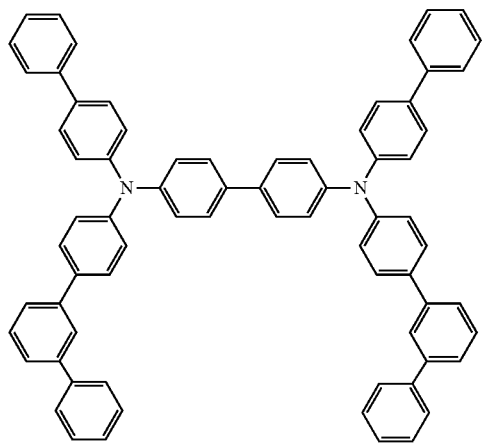
(3-8)
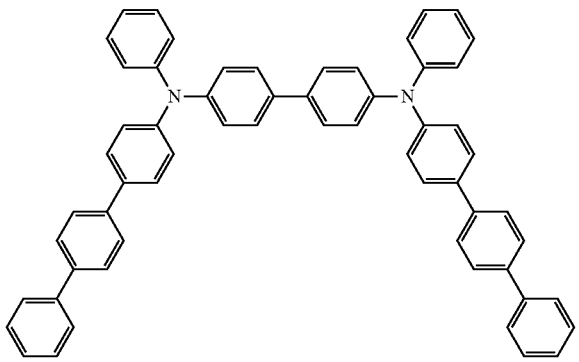
(3-9)
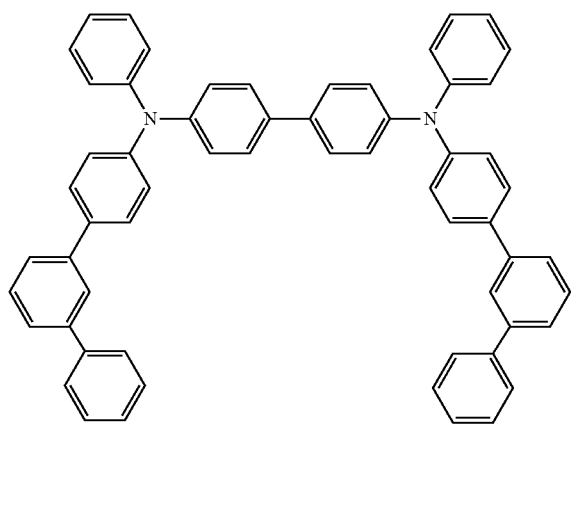
(3-10)
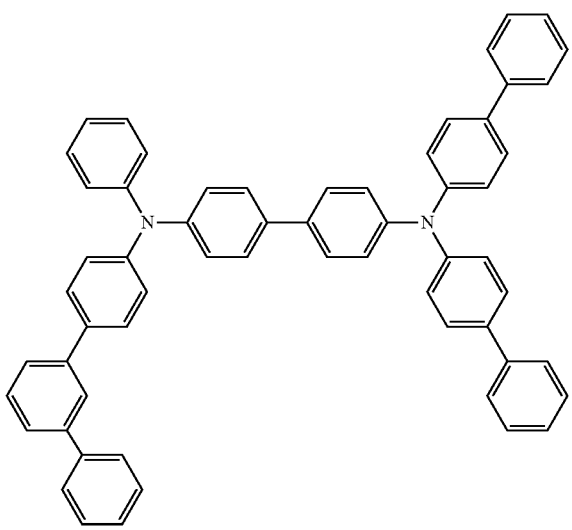
(3-11)
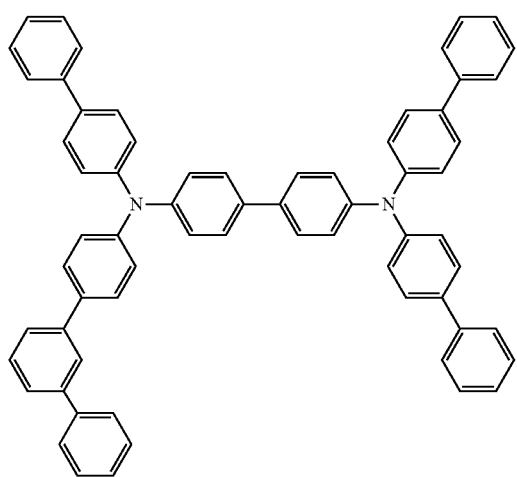
(3-12)
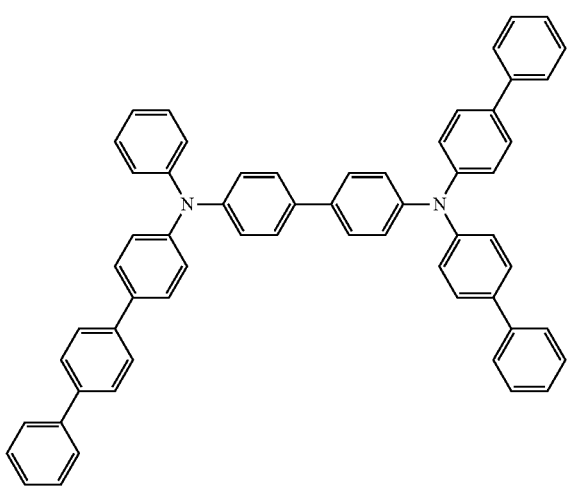

-continued
(3-13) (3-14)
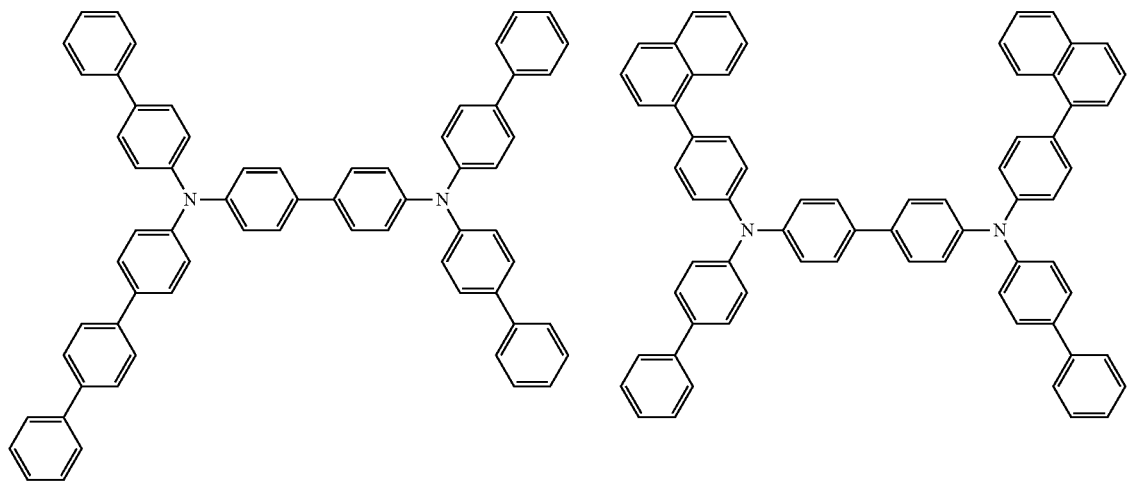
(3-15) (3-16)
(3-17) (3-18)
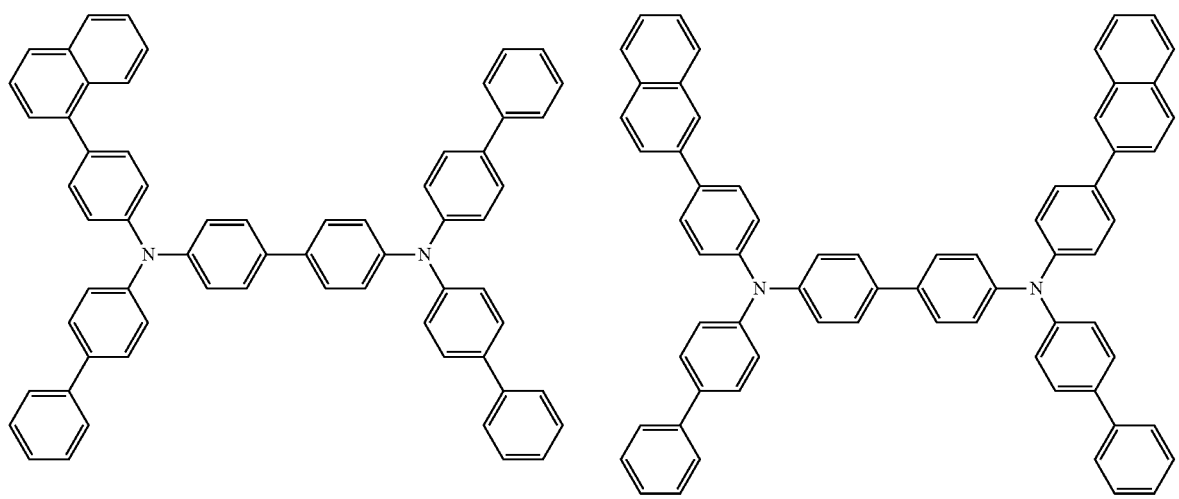
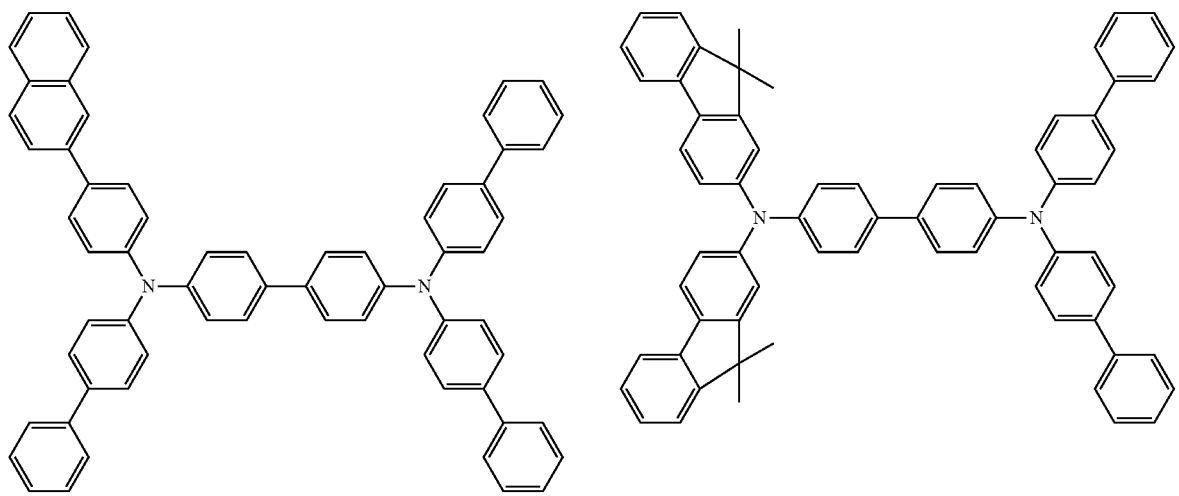

-continued
(3-19)
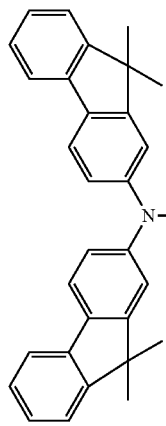
(3-20)
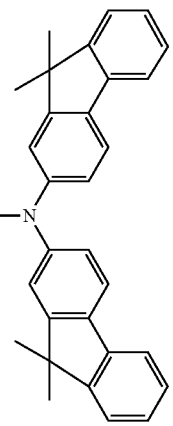
(3-21)
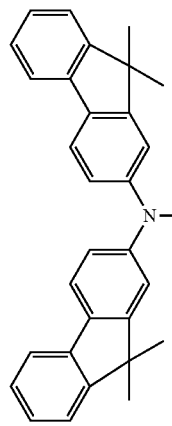
(3-22)
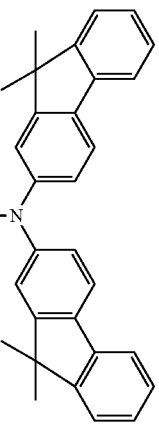
(3-23)
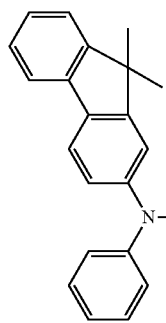
(3-24)
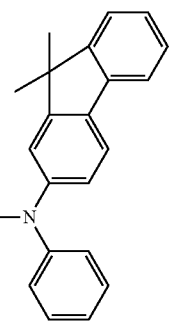
(3-25)
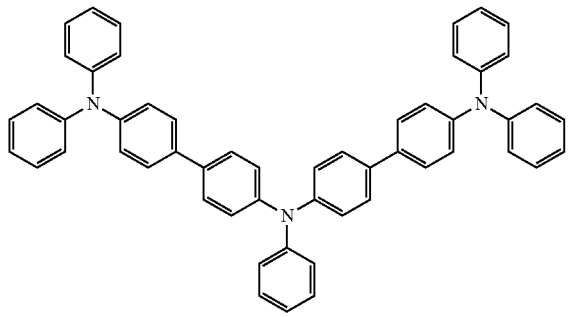
(3-26)
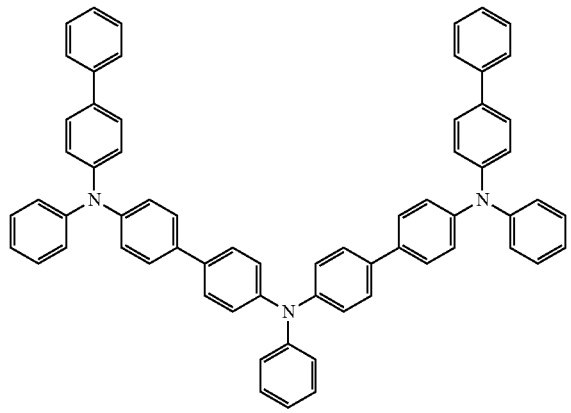
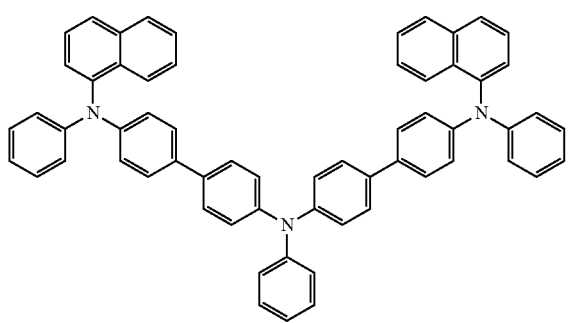
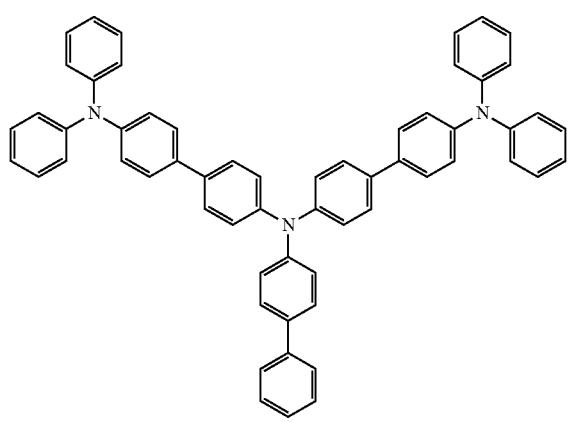

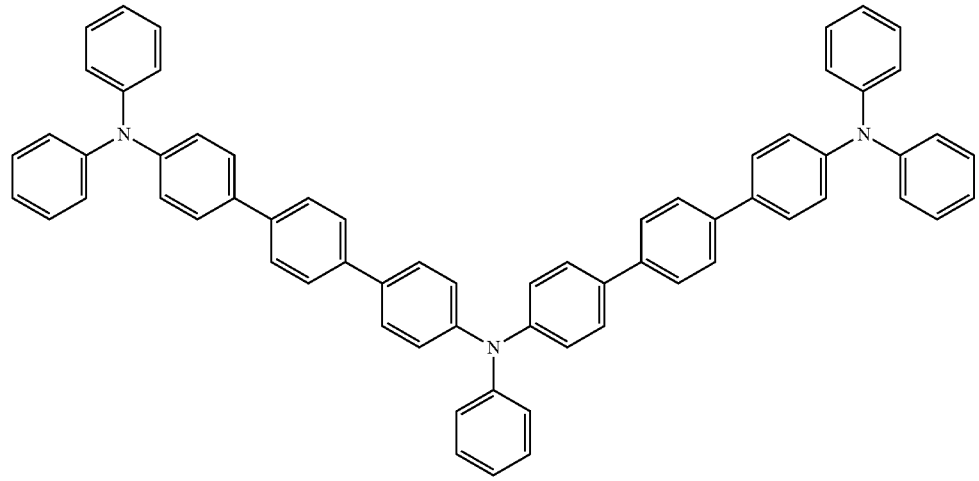
(3-27)
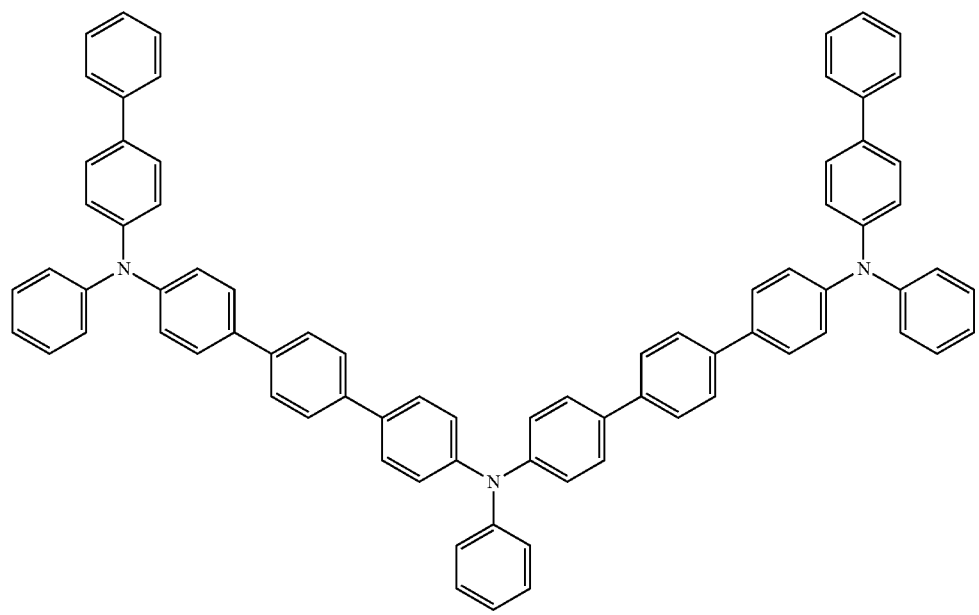
(3-28)

-continued
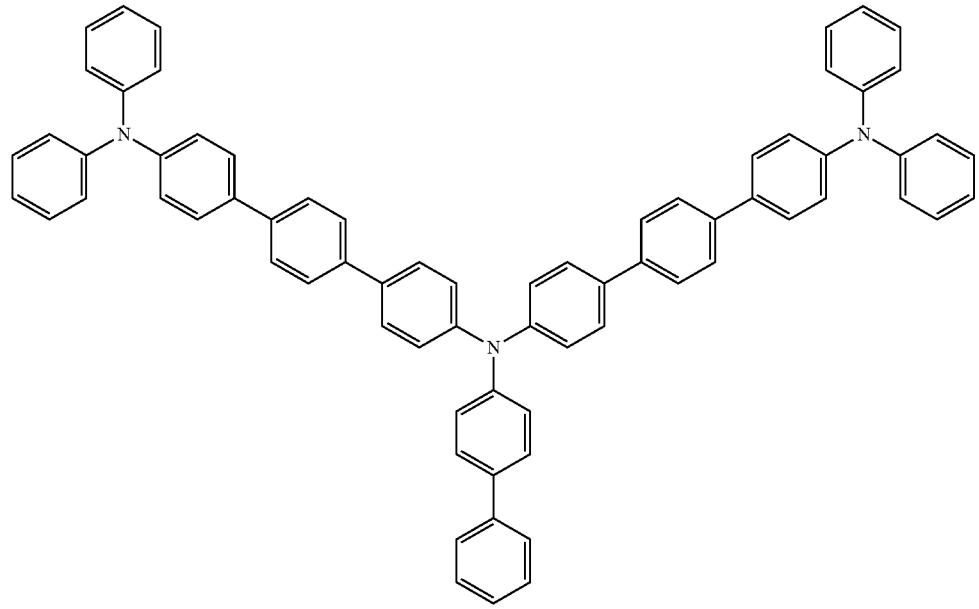
(3-29)
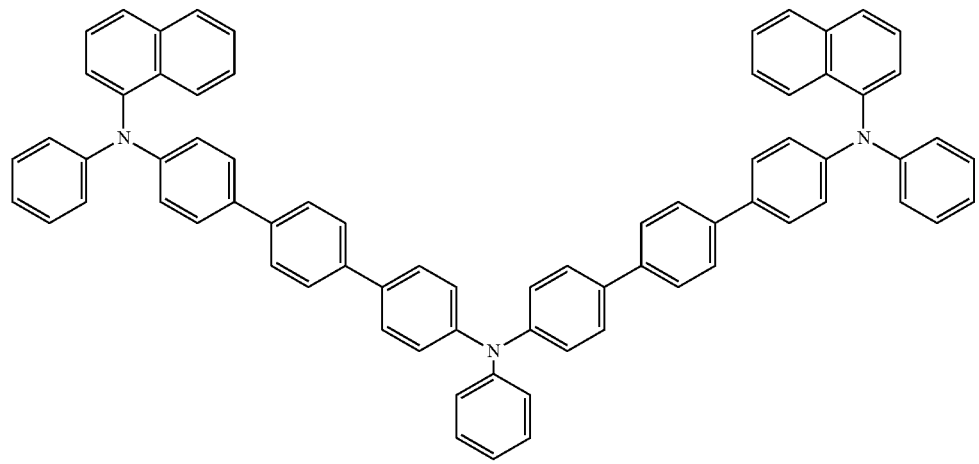
(3-30)
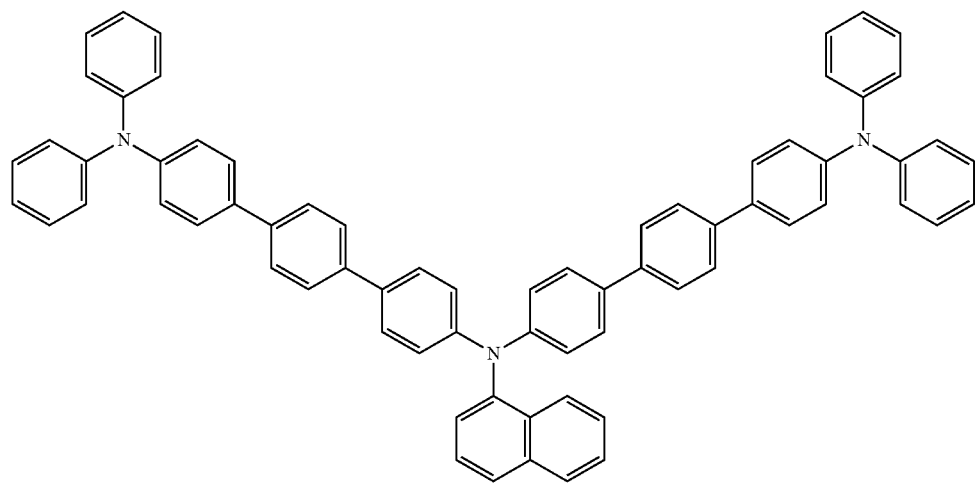
(3-31)

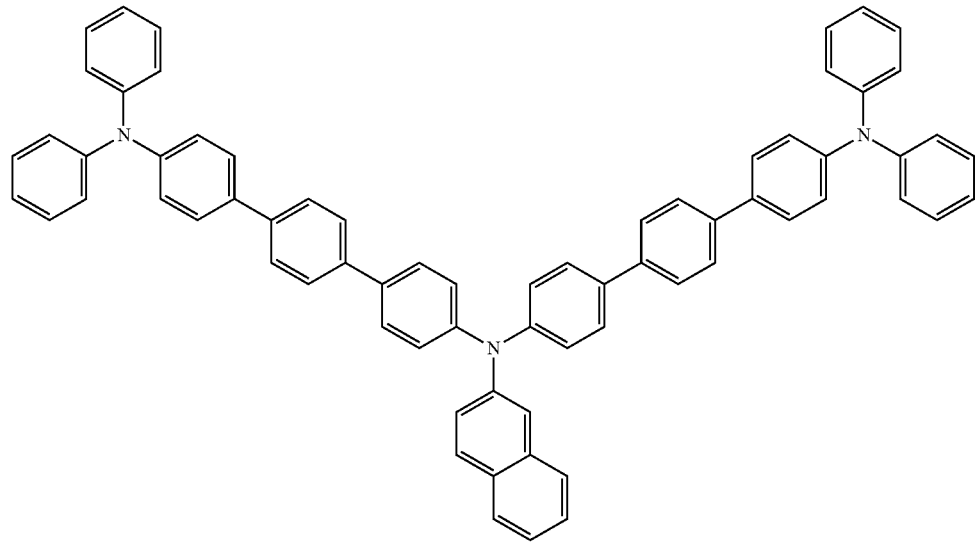
(3-32)
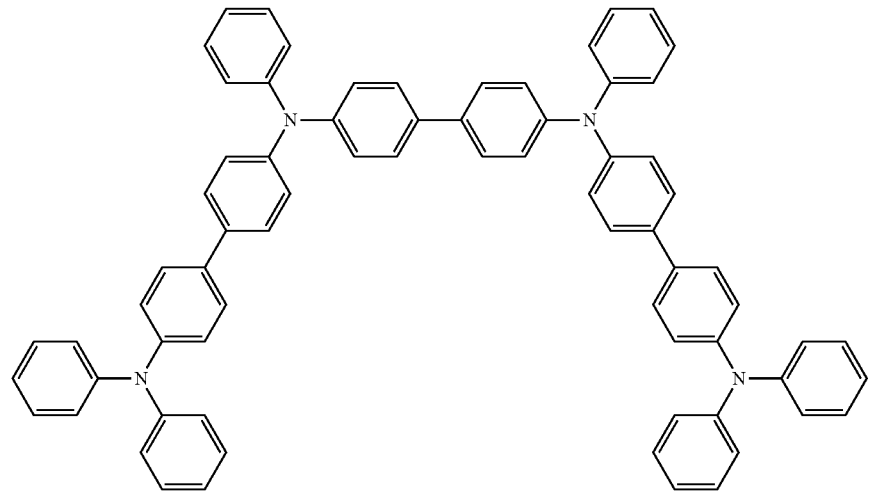
(3-33)
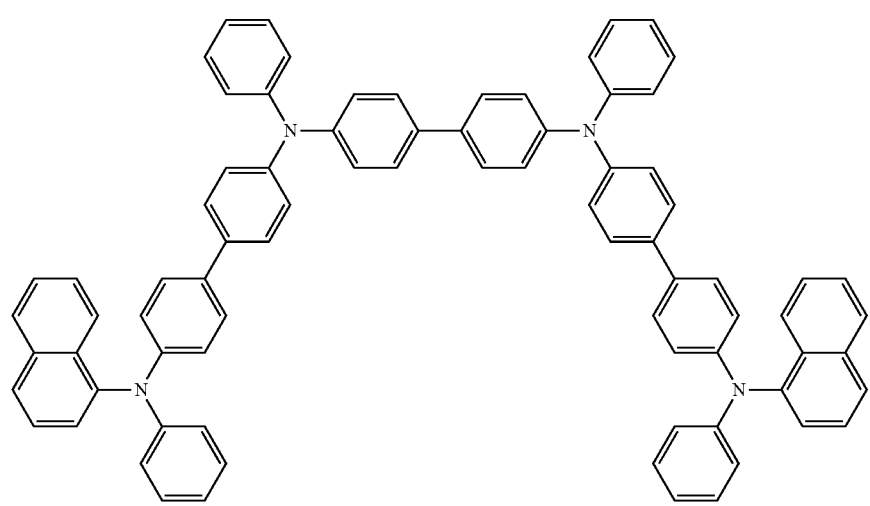
(3-34)

(3-35)
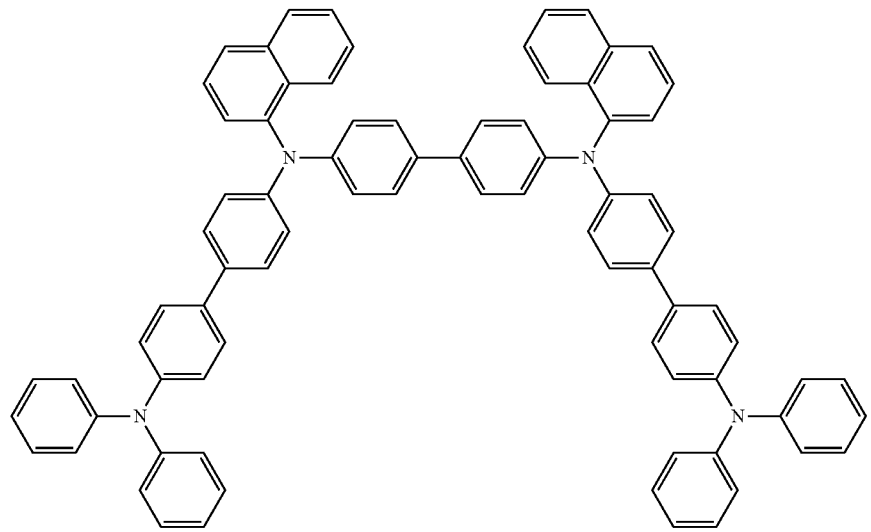
(3-36)
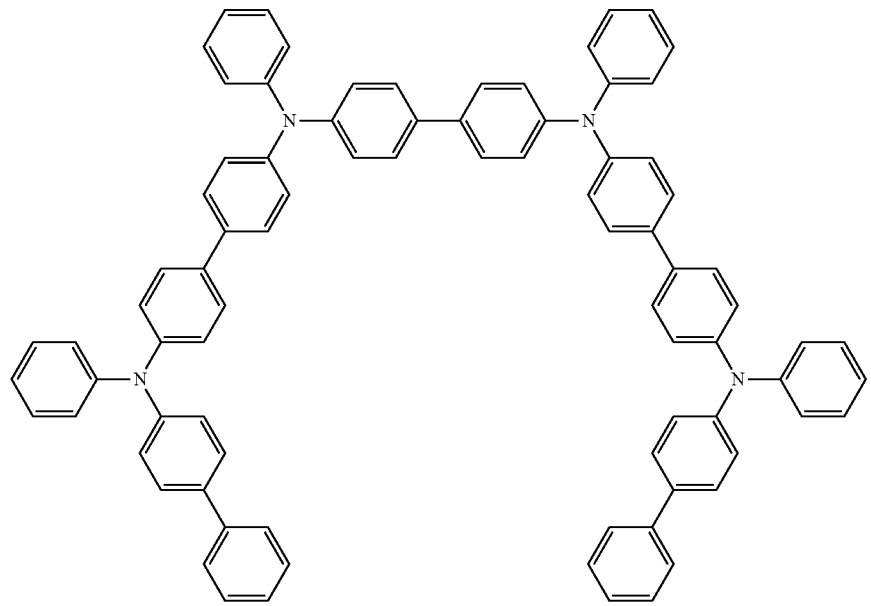
(3-37)
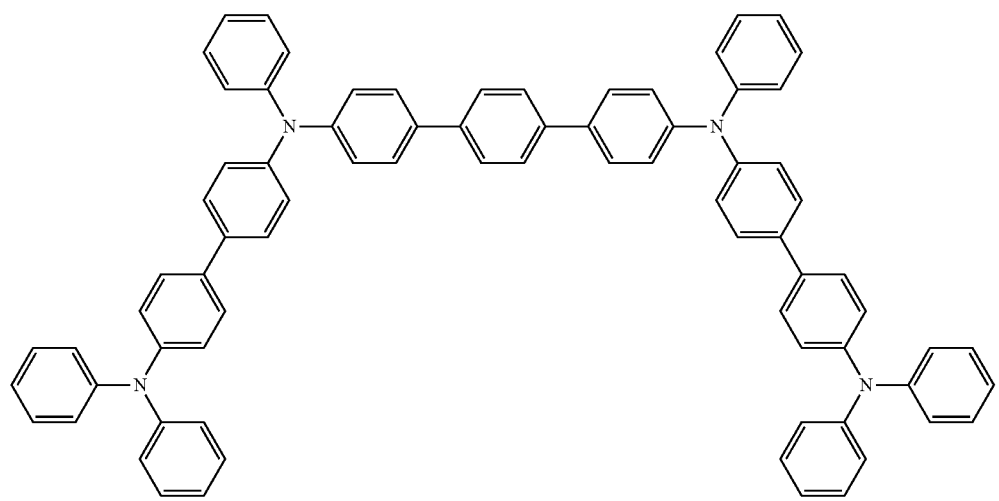

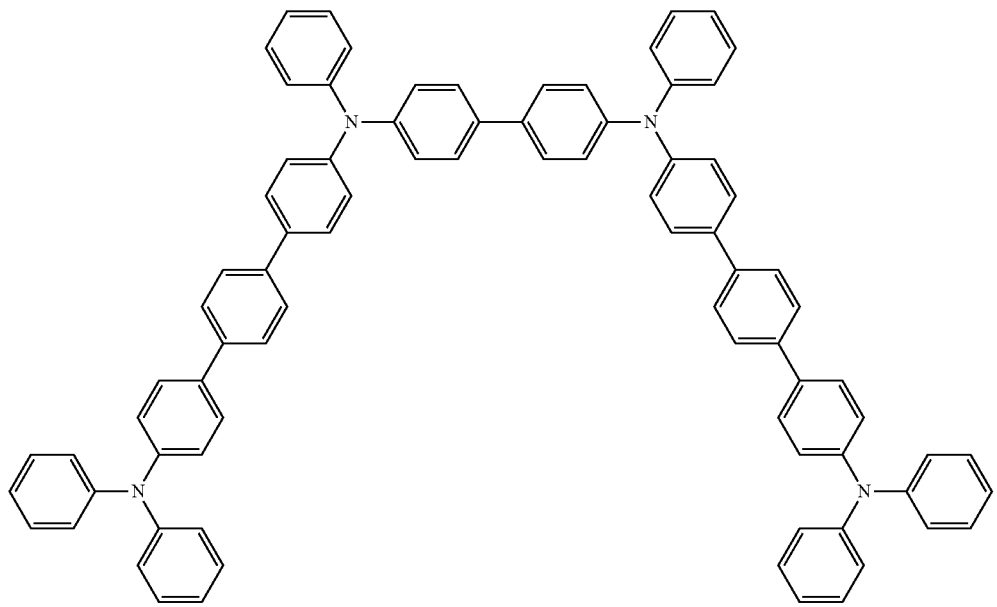
(3-38)
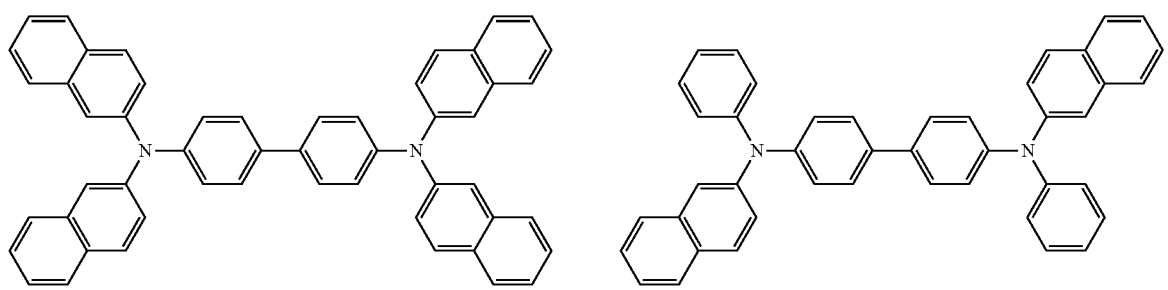
(3-39) (3-40)
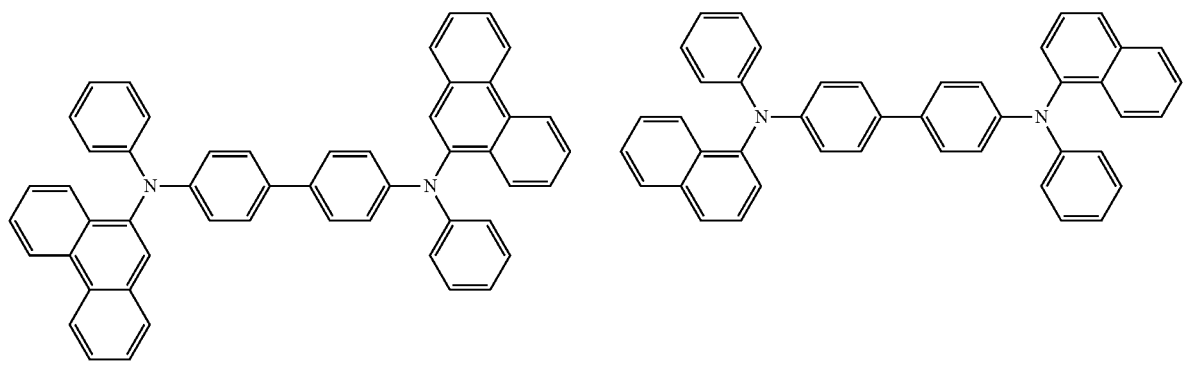
(3-41) (3-42)
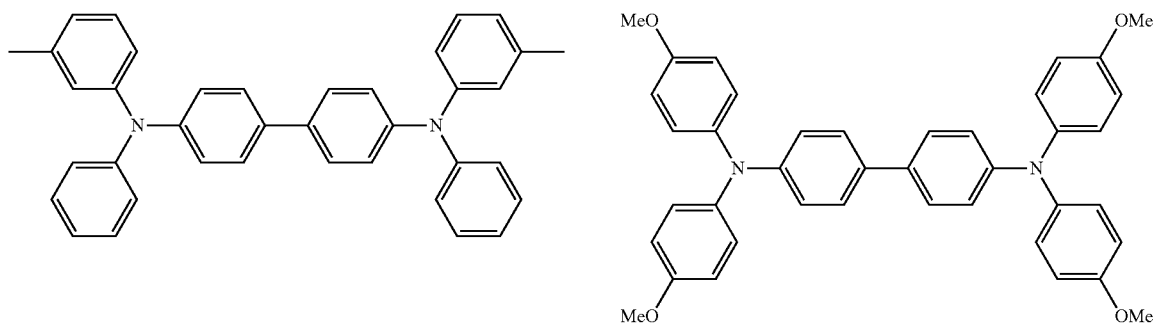
(3-43) (3-44)

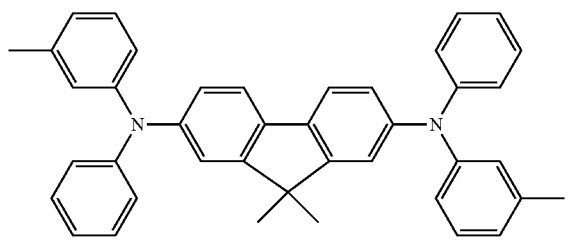

(3-45)

The low molecular material to be added to the red light emitting layer 16CR and the green light emitting layer 16CG may not only be one type, but also a mixture of a plurality of types.

The hole transport layer 16BB of the blue organic EL device 10B is intended to improve efficiency of hole transport to the blue light emitting layer 16CB. The hole transport layer 16BB is provided on the hole injection layer 16AB. The thickness of the hole transport layer 16BB is, for example, preferably 10 nm to 200 nm, both inclusive, and more preferably 15 nm to 150 nm, both inclusive, though depending on the overall structure of the device.

The hole transport layer 16BB may be made of either a low molecular material (monomer and oligomer) or a polymer. Among the low molecular materials used herein, the monomer is a material other than a compound such as a polymer or a condensation polymer of a low molecular compound similar to the low molecular material to be added to the red light emitting layer 16CR and the green light emitting layer 16CG. The molecular weight of the monomer is uniform, and the monomer exists as a single molecule. In addition, the oligomer indicates a material in which a plurality of monomers are bonded and the weight average molecular weight (Mw) is 50 thousand or less. Further, in a manner similar to the polymer material used in the hole transport layers 16BR and 16BG, the polymer material has a weight average molecular weight of a range between 50 thousand and 300 thousand, both inclusive, and preferably about 100 thousand to 200 thousand, both inclusive, in particular. As the low molecular material and the polymer material used in the hole transport layer 16BB, two or more types of materials having different molecular weight and weight average molecular weight may be mixed and used.

As the low molecular material used in the hole transport layer 16BB, for example, benzene, styrylamine, triphenylamine, porphyrin, triphenylene, azatriphenylene, tetracyanquinodimethane, triazole, imidazole, oxadiazole, polyarylalkane, phenylenediamine, arylamine, oxazole, anthracene, fluorenone, hydrazone, stibene, or a derivative thereof, a heterocyclic ring conjugated monomer oligomer, or polymer, such as a polysilane compound, a vinylcarbazole compound, a thiophene compound, or an aniline compound, is able to be used.

Specific examples of the low molecular material include, but are not limited to, α-naphthylphenylphenylenediamine, porphyrin, metal tetraphenylporyphyrin, metal naphthalocyanine, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano-4,4,4-tris(3-methylphenylphenylamino)triphenylamine, N,N,N',N'-tetrakis(p-tolyl)-p-phenylenediamine, N,N,N',N'-tetraphenyl-4,4'-diaminobiphenyl, N-phenylcarbazole, 4-di-p-tolylaminostilbene, poly(paraphenylene vinylene), poly(thiophene vinylene), and poly(2,2-thienylpyrrole).

Further, the hole transport layer 16BB is preferably composed using the low molecular materials expressed in the foregoing Formula 1 to Formula 3. Specific examples include the compounds indicated by the foregoing Formula (1-1) to Formula (I-48), Formula (2-1) to Formula (2-69), and Formula (3-1) to Formula (3-49).

The polymer material is selected appropriately depending on the relationship with the materials of the electrodes and the adjacent layers. As the polymer material, a light emitting material that is able to be dissolved in an organic solvent, such as polyvinyl carbazole, polyfluorene, polyaniline, polysilane, or a derivative thereof, a polysiloxane derivative containing an aromatic amine structure in the side chain or the main chain, polythiophene or a derivative thereof, or polypyrrole is able to be used.

More preferably, a polymer material expressed in Formula 4 having favorable contact characteristics with the adjacent organic layer and having a characteristic of being dissolvable in organic solvent is given.

Formula 4

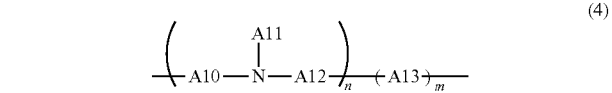

(4)

In the formula, A10 to A13 represent a group in which one to ten aromatic hydrocarbon groups or a derivative thereof are bonded, or a group in which one to fifteen heterocyclic groups or a derivative thereof are bonded. n and m are integers that are from 0 to 10,000, both inclusive, and n+m is an integer that is from 10 to 20,000, both inclusive.

In addition, the arrangement sequence of the n part and the m part is arbitrarily set, and may be, for example, any of a random polymer, an alternating copolymer, a periodic copolymer, or a block copolymer. Further, n and m are preferably integers that are from 5 to 5,000, both inclusive, and more preferably from 10 to 3,000, both inclusive. In addition, n+m is preferably an integer that is from 10 to 10,000, both inclusive, and more preferably from 20 to 6,000, both inclusive.

Specific examples of the aromatic hydrocarbon group in A10 to A13 of the foregoing Formula (4) include benzene, fluorene, naphthalene, anthracene, or a derivative thereof, a phenylene vinylene derivative, and a styryl derivative. Specific examples of the heterocyclic group include thiophene, pyridine, pyrrole, carbazole, or a derivative thereof.

Further, in the case where A10 to A13 of the foregoing Formula 4 have a substituent, the substituent is, for example, an alkyl group or an alkynyl group that is a linear chain or branched and has a carbon number of 1 to 12. Specifically, a methyl group, an ethyl group, a propyl group, an isopropyl group, a butyl group, an isobutyl group, a sec-butyl group, a tert-butyl group, a pentyl group, a hexyl group, a heptyl group, an octyl group, a nonyl group, a decyl group, a undecyl group, a dodecyl group, a vinyl group, an aryl group, or the like is preferred.

As specific examples of the compound expressed in Formula 4, compounds expressed in following Formula (4-1) to Formula (4-3), poly[(9,9-dioctylfluorenyl-2,7-diyl)-co-(4,4'-(N-(4-sec-butylphenyl))diphenylamine)](TFB, Formula (4-1)), poly[(9,9-dioctylfluorenyl-2,7-diyl)-alt-co-(N,N'-bis{4-butylphenyl}-benzidineN,N'-{1,4-diphenylene})] (Formula (4-2), and poly[(9,9-dioctylfluorenyl-2,7-diyl)] (PFO, Formula (4-3)) are preferable, but are not limited thereto.

described regarding the red light emitting layer 16CR, the green light emitting layer 16CG, and the blue hole transport layer 16BB, for example, benzene, styrylamine, triphenylamine, porphyrin, triphenylene, azatriphenylene, tetracyanquinodimethane, triazole, imidazole, oxadiazole, polyarylalkane, phenylenediamine, arylamine, oxazole, anthracene, fluorenone, hydrazone, stibene, or a derivative thereof, a heterocyclic conjugated monomer, oligomer, or polymer, such as a polysilane compound, a vinylcarbazole compound, a thiophene compound, or an aniline compound, is able to be used.

Specific examples of the low molecular material include, but are not limited to, α-naphthylphenylphenylenediamine, porphyrin, metal tetraphenylporyphyrin, metal naphthalo- Formula (4-1) to Formula (4-3)

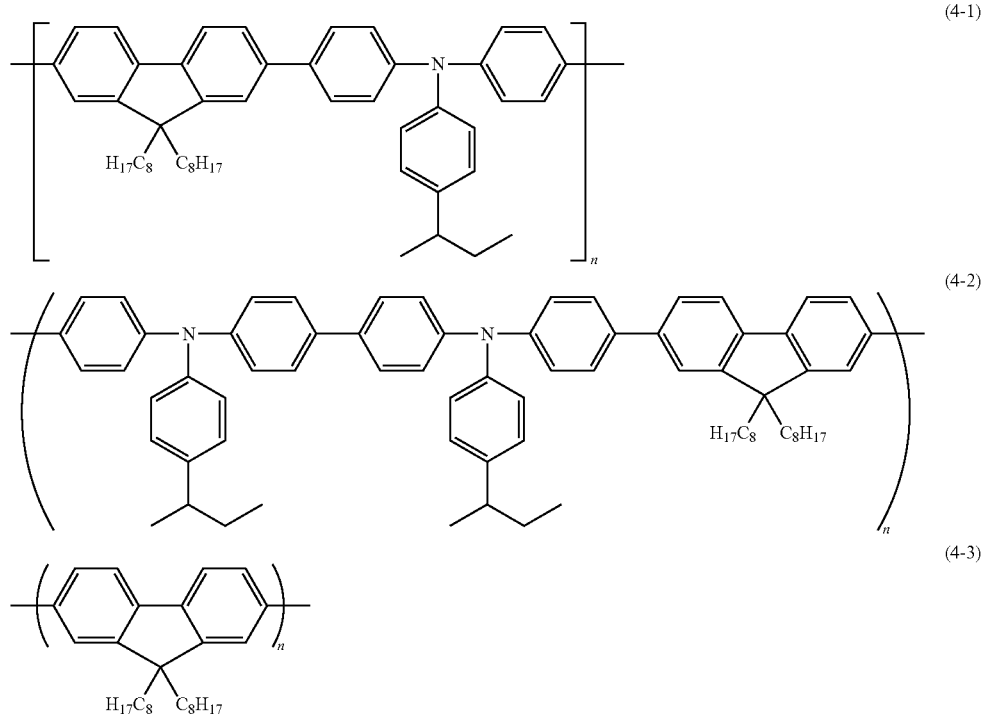

The common hole transport layer 16D is intended to improve efficiency of injection of holes into the blue light emitting layer 16CB, described hereinafter. The common hole transport layer 16D is provided as a common layer on the entire surfaces of the red light emitting layer 16CR, the green light emitting layer 16CG, and the hole transport layer 16BB for the blue organic EL device 10B. The thickness of the common hole transport layer 16D is, for example, preferably 1 nm to 20 nm, both inclusive, and more preferably 1 nm to 10 nm, both inclusive, though depending on the overall structure of the device.

To form the common hole transport layer 16D using the evaporation method, a low molecular material, particularly a monomer, is preferably used, since a polymerized molecule such as oligomer or a polymer material may decompose during evaporation. As the low molecular material used in the common hole transport layer 16D, two or more types of materials having different molecular weight may be mixed and used.

As the low molecular material used in the common hole transport layer 16D, similar to the low molecular materials cyanine, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano-4,4,4-tris(3-methylphenylphenylamino)triphenylamine, N,N,N',N'-tetrakis(p-tolyl)-p-phenylenediamine, N,N,N',N'-tetraphenyl-4,4'-diaminobiphenyl, N-phenylcarbazole, 4-di-p-tolylaminostilbene, poly(paraphenylene vinylene), poly(thiophene vinylene), and poly(2,2-thienylpyrrole).

Further, the common hole transport layer 16D is preferably composed using the low molecular materials expressed in the foregoing Formula 1 to Formula 3. Specific examples include compounds indicated by the foregoing Formula (1-1) to Formula (1-48), Formula (2-1) to Formula (2-69), and Formula (3-1) to Formula (3-49).

The blue light emitting layer 16CB generates light due to electron-hole recombination by applying an electric field. The blue light emitting layer 16CB is provided on the entire surface of the common hole transport layer 16D. In the blue light emitting layer 16CB, an anthracene compound as a host material is doped with a guest material that is a blue or green fluorescent dye, and blue or green light is generated.

Specially, as the host material composing the blue light emitting layer 16CB, the compound expressed in Formula 5 is preferably used.

Formula 5

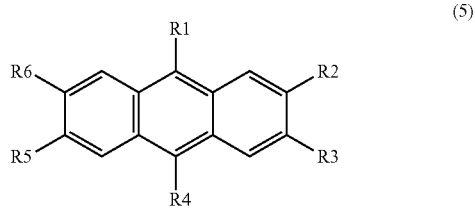

(5)

In the formula, R1 to R6 represent a hydrogen atom, a halogen atom or a hydroxyl group; a group having an alkyl group, an alkenyl group or a carbonyl group with a carbon number of 20 or less; a group having a carbonyl ester group, a group having an alkoxyl group, a group having a cyano group, a group having a nitro group, or a derivative thereof; a group having a silyl group with a carbon number of 30 or less; or a group having an aryl group, a group having a heterocyclic group, a group having an amino group, or a derivative thereof.

Examples of the group having an aryl group represented by R1 to R6 in the compound expressed in Formula 5 include a phenyl group, a 1-naphthyl group, a 2-naphthyl group, a fluorenyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, 2-naphthacenyl group, 9-naphthacenyl group, 1-pyrenyl group, 2-pyrenyl group, 4-pyrenyl group, 1-crycenyl group, 6-crynecyl group, 2-fluoranthenyl group, 3-fluoranthenyl group, 2-biphenylyl group, 3-biphenylyl group, 4-biphenyl group, o-tolyl group, m-tolyl group, p-tolyl group, and p-t-butylphenyl group.

Examples of the group having a heterocyclic group represented by R1 to R6 include a 5- or 6-membered aromatic ring group containing an oxygen atom (O), a nitrogen atom (N), and a sulfur atom (S) as a heteroatom, and a condensed polycyclic aromatic ring group with a carbon number of 2 to 20, both inclusive. Examples of such a heterocyclic group include a thienyl group, a furyl group, a pyrrolyl group, a pyridyl group, a quinolyl group, a quinoxalyl group, an imidazopyridyl group, and a benzothiazole group. Representative examples thereof include a 1-pyrrolyl group, a 2-pyrrolyl group, a 3-pyrrolyl group, a pyrazinyl group, a 2-pyrindinyl group, a 3-pyrindinyl group, a 4-pyrindinyl group, a 1-indoylyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, 7-isoquinolyl group, an 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, an 8-phenanthridinyl group, a 9-phenanthridinyl group, a 10-phenanthridinyl group, a 1-acridinyl group, a 2-acridinyl group, a 3-acridinyl group, a 4-acridinyl group, and a 9-acridinyl group.

The group having an amino group represented by R1 to R6 may be any of an alkylamino group, an arylamino group, an aralkylamino group, and the like. The group preferably has an aliphatic hydrocarbon group with a carbon number of 1 to 6 atoms, both inclusive, and/or an aromatic ring group with a carbon number of 1 to 4 atoms, both inclusive. Examples of such a group includes a dimethylamino group, a diethylamino group, dibutylamino group, a diphenylamino group, a diphenylamino group, a ditolylamino group, a bisbiphenylylamino group, and a dinaphthylamino group. The foregoing substituent may form a condensed ring composed of two or more substituents, and may further be a derivative thereof.

Specific examples of the compound indicated in Formula 5 include compounds such as the following Formula (5-1) to Formula (5-51).

Formula (5-1) to Formula (5-51)

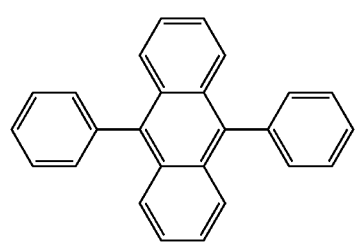

(5-1)

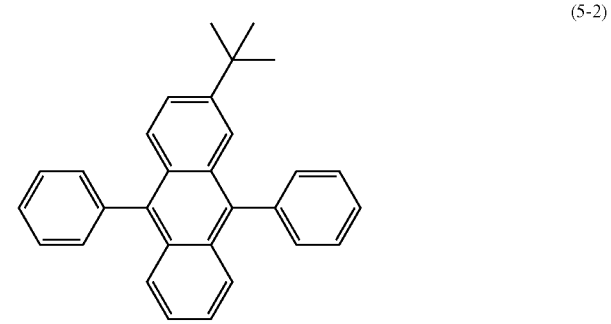

(5-2)

-continued
(5-3)
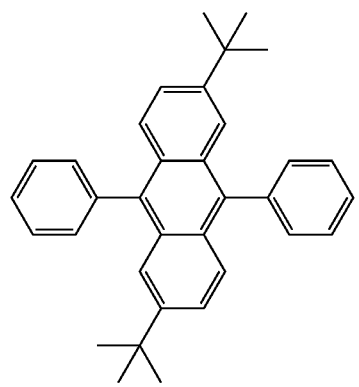
(5-4)
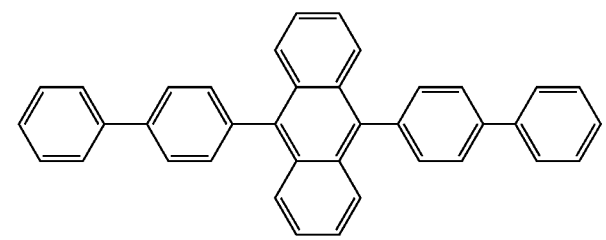
(5-5)
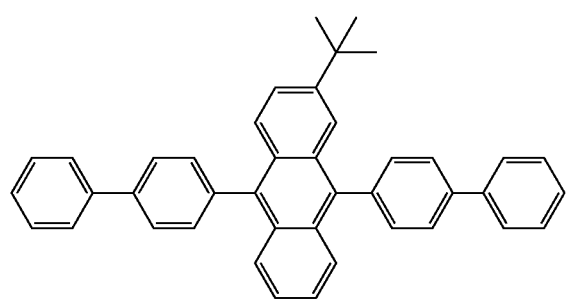
(5-6)
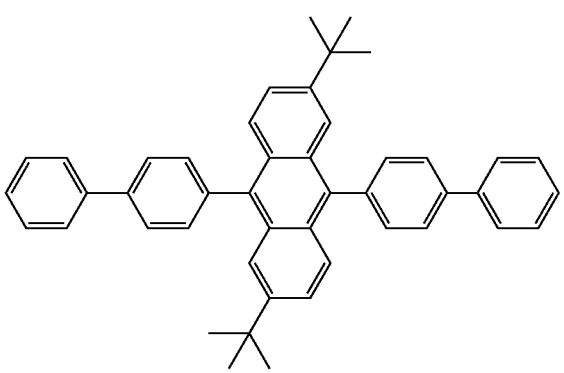
(5-7)
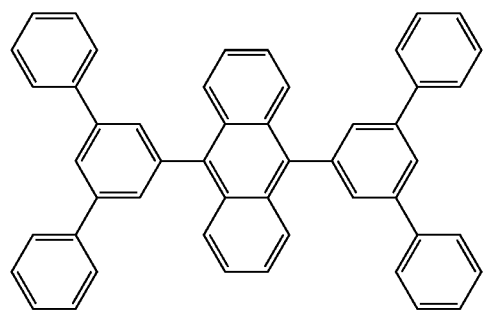
(5-8)
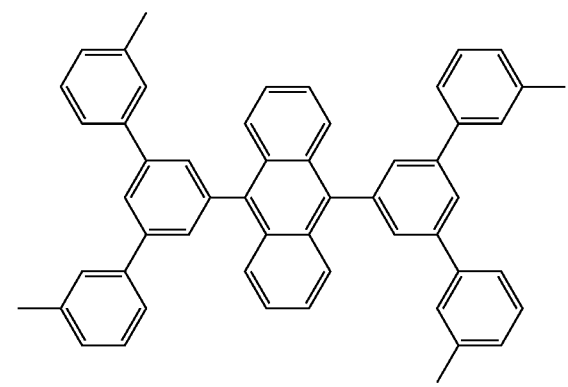
(5-9)
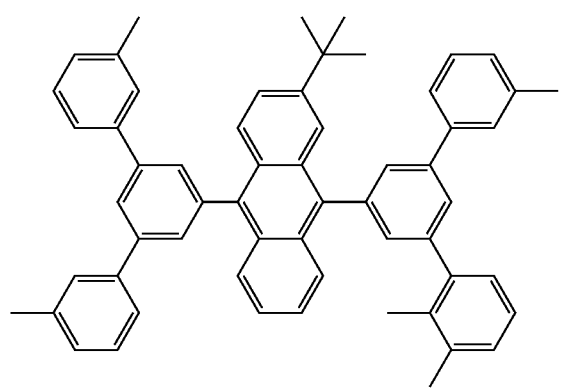
(5-10)
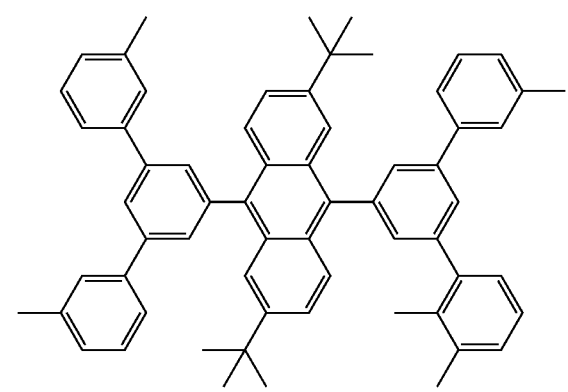

(5-11)
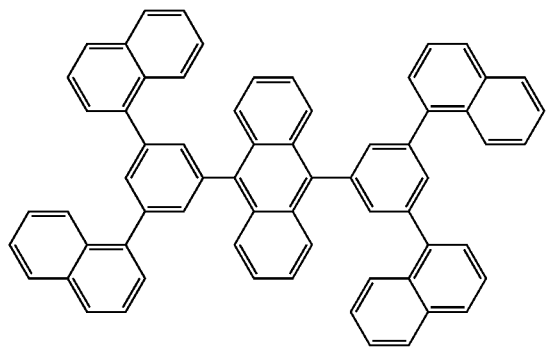
(5-12)
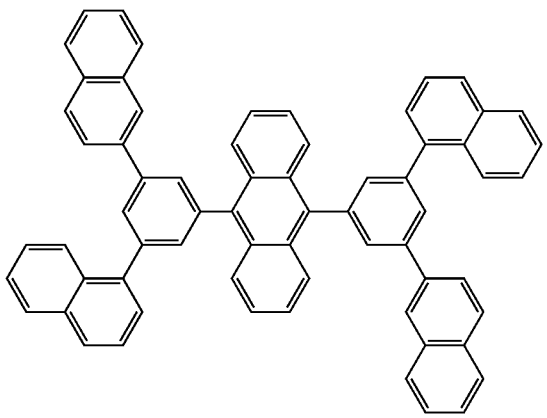
(5-13)
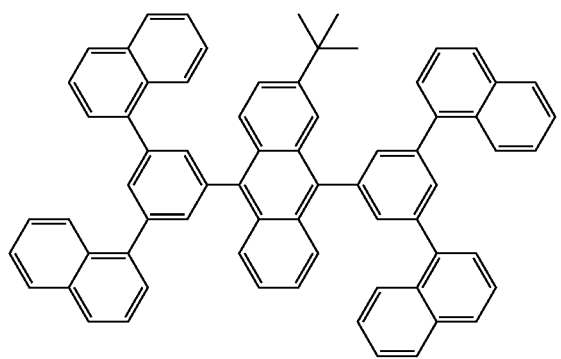
(5-14)
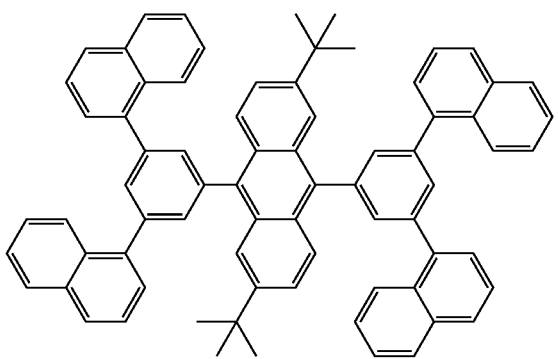
(5-15)
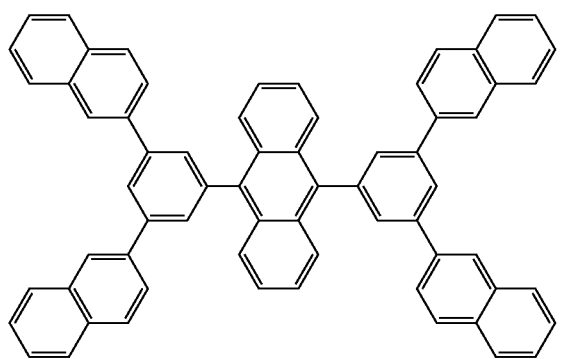
(5-16)
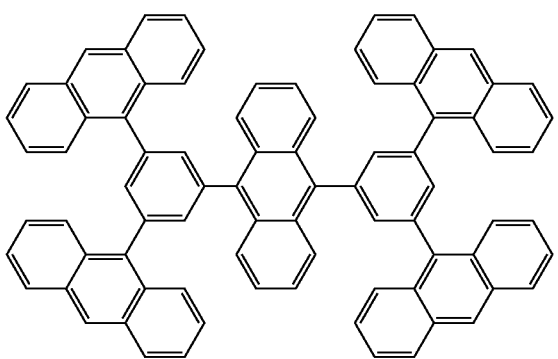

-continued
(5-17)
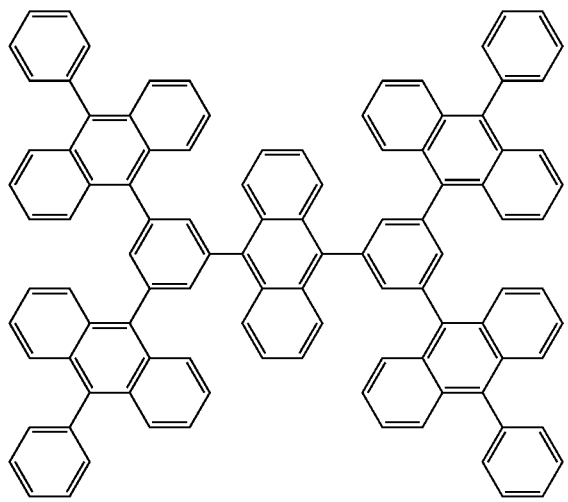
(5-18)
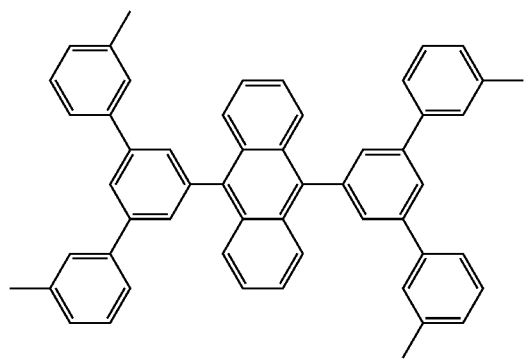
(5-19)
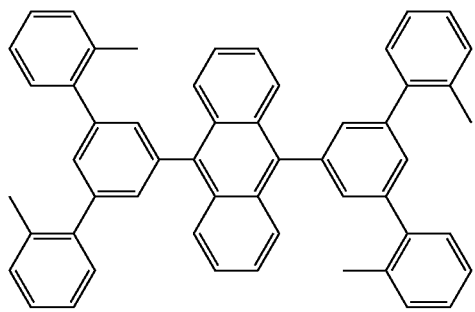
(5-20)
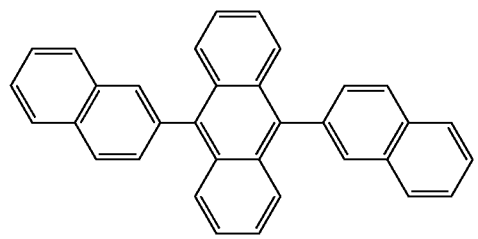
(5-21)
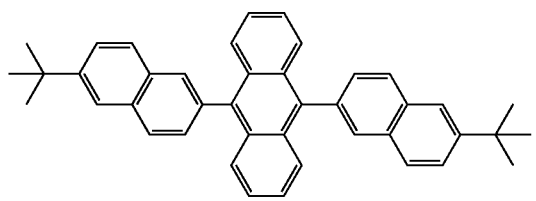
(5-22)
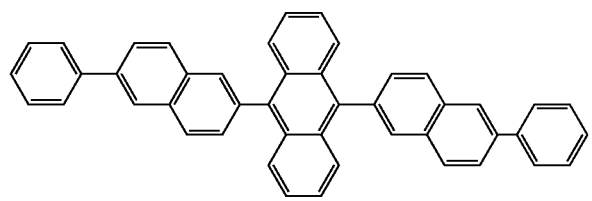
(5-23)
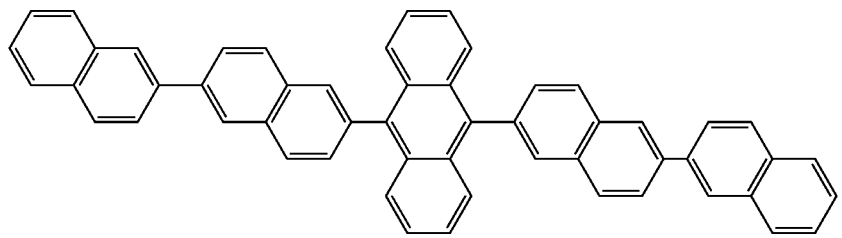
(5-24)
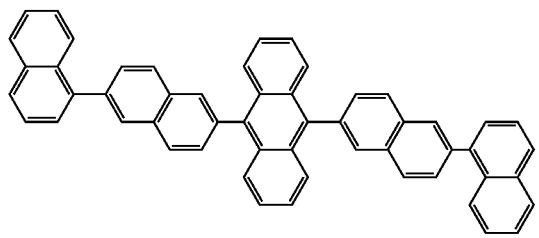
(5-25)
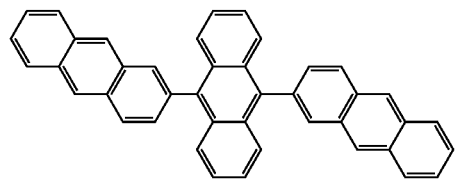

-continued
(5-26)
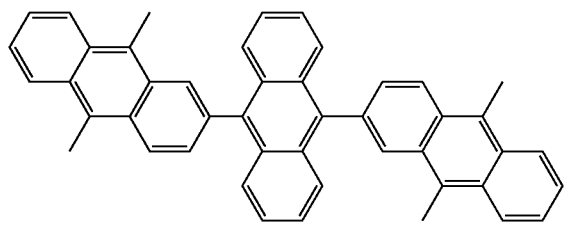
(5-27)
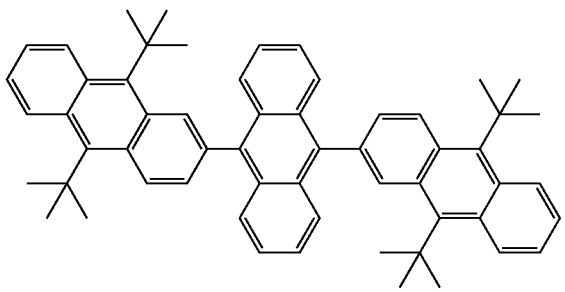
(5-28)
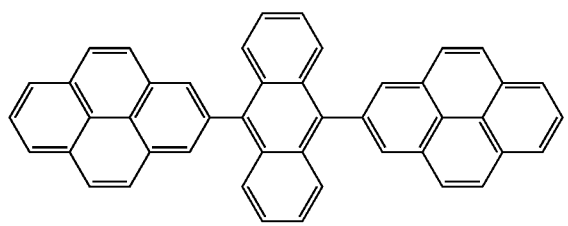
(5-29)
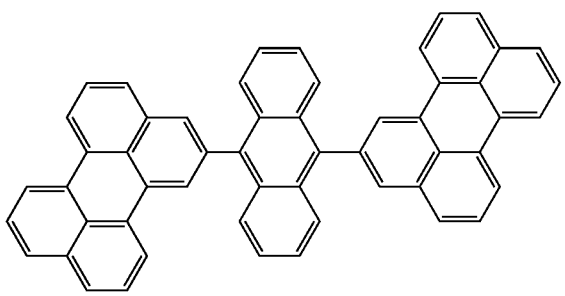
(5-30)
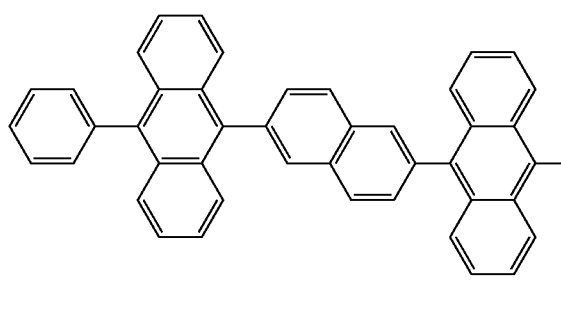
(5-31)
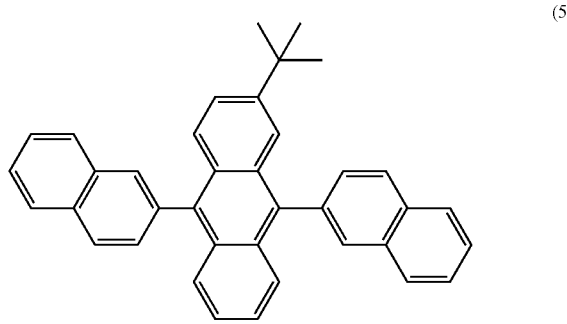
(5-32)
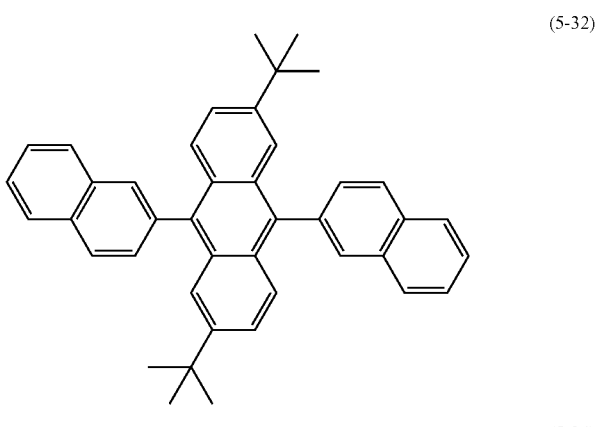
(5-33)
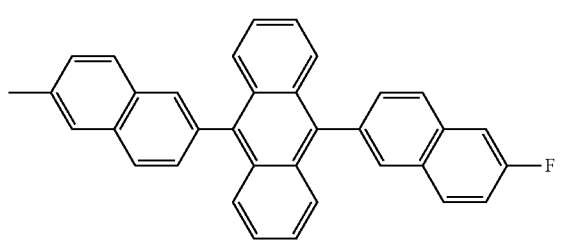
(5-34)
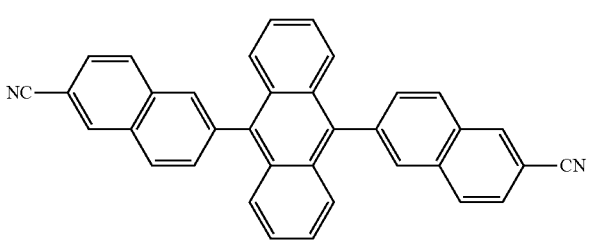

(5-35)
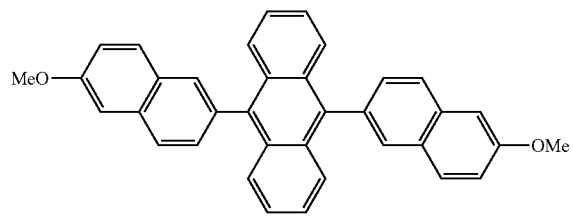
(5-36)
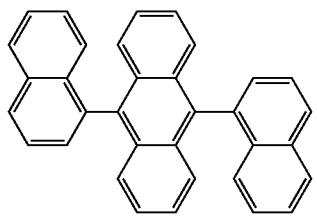
(5-37)
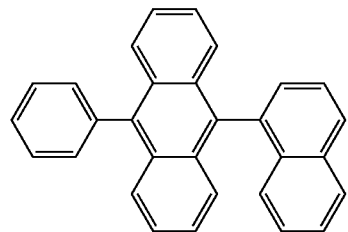
(5-38)
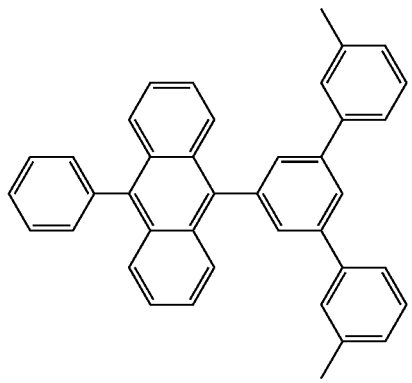
(5-39)
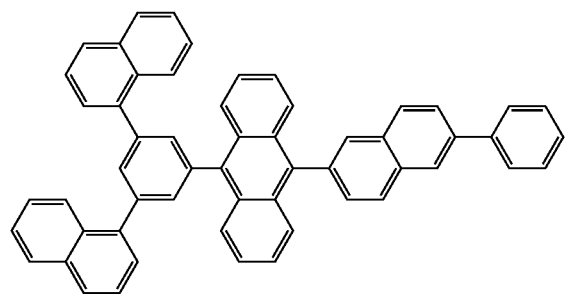
(5-40)
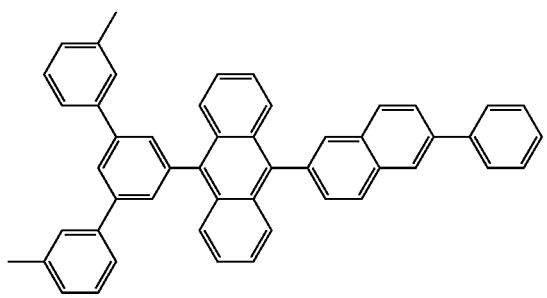
(5-41)
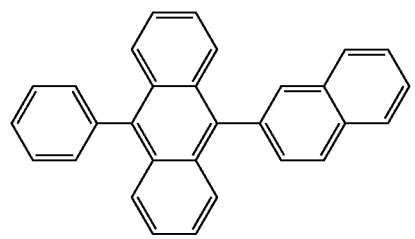
(5-42)
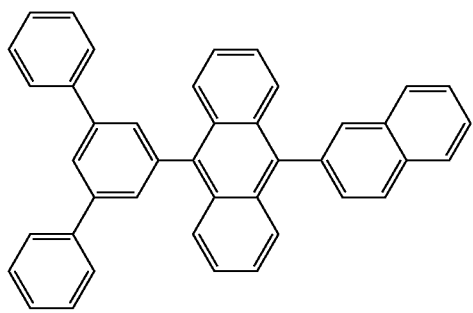
(5-43)
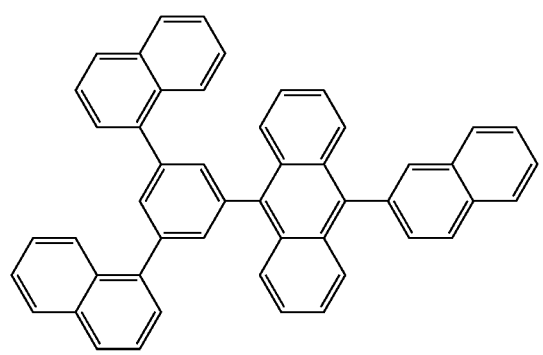
(5-44)
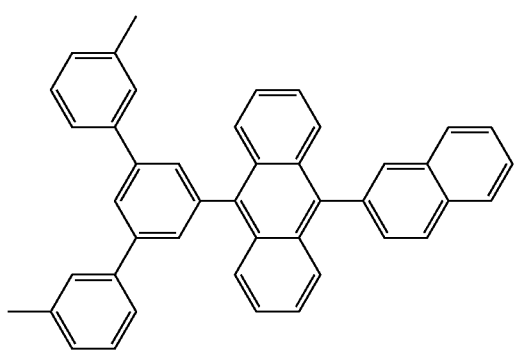

-continued (5-45)
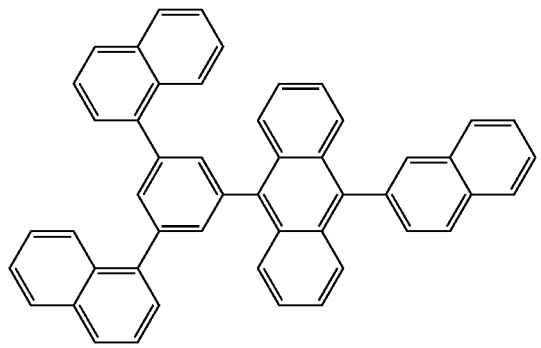

(5-46)
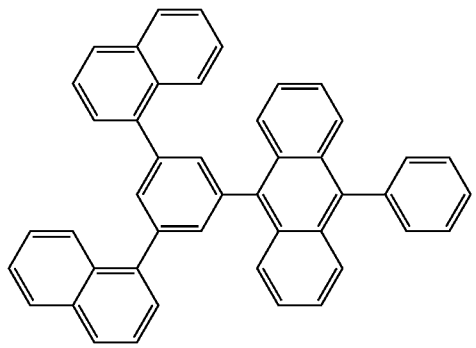

(5-47)
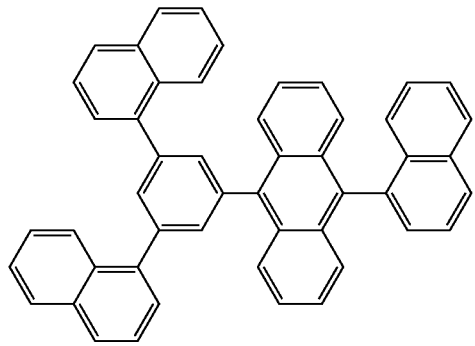

(5-48)
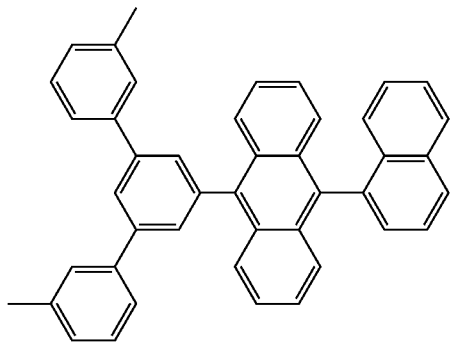

(5-49)
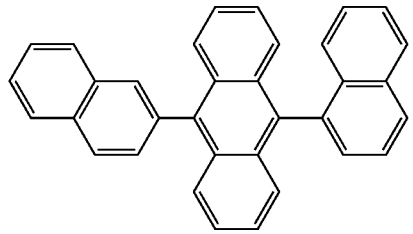

(5-50)
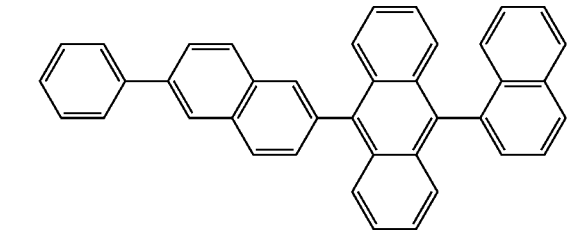

(5-51)
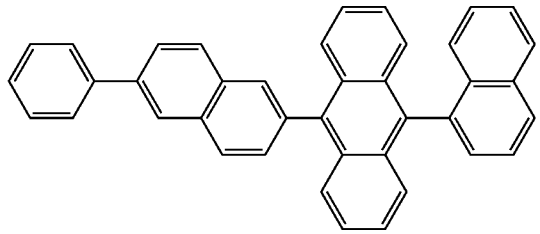

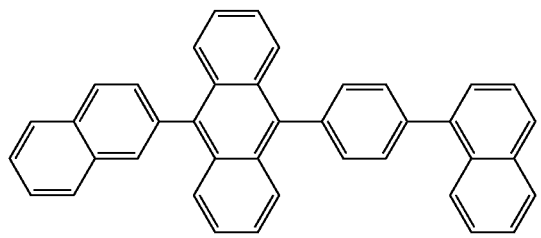

Meanwhile, as the light emitting guest material composing the blue light emitting layer 16CB, a material having high emission efficiency, for example, a low molecular fluorescent material or an organic light emitting material such as phosphorescent dye or a metallic complex is used.

Here, the blue light emitting guest material indicates a compound having a peak in an emission wavelength range within a range of about 400 nm to 490 nm, both inclusive. As such a compound, an organic material, such as a naphthanele derivative, an anthracene derivative, a naphthacene derivative, a styrylamine derivative, or a bis(azinyl)methane boron complex, is used. Specially, an aminonaphthalene derivative, an aminoanthracene derivative, an aminochrysene derivative, an aminopyrene derivative, a styrylamine derivative, or a bis(azinyl) methane boron complex is preferably selected.

The electron transport layer 16E is intended to improve efficiency of electron transport to the red light emitting layer 16CR, the green light emitting layer 16CG, and the blue light emitting layer 16CB. The electron transport layer 16E is provided as a common layer over the entire surface of the blue light emitting layer 16CB. Examples of the material of the electron transport layer 16E include quinoline, perylene, phenanthroline, bisstyryl, pyrazine, triazole, oxazole, fullerene, oxadiazole, fluorenone, or a derivative or a metal complex thereof. Specific examples include tris(8-hydroxyquinoline)aluminum (abbreviated as $Alq_3$), anthracene, naphthalene, phenanthrene, pyrene, perylene, butadiene, courmarin, C60, acridine, stilbene, 1,10-phenanthroline, and a derivative or a metal complex thereof.

The electron injection layer 16F is intended to improve electron injection efficiency. The electron injection layer 16F is provided as a common layer over the entire surface of the electron transport layer 16E. As the material of the electron injection layer 16F, for example, lithium oxide ($Li_2O$) that is an oxide of lithium (Li), cesium carbonate ($Cs_2CO_3$) that is a complex oxide of cesium (Cs), or a mixture of the foregoing oxide and complex oxide may be used. The material of the electron injection layer 16F is not limited to such materials, and for example, an alkaline earth metal such as calcium (Ca) or barium (Ba); an alkali metal such as lithium or cesium; a metal having a low work function such as indium (In) and magnesium (Mg); or an oxide, a complex oxide, or a fluoride of these metals, as a simple substance, as a mixture, or an alloy thereof may be used with improved stability.

The thickness of the upper electrode 17 is, for example, 2 nm to 15 nm, both inclusive. The upper electrode 17 is composed of a metal conductive film. Specifically, an alloy of Al, Mg, Ca, or Na is given. Specially, an alloy of magnesium and silver (Mg—Ag alloy) is preferable since the alloy has both conductivity and small absorption. The ratio of magnesium and silver in the Mg—Ag alloy is not particularly limited, but preferably ranges between Mg:Ag=20:1 to 1:1, both inclusive, as a film thickness ratio. Further, the material of the upper electrode 17 may also be an alloy of Al and Li (Al—Li alloy).

Further, the upper electrode 17 may be a mixture layer containing an organic light emitting material, such as an alumiquinoline complex, a styrylamine derivative, or a phthalocyanine derivative. In this case, a layer having light transmittance, such as MgAg, may be provided separately as a third layer. In the case of an active matrix drive system, the upper electrode 17 is formed as a solid film on the substrate 11 in a state in which the upper electrode 17 is insulated from the lower electrode 14 by the organic layer 16 and the partition wall 15. The upper electrode 17 is used as a common electrode of the red organic EL device 10R, the green organic EL device 10G, and the blue organic EL device 10B.

The thickness of the protective layer 20 is, for example, 2 μm to 3 μm, both inclusive. The protective layer 20 may be composed of either an insulating material or a conductive material. As the insulating material, an inorganic amorphous insulating material, such as amorphous silicon (α-Si), amorphous silicon carbide (α-SiC), amorphous silicon nitride (α-$Si_{1-x}N_X$), or amorphous carbon (α-C), is preferable. Since such inorganic amorphous insulating materials do not structure grains, the inorganic amorphous insulating materials have low water permeability and serve as a favorable protective layer.

The sealing substrate 40 is positioned on the upper electrode 17 side of the red organic EL device 10R, the green organic EL device 10G, and the blue organic EL device 10B. The sealing substrate 40, together with an adhesive layer (not illustrated), is intended to seal the red organic EL device 10R, the green organic EL device 10G, and the blue organic EL device 10B. The sealing substrate 40 is composed of a material such as glass that is capable of transmitting light generated by the red organic EL device 10R, the green organic EL device 10G, and the blue organic EL device 10B. The sealing substrate 40 is provided with, for example, a color filter and a light blocking film as a black matrix (neither are illustrated). The sealing substrate 40 extracts light generated in the red organic EL device 10R, the green organic EL device 10G, and the blue organic EL device 10B, and absorbs outside light reflected in the red organic EL device 10R, the green organic EL device 10G, and the blue organic EL device 10B and the wirings therebetween, thereby improving contrast.

The color filter includes a red filter, a green filter, and a blue filter (none are illustrated) which are sequentially arranged in correspondence to the red organic EL device 10R, the green organic EL device 10G, and the blue organic EL device 10B. The red filter, the green filter, and the blue filter each have, for example, a rectangular shape and are formed without space in between. The red filter, the green filter, and the blue filter are each made of resin to which a pigment is added. Through selection of the pigment, adjustment is made such that light transmittance in the target red, green, or blue wavelength region is high, and light transmittance in the other wavelength regions is low.

Further, the wavelength range with high transmittance in the color filter corresponds with peak wavelength λ of spectrum of light that is desirably extracted from a resonator structure MC1. Thereby, out of outside light entering from the sealing substrate 40, only light having a wavelength equal to the peak wavelength λ of spectrum of light that is desirably extracted passes through the color filter, and outside light in other wavelengths is prevented from entering into the organic light EL devices 10R, 10G, and 10B.

The light blocking film is composed of, for example, a black resin film in which a black coloring agent is added and whose optical density is 1 or more, or a thin film filter using interference of a thin film. Specially, in the case where the light blocking film is configured by the black resin film, the light blocking film is able to be formed easily at a low cost and is preferable. The thin film filter attenuates light using interference of the thin film by layering one or more layers of a thin film made of a metal, a metal nitride, or a metal oxide. A specific example of the thin film filter is that chromium and chromium oxide (III) ($Cr_2O_3$) are alternately layered.

The organic EL display unit is able to be manufactured, for example, as follows.

Figure 4:
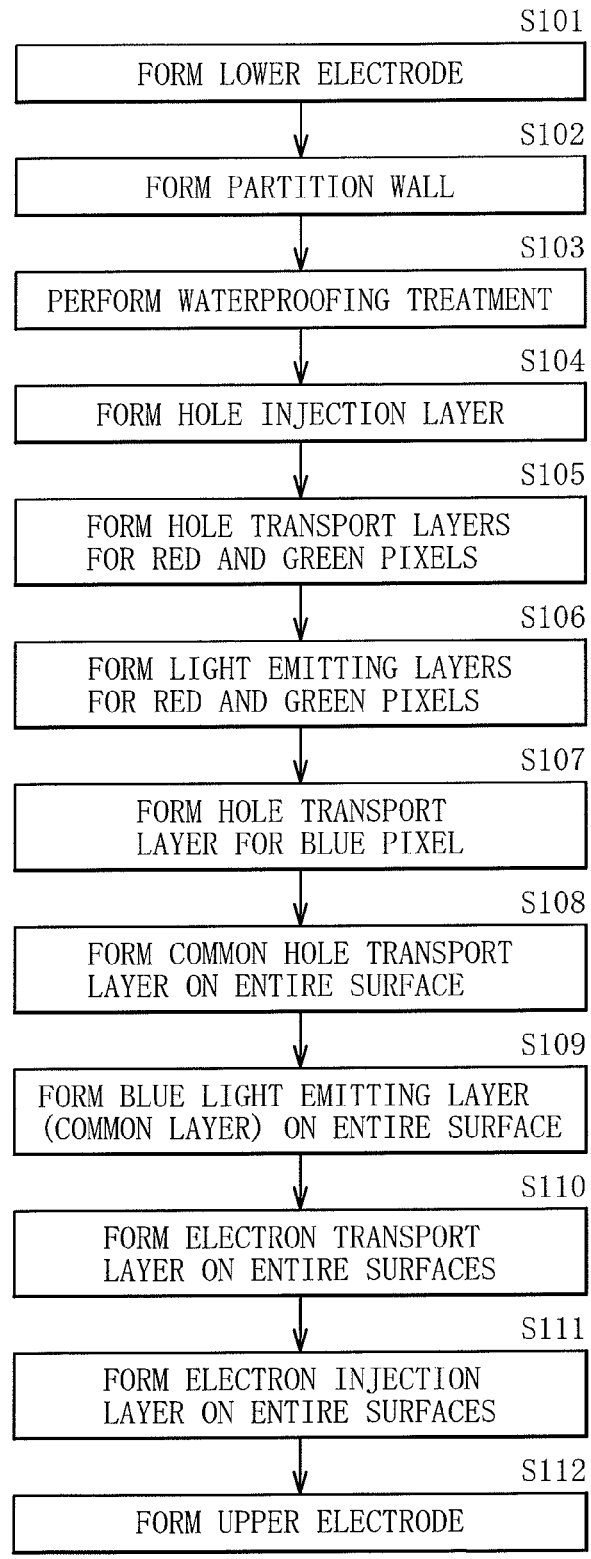
FIG. 4 is a diagram illustrating a flow of a method for manufacturing the organic EL display unit shown in FIG. 1.

FIG. 4 illustrates a flow of a method of manufacturing the organic EL display unit. FIG. 5A to FIG. 7C illustrate the manufacturing method illustrated in FIG. 4 in procedure sequence. First, the pixel drive circuit 140 including the drive transistor Tr1 is formed on the substrate 11 made of the foregoing material, and a planarizing insulating film (not illustrated) made of, for example, photosensitive resin is provided.

Procedure for Forming the Lower Electrode 14

Figure 5A:
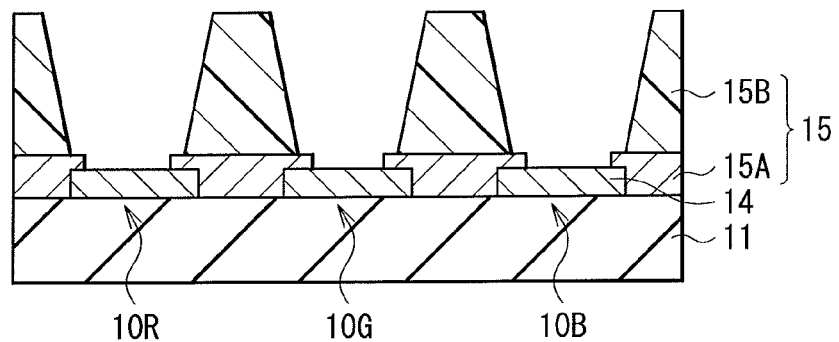
FIGS. 5A to 5C are cross-sectional views illustrating the manufacturing method shown in FIG. 4 in procedure sequence.

Next, a transparent conductive film made of, for example, ITO, is formed on the entire surface of the substrate 11. The transparent conductive film is patterned, and thereby the lower electrode 14 is formed for each of the red organic EL device 10R, the green organic EL device 10G, and the blue organic EL device 10B, as illustrated in FIG. 5A (Step S101). At this time, the lower electrode 14 is electrically connected to a drain electrode of the drive transistor Tr1 via a contact hole (not illustrated) in the planarizing insulating film (not illustrated).

Procedure for Forming the Partition Wall 15

Next, as similarly illustrated in FIG. 5A, on the lower electrode 14 and the planarizing insulating film (not illustrated), a film of an inorganic insulating material, such as $SiO_2$, is formed by, for example, chemical vapor deposition (CVD) method, and patterned using photolithography technology and etching technology. Thereby the lower partition wall 15A is formed.

Subsequently, as similarly shown in FIG. 5A, the upper partition wall 15B made of the foregoing photosensitive resin is formed in a given position on the lower partition wall 15A, specifically a position surrounding the light emitting region of the pixel. Thereby, the partition wall 15 composed of the upper partition wall 15A and the lower partition wall 15B is formed (Step S102).

After the partition wall 15 is formed, oxygen plasma treatment is performed on the surface of the substrate 11 on the side on which the lower electrode 14 and the partition wall 15 are formed. Contaminants, such as organic matter, attached to the surface are removed, and wettability is improved. Specifically, the substrate 11 is heated to a given temperature, such as about 70 deg C. to 80 deg C., both inclusive, and plasma treatment ($O_2$ plasma treatment) using oxygen as a reactant gas is performed under atmospheric pressure.

Procedure for Performing Waterproofing Treatment

After the plasma treatment is performed, waterproofing treatment (liquid-proofing treatment) is performed (Step S103), thereby wettability of particularly the upper surface and the side surface of the upper partition wall 15B is reduced. Specifically, plasma treatment (CF4 plasma treatment) using 4 fluoromethane as a reactant gas is performed under atmospheric pressure. Then, the substrate 11 that has been heated for the plasma treatment is cooled to room temperature, thereby the upper surface and the side surface of the upper partition wall 15B are water-proofed, and wettability thereof is reduced.

In the CF4 plasma treatment, exposed surfaces of the lower electrode 14 and the lower partition wall 15A are somewhat affected. However, since ITO that is the material of the lower electrode 14, and $SiO_2$ or the like that is the component materials of the lower partition wall 15B have poor affinity with fluorine, the surface of which wettability has been enhanced by the oxygen plasma treatment retains the same wettability.

Procedure for Forming the Hole Injection Layers 16AR, 16AG, and 16AB

Figure 5B:
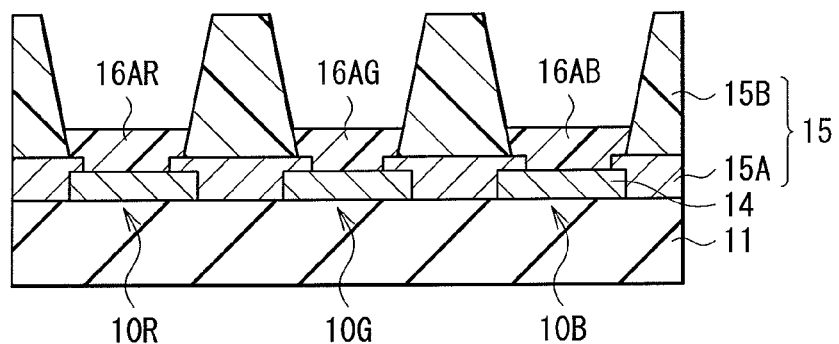

After the waterproofing treatment is performed, as illustrated in FIG. 5B, the hole injection layers 16AR, 16AG, and 16AB made of the foregoing material are formed within the region surrounded by the upper partition wall 15B (Step S104). The hole injection layers 16AR, 16AG, and 16AB are formed by coating method, such as spin coat method or droplet discharge method. In particular, since there is a necessity to selectively dispose the formation material of the hole injection layers 16AR, 16AG, and 16AB within the region surrounded by the upper partition wall 15B, inkjet method that is a droplet discharge method, or nozzle coat method is preferably used.

Specifically, a solution or a dispersion liquid of polyaniline, polythiophene, or the like that is a formation material of the hole injection layers 16AR, 16AG, and 16AB is disposed on the exposed surface of the lower electrode 14 by, for example, inkjet method. Then, heat treatment (drying treatment) is performed, and thereby the hole injection layers 16AR, 16AG, and 16AB are formed.

In the heat treatment, after the solution or the dispersion liquid is dried, the resultant is heated at a high temperature. In the case where a conductive polymer such as polyaniline or polythiophene is used, air atmosphere or oxygen atmosphere is preferable, since as a result of oxidation of the conductive polymer caused by oxygen, conductivity is facilitated.

The heating temperature is preferably 150 deg C. to 300 deg C., both inclusive, and more preferably 180 deg C. to 250 deg C. Time is preferably about 5 minutes to 300 minutes, both inclusive, and more preferably 10 minutes to 240 minutes, though depending on the temperature and the atmosphere. The film thickness after drying is preferably 5 nm to 100 nm, both inclusive, and more preferably 8 nm to 50 nm.

Figure 5C:
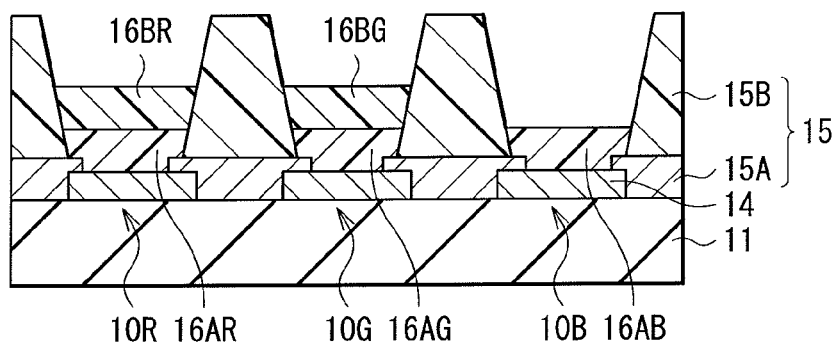

Procedure for forming the hole transport layers 16BR and 16BG of the red organic EL device 10R and the green organic EL device 10G After the hole injection layers 16AR, 16AG, and 16AB are formed, as illustrated in FIG. 5C, the hole transport layers 16BR and 16BG made of the foregoing polymer material are formed on the hole injection layers 16AR and 16AG, for each red organic EL device 10R and green organic EL device 10G (Step S105). The hole transport layers 16BR and 16BG are formed by a coating method such as spin coat method or droplet discharge method. In particular, since there is a necessity to selectively dispose the formation material of the hole transport layers 16BR and 16BG within the region surrounded by the upper partition wall 15B, inkjet method that is a droplet discharge method, or nozzle coat method is preferably used.

Specifically, a solution or a dispersion liquid of a high molecular weight polymer that is a formation material of the hole transport layers 16BR and 16BG is disposed on the exposed surface of the hole injection layers 16AR and 16AG by, for example, inkjet method. Then, heat treatment (drying treatment) is performed, and thereby the hole transport layers 16BR and 16BG of the red organic EL device 10R and the green organic EL device 10G are formed.

In the heat treatment, after the solution or the dispersion liquid is dried, the resultant is heated at a high temperature. As the atmosphere in which coating is performed and the atmosphere in which the solvent is dried and heated, an atmosphere including nitrogen ($N_2$) as a main component is preferable. If oxygen and moisture are present, emission efficiency and life of the manufactured organic EL display unit may decrease. In particular, care should be taken in the heating procedure, since the effect of oxygen and moisture is significant. Oxygen concentration is preferably 0.1 ppm to 100 ppm, both inclusive, and more preferably 0.1 ppm to 50 ppm, both inclusive. If oxygen concentration is greater than 100 ppm, the interface of the formed thin film may be contaminated, and emission efficiency and life of the manufactured organic EL display unit may decrease. In addition, if oxygen concentration is less than 0.1 ppm, although no issues arise in the characteristics of the device, device cost for maintaining the atmosphere with an oxygen concentration of less than 0.1 ppm in the current mass production process is likely to become enormous.

Further, regarding moisture, dew point is preferably −80 deg C. to −40 deg C., both inclusive. Moreover, the dew point is more preferably −80 deg C. to −50 deg C., both inclusive, and still more preferably −80 deg C. to −60 deg C., both inclusive. If moisture with dew point higher than −40 deg C. is present, the interface of the formed thin film may be contaminated, and emission efficiency and life of the manufactured organic EL display unit may decrease. In addition, if moisture is less than −80 deg C. in dew point, although no issues arise in the characteristics of the device, device cost for maintaining the atmosphere at a dew point lower than −80 deg C. in the current mass production process is likely to become enormous.

The heating temperature is preferably 100 deg C. to 230 deg C., both inclusive, and more preferably 100 deg C. to 200 deg C., both inclusive, The heat temperature is preferably at least lower than the temperature during formation of the hole injection layers 16AR, 16AG, and 16AB. Time is preferably about 5 minutes to 300 minutes, both inclusive, and more preferably 10 minutes to 240 minutes, both inclusive, though depending on the temperature and the atmosphere. The film thickness after drying is preferably 10 nm to 200 nm, both inclusive, and more preferably 15 nm to 150 nm, both inclusive, though depending on the overall structure of the device.

Procedure for forming the red light emitting layer 16CR and the green light emitting layer 16CG After the hole transport layers 16BR and 16BG of the red organic EL device 10R and the green organic EL device 10G are formed, as illustrated in FIG. 6A, the red light emitting layer 16CR made of the foregoing mixture of polymer and low molecular material is formed on the hole transport layer 16BR of the red organic EL element 10R. In addition, the green light emitting layer 16CG made of the foregoing mixture of polymer and low molecular material is formed on the hole transport layer 16BG of the green organic EL element 10G (Step S106). The red light emitting layer 16CR and the green light emitting layer 16CG are formed by a coating method such as spin coat method or droplet discharge method. In particular, since there is a necessity to selectively dispose the formation material of the red light emitting layer 16CR and the green light emitting layer 16CG within the region surrounded by the upper partition wall 15B, inkjet method that is a droplet discharge method, or nozzle coat method is preferably used.

Specifically, a solution or a dispersion liquid in which the polymer material and the low molecular material that are the formation materials of the red light emitting layer 16CR and the green light emitting layer 16CG are dissolved in a solvent in which xylene and cyclohexylbenzene are mixed at a ratio of 2:8, such as to be, for example, 1% by weight, is disposed on the exposed surface of the hole injection layers 16AR and 16AG by, for example, inkjet method. Then, heat treatment by a similar method and under similar conditions as the heat treatment (drying treatment) described in the foregoing procedure for forming the hole transport layer 16BR and 16BG of the red organic EL device 10R and the green organic EL device 10G is performed, and thereby the red light emitting layer 16BR and the green light emitting layer 16BG are formed.

Procedure for forming the hole transport layer 16BB of the blue organic EL device 10B After the red light emitting layer 16BR and the green light emitting layer 16BG are formed, as illustrated in FIG. 6B, the hole transport layer 16BB made of the foregoing low molecular material is formed on the hole injection layer 16AB for the blue organic light EL device 10B (Step S107). The hole transport layer 16BB is formed by a coating method such as spin coat method or droplet discharge method. In particular, since there is a necessity to selectively dispose the formation material of the hole transport layer 16BB within the region surrounded by the upper partition wall 15B, inkjet method that is a droplet discharge method, or nozzle coat method is preferably used.

Specifically, a solution or a dispersion liquid of the low polymer material that is the formation material of the hole transport layer 16BB is disposed on the exposed surface of the hole injection layer 16AB by, for example, inkjet method. Then, heat treatment by a similar method and under similar conditions as the heat treatment (drying treatment) described in the foregoing procedure for forming the hole transport layers 16BR and 16BG of the red organic EL device 10R and the green organic EL device 10G is performed, and thereby the hole transport layer 16BB is formed.

Procedure Sequence

The procedure for forming the hole transport layers 16BR and 16BG of the red organic EL device 10R and the green organic EL device 10G, the procedure for forming the hole transport layer 16BB of the blue organic EL device 10B, and the procedure for forming the red light emitting layer 16CR and the green light emitting layer 16CG may be performed in any sequence. However, at least, the base on which the layers to be formed are developed is formed first, and it is a necessity that the heating procedure of each heating and drying procedure has already been performed. In addition, it is a necessity that coating is performed such that the temperature during the heating procedure is at least equal to or lower than the temperature of the preceding procedure. For example, in the case where the heating temperature for the red light emitting layer 16CR and the green light emitting layer 16CG is 130 deg C., and the heating temperature for the hole transport layer 16BB for the blue organic EL device 10B is the same 130 deg C., coating for the red light emitting layer 16CR and the green light emitting layer 16CG is performed, and without the coating being dried, coating for the hole transport layer 16BB for the blue organic EL device 10B is subsequently performed. Then, the drying and heating procedures for the red light emitting layer 16CR, the green light emitting layer 16CG, and the hole transport layer 16BB for the blue organic EL device 10B may be performed.

Further, in each of the foregoing procedures, it is preferable that drying and heating are performed separately as separate procedures. A reason for this is, since the wet film that has been applied is very fluid, film unevenness easily occurs. A preferred drying procedure is a method in which uniform vacuum drying is performed under normal pressure, and further, drying is preferably performed without applying wind and the like during drying. In the heating procedure, the solvent has evaporated to a certain degree and fluidity has decreased, forming a hardened film. From this state, heat is gradually applied. Thereby, minute amount of remaining solvent is able to be removed, and the light emitting materials and the material of the hole transport layer are able to be rearranged on a molecular level.

Procedure for Forming the Common Hole Transport Layer 16D

After the hole transport layer 16BB for the blue organic EL device 10B, and the red light emitting layer 16CR and the green light emitting layer 16CG are formed, as illustrated in FIG. 6C, the common hole transport layer 16D made of the foregoing low molecular material is formed as a common layer over the entire surfaces of the red light emitting layer 16CR, the green light emitting layer 16CG, and the hole transport layer 16BB for the blue organic EL device 10B by an evaporation method (Step S108).

Procedure for Forming the Blue Light Emitting Layer 16CB

After the common hole transport layer 16D is formed, as illustrated in FIG. 6D, the blue light emitting layer 16CB made of the foregoing low molecular material is formed as a common layer over the entire surface of the common hole transport layer 16D by an evaporation method (Step S109).

Procedure for forming the electron transport layer 16E, the electron injection layer 16F, and the upper electrode 17

Figure 7A:
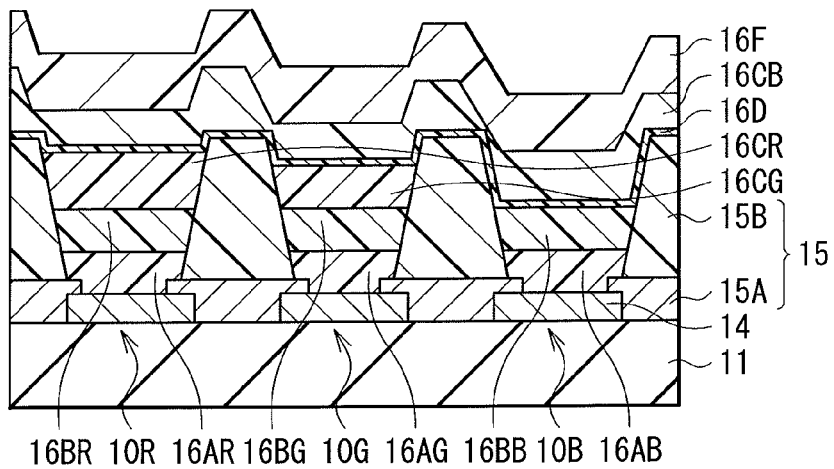
FIGS. 7A to 7C are cross-sectional views illustrating procedures following those in FIGS. 6A to 6D.
Figure 7B:
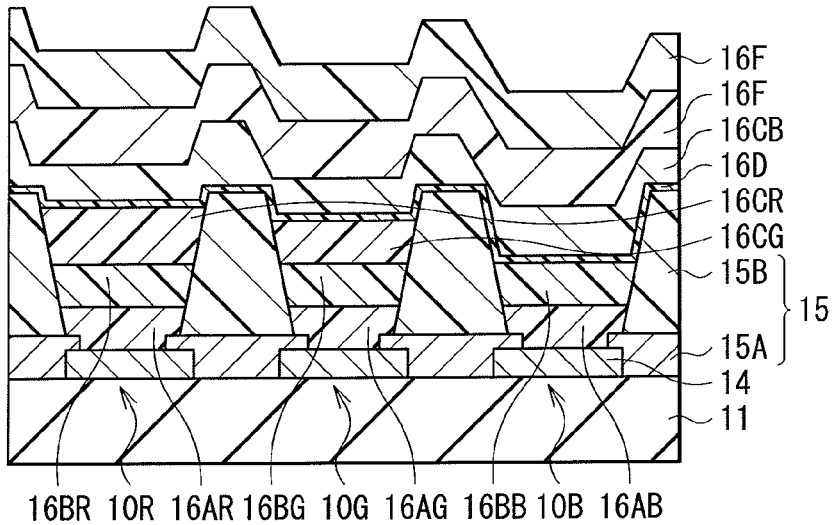
Figure 7C:
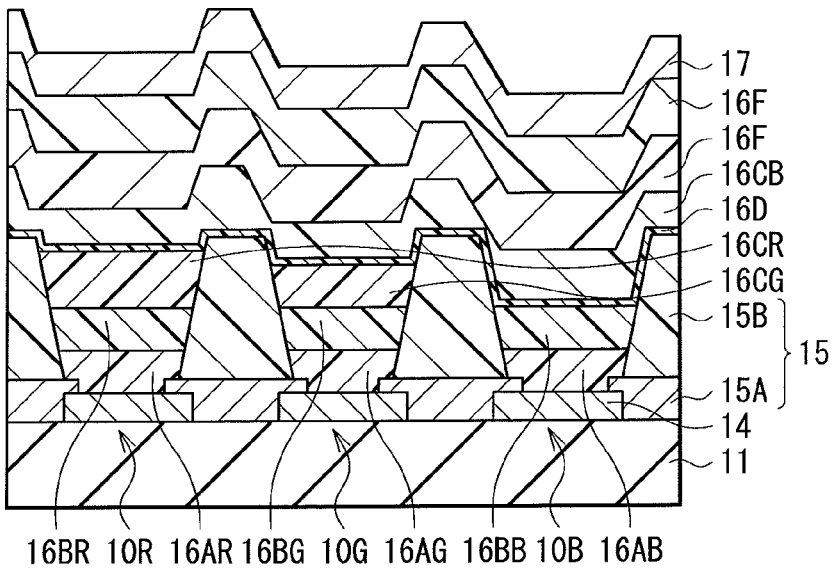

After the blue light emitting layer 16CB is formed, as illustrated in FIG. 7A, FIG. 7B, and FIG. 7C, the electron transport layer 16E, the electron injection layer 16F, and the upper electrode 17 made of the foregoing materials are formed on the entire surface of the blue light emitting layer 16CB by an evaporation method (Steps S110, S111, and S112).

After the upper electrode 17 is formed, as illustrated in FIG. 1, the protective layer 20 is formed by a film formation method having small film-formation particle energy to a degree that the base is not affected, such as the evaporation method or the CVD method. For example, in the case where a protective layer 20 made of amorphous silicon nitride is formed, the protective layer 20 is formed to have a film thickness of 2 μm to 3 μm, both inclusive, by the CVD method. At this time, to prevent reduction in luminance caused by deterioration of the organic layer 16, the film formation temperature is preferably set to room temperature, and film formation is preferably performed under conditions applying minimum stress to the film to prevent the protective layer 20 from peeling.

The common hole transport layer 16D, the blue light emitting layer 16CB, the electron transport layer 16E, the electron injection layer 16F, the upper electrode 17, and the protective layer 20 are formed as solid films over the entire surface without use of a mask. Further, formation of the common hole transport layer 16D, the blue light emitting layer 16CB, the electron transport layer 16E, the electron injection layer 16F, the upper electrode 17, and the protective layer 20 is preferably performed continuously within the same film formation device without being exposed to atmosphere. Thereby, deterioration of the organic layer 16 caused by moisture in the atmosphere is prevented.

In the case where an auxiliary electrode (not illustrated) is formed in the same procedure as that for the lower electrode 14, the organic layer 16 formed as a solid film on the upper section of the auxiliary electrode may be removed by a technique such as laser ablation before the upper electrode 17 is formed. Thereby, the upper electrode 17 is able to be directly connected to the auxiliary electrode, and contact is improved.

After the protective layer 20 is formed, for example, the light blocking film made of the foregoing material is formed on the sealing substrate 40 made of the foregoing material. Next, the sealing substrate 40 is coated with the material for the red filter (not illustrated) by spin coat or the like, and the resultant is patterned by photolithography technology and fired. Thereby, the red filter is formed. Subsequently, the blue filter (not illustrated) and the green filter (not illustrated) are sequentially formed in a manner similar to that of the red filter (not illustrated).

Then, the adhesive layer (not illustrated) is formed on the protective layer 20. The sealing substrate 40 and the protective layer 20 are bonded with the adhesive layer in between. Accordingly, the display unit illustrated in FIG. 1 to FIG. 3 is completed.

In the display unit, the scanning signal is supplied from the scanning line drive circuit 130 to each pixel through the gate electrode of the writing transistor Tr2, and the image signal from the signal line drive circuit 120 is retained in the retentive capacity Cs through the writing transistor Tr2. That is, the drive transistor Tr1 is on-off controlled according to the signal retained in the retentive capacity Cs, and thereby a drive current Id is injected into the red organic EL device 10R, the green organic EL device 10G, and the blue organic EL device 10B. In the result, electron-hole recombination is generated to initiate light emission. After that, in the case of bottom emission, the light passes through the lower electrode 14 and the substrate 11, and is extracted. In the case of top emission, the light passes through the upper electrode 17, the color filter (not illustrated), and the sealing substrate 40, and is extracted.

In this case, in the case where the blue light emitting layer 16CB is provided directly on the blue hole transport layer 16BB formed by the coating method used in the past as described above, the intended characteristics of the blue light emitting layer 16CB has not been obtained for the following reasons. First, as a first reason, the reduction of hole injection characteristics resulting from moisture, residual solvent, and the like that are mixed during formation of the blue hole transport layer 16BB by the coating method is given. As a second reason, deterioration caused by interface contamination and the like since the blue hole transport layer 16BB is formed under an atmosphere environment is given.

In the organic EL display unit according to the present embodiment, the common hole transport layer 16D made of a low molecular material is formed on the blue hole transport layer 16BB by the evaporation method. Therefore, contamination by moisture within the atmosphere and the like are inhibited, and interface with the blue light emitting layer 16CB is improved. In the result, efficiency of hole injection into the blue light emitting layer 16CB is improved, and values close to the intended characteristics of the blue light emitting layer 16CB are able to be obtained.

Since the common hole transport layer 16D is formed by the evaporation method, the common hole transport layer 16D is formed on the red light emitting layer 16CR and the green light emitting layer 16CG as well. In the result, the red light emitting layer 16CR and the green light emitting layer 16CG are layered with the blue light emitting layer 16CB with the common hole transport layer 16D in between. The common hole transport layer 16D generally indicates electron blocking on the red light emitting layer 16CR and the green light emitting layer 16CG, thereby electron injection characteristics to the red light emitting layer 16CR and the green light emitting layer 16CG deteriorates. Further, as in the past, in the case where the red light emitting layer 16CR and the green light emitting layer 16CG are made of only polymer materials, hole transport capability decreases since the difference in energy levels with the common hole transport layer 16D composed of a low molecular material is large. Therefore, the electrons and holes injected into the red light emitting layer 16CR and the green light emitting layer 16CG become insufficient, thereby the drive voltage increases and emission efficiency decreases. Further, since injection of holes and electrons is not performed appropriately, when the red organic EL device 10R or the green organic EL device 10G emits light, an issue arose in that light emission was accompanied by blue light emission having a peak within a range of 430 nm to 500 nm, both inclusive. That is, the chromaticity of the red organic EL device 10R and the green organic EL device 10G changes as a result of the blue light mixing with the red light or the green light. This is a significant issue as a display device configuring a display.

On the contrary, according to the present embodiment, the red light emitting layer 16CR and the green light emitting layer 16CG are formed by a mixture in which a low molecular material is added to the polymer material. Thereby, the difference in energy levels becomes small, and hole transport capability is able to be improved and adjusted appropriately. Further, since the common hole transport layer 16D is formed by a material of the same system (compounds indicated in Formula 1 to Formula 3) as that of the low molecular material added to the red light emitting layer 16CR and the green light emitting layer 16CG, the difference in energy levels of each layer and the like are able to be reduced. Further, since the common hole transport layer 16D is also formed by a material of the same system as that of the material forming the blue light emitting layer 16CB, transport capability of the electrons injected into the red light emitting layer 16CR and the green light emitting layer 16CG through the blue light emitting layer 16CB is also excellent. Thus, the barrier of hole transport characteristics and electron transport characteristics between the red light emitting layer 16CR and the common hole transport layer 16D, and the green light emitting layer 16CG and the common hole transport layer 16D is reduced, and the foregoing issues of drive voltage and emission efficiency are solved. Further, since the emission of blue light during light emission from the red organic EL device 10R or the green organic EL device 10G is suppressed, chromaticity change in the red organic EL device 10R and the green organic EL device 10G is inhibited. That is, a red organic EL device 10R and a green organic EL device 10G capable of being used as a display device is able to be provided.

In this way, according to the present embodiment, since the common hole transport layer 16D made of a low molecular material is formed over the entire surfaces of the blue hole transport layer 16BB, the red light emitting layer 16CR, and the green light emitting layer 16CG by the evaporation method, the interface of the blue light emitting layer 16CB is improved. In the result, efficiency of hole injection into the blue light emitting layer 16CB is able to be improved, and values close to the intended characteristics of the blue light emitting layer 16CB are able to be obtained. That is, since emission efficiency and life characteristics of the blue organic EL device 10B are improved, further higher emission efficiency and longer life of a color organic EL display unit configured by the red organic EL devices 10R, the green organic EL devices 10G, and the blue organic EL devices 10B being formed in an arrangement are able to be obtained.

Second Embodiment

Elements that are the same as those of the first embodiment are given the same referential symbols, and descriptions thereof are omitted. A configuration of an organic EL display unit according to the second embodiment of the present invention will not be illustrated. However, in a manner similar to the first embodiment, for example, a display region is formed in which a plurality of red organic EL devices 20R, green organic EL devices 20G, and blue organic EL devices 20B are arranged in matrix is formed on the substrate 11. A pixel drive circuit is provided within the display region.

In addition, in the display region, the red organic EL devices 20R that generate red light, the green organic EL devices 20G that generate green light, and the blue organic EL devices 20B that generate blue light are sequentially arranged to form a matrix as a whole. A combination of adjacent red organic EL device 20R, green organic EL device 20G, and blue organic EL device 20B compose a single pixel.

In a manner similar to the first embodiment, a signal line drive circuit and a scanning line drive circuit that are drivers for picture display are provided in the periphery of the display region.

Figure 8:
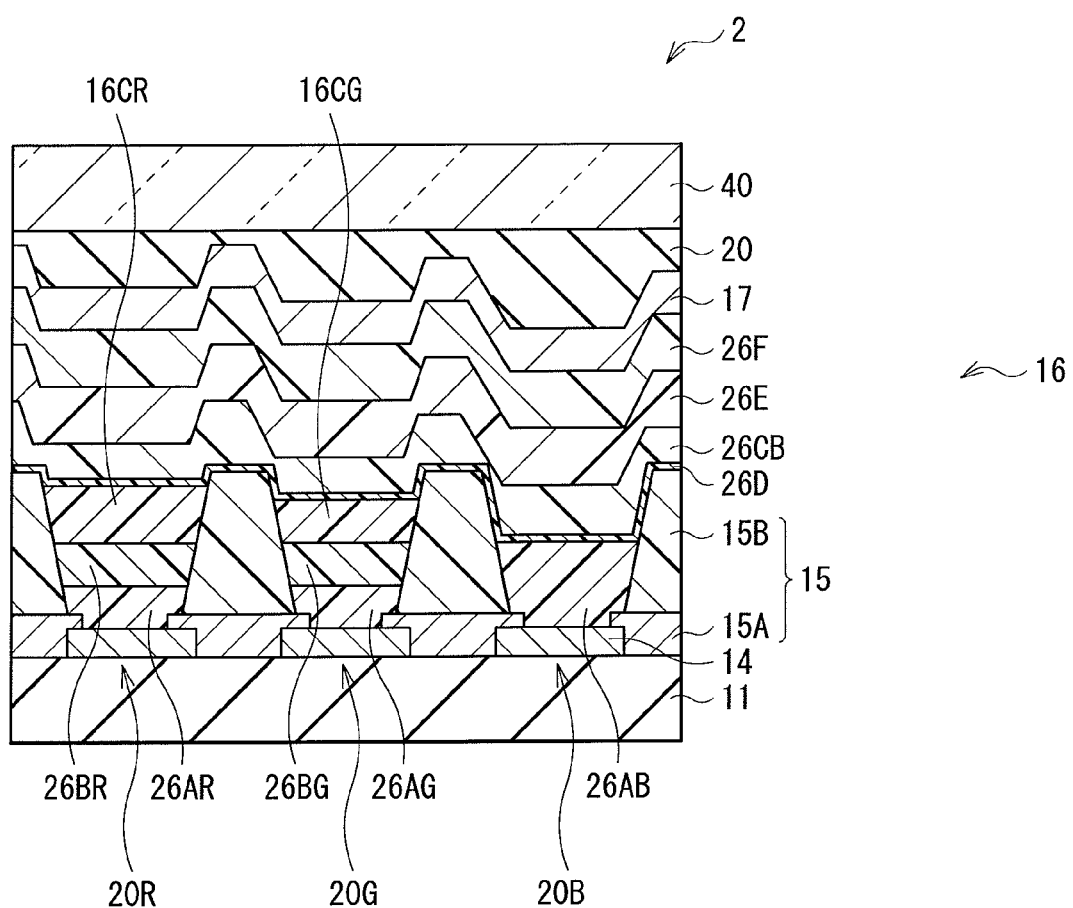
FIG. 8 is a cross-sectional view illustrating a configuration of an organic EL display unit according to a second embodiment of the present invention.

FIG. 8 illustrates a cross-sectional configuration of the display region of the organic EL display unit according to the second embodiment. In a manner similar to that according to the first embodiment, the red organic EL device 20R, the green organic EL device 20G, and the blue organic EL device 20B each have a structure in which, the lower electrode 14 as an anode, the partition wall 15, an organic layer 26 including a light emitting layer 26C, described hereinafter, and the upper electrode 17 as a cathode are layered in sequence from the substrate 11 side, with a drive transistor Tr1 of the pixel drive circuit and a planarizing insulating film (not illustrated) in between. The substrate 11, the lower electrode 14, the partition wall 15, the upper electrode 17, the protective layer 30, and the sealing substrate 40, excluding the organic layer 26, have structures similar to those according to the first embodiment.

In a manner similar to that of the red organic EL device 10R according to the first embodiment, the organic layer 26 of the red organic EL device 20R has, for example, a structure in which a hole injection layer 26AR, a hole transport layer 26BR, a red light emitting layer 26CR, a common hole transport layer (second hole injection/transport layer) 26D, a blue light emitting layer 26CB, an electron transport layer 26E, and an electron injection layer 26F are layered in sequence from the lower electrode 14 side. In a manner similar to that of the green organic EL device 20G according to the first embodiment, the organic layer 26 of the green organic EL device 20G has, for example, a structure in which a hole injection layer 26AG, a hole transport layer 26BG, a green light emitting layer 26CG, the common hole transport layer 26D, the blue light emitting layer 26CB, the electron transport layer 26E, and the electron injection layer 26F are layered in sequence from the lower electrode 14 side. The organic layer 26 of the blue organic EL device 20B has, for example, a structure in which a hole injection layer 26AB, the common hole transport layer 26D, the blue light emitting layer 26CB, the electron transport layer 26E, and the electron injection layer 26F are layered in sequence from the lower electrode 14 side, and differs from that according to the first embodiment in that a blue hole transport layer is not provided. Specially, the common electron hole transport layer 26D, the blue light emitting layer 26CB, the electron transport layer 26E, and the electron injection layer 26F are provided as common layers of the red organic EL device 20R, the green organic EL device 20G, and the blue organic EL device 20B.

In addition to the effects according to the first embodiment, in the organic EL display unit according to the present embodiment, life characteristics of the blue organic EL device 20B is able to be further improved. In addition, as a result of the common hole transport layer 26D being provided directly on the hole injection layer 20AB of the blue organic EL device 26B, the number of manufacturing process is able to be reduced, and cost is able to be reduced.

MODULE AND APPLICATION EXAMPLES

A description will be given of application examples of the organic EL display unit described in the foregoing embodiments. The organic EL display unit of the foregoing embodiments is applicable to a display unit of an electronic device in any field for displaying a picture signal inputted from outside or a picture signal generated inside as an image or a picture, such as a television device, a digital camera, a notebook personal computer, a portable terminal device such as a mobile phone, and a video camera.

Module

Figure 9:
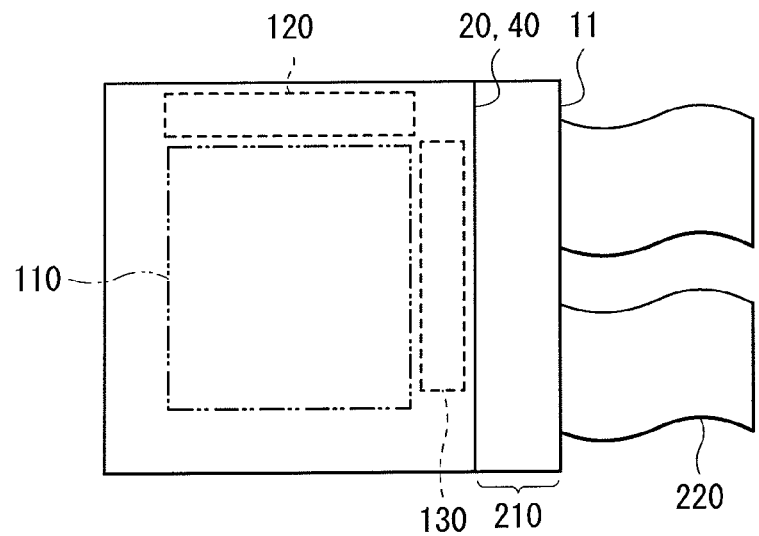
FIG. 9 is a plan view illustrating a schematic configuration of a module including the display unit according to the foregoing embodiments.

The organic EL display unit of the foregoing embodiments is incorporated in various electronic devices such as after-mentioned first to fifth application examples as a module as illustrated in FIG. 9, for example. In the module, for example, a region 210 exposed from the protective layer 30 and the sealing substrate 40 is provided on a side of the substrate 11, and an external connection terminal (not illustrated) is formed in the exposed region 210 by extending the wirings of the signal line drive circuit 120 and the scanning line drive circuit 130. The external connection terminal may be provided with a Flexible Printed Circuit (FPC) 220 for inputting and outputting a signal.

First Application Example

Figure 10:
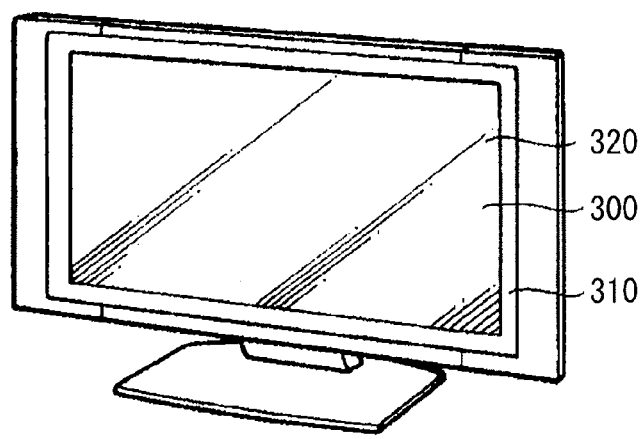
FIG. 10 is a perspective view illustrating an appearance of a first application example of the display unit according to the foregoing embodiments.

FIG. 10 is an appearance of a television device to which the organic EL display unit of the foregoing embodiments is applied. The television device has, for example, a picture display screen section 300 including a front panel 310 and a filter glass 320. The picture display screen section 300 is composed of the organic EL display unit according to the foregoing embodiments.

Second Application Example

Figure 11A:
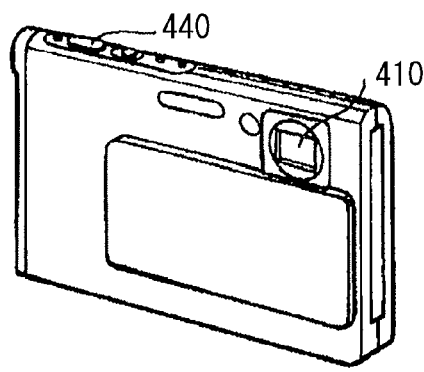
FIG. 11A is a perspective view illustrating an appearance viewed from the front side of a second application example.
Figure 11B:
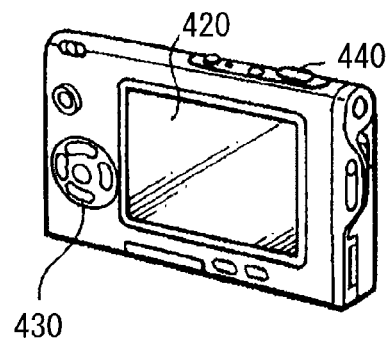
FIG. 11B is a perspective view illustrating an appearance viewed from the rear side of the second application example.

FIGS. 11A and 11B are an appearance of a digital camera to which the display unit of the foregoing embodiments is applied. The digital camera has, for example, a light emitting section for a flash 410, a display section 420, a menu switch 430, and a shutter button 440. The display section 420 is composed of the organic EL display unit according to the foregoing embodiments.

Third Application Example

Figure 12:
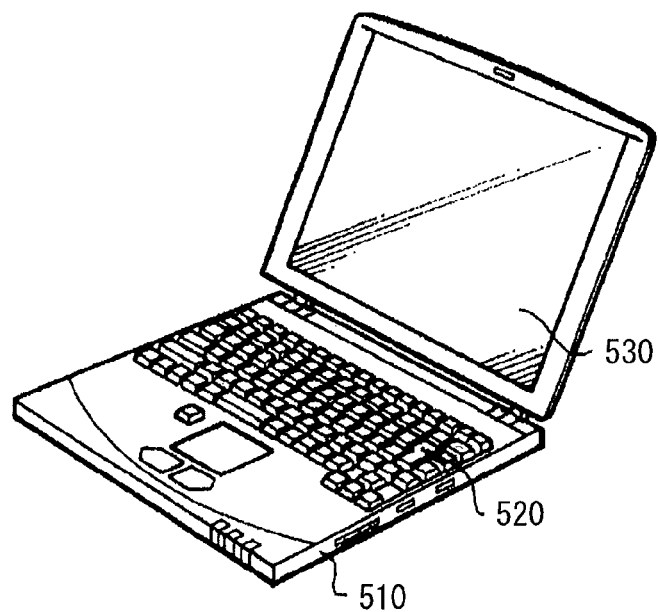
FIG. 12 is a perspective view illustrating an appearance of a third application example.

FIG. 12 is an appearance of a notebook personal computer to which the display unit of the foregoing embodiments is applied. The notebook personal computer has, for example, a main body 510, a keyboard 520 for operation of inputting characters and the like, and a display section 530 for displaying an image. The display section 530 is composed of the organic EL display unit according to the foregoing embodiments.

Fourth Application Example

Figure 13:
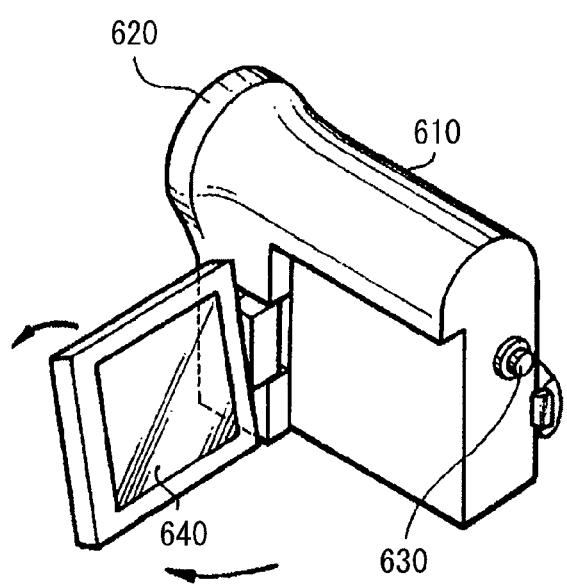
FIG. 13 is a perspective view illustrating an appearance of a fourth application example.
Figure 14:
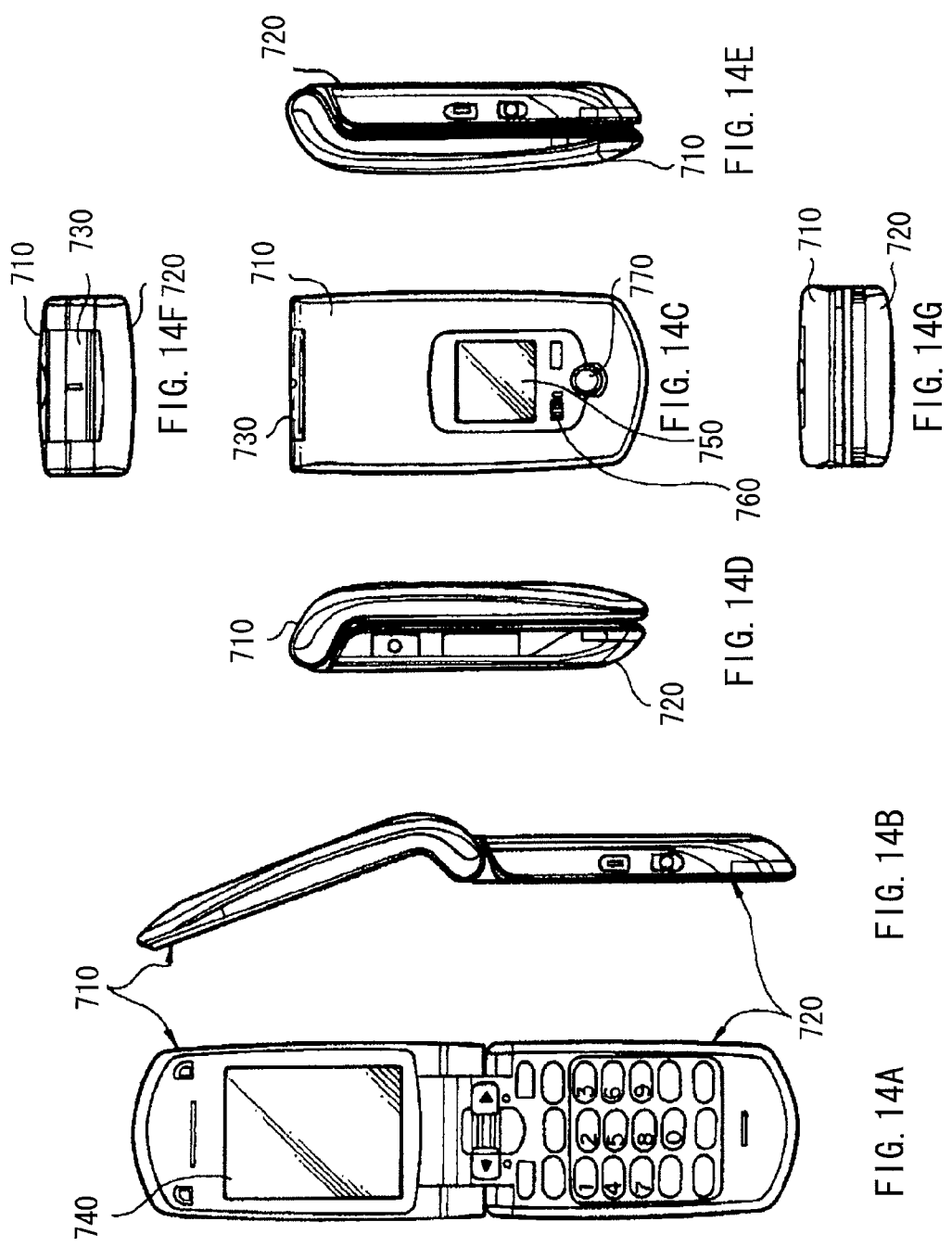
FIG. 14A is an elevation view of a fifth application example in an opened state.
FIG. 14B is a side view thereof.
FIG. 14C is an elevation view of the fifth application example in a closed state.
FIG. 14D is a left side view thereof.
FIG. 14E is a right side view thereof.
FIG. 14F is a top view thereof.
FIG. 14G is a bottom view thereof.

FIG. 13 is an appearance of a video camera to which the organic EL display unit of the foregoing embodiments is applied. The video camera has, for example, a main body 610, a lens for shooting an object 620 provided on the front side face of the main body 610, a start/stop switch in shooting 630, and a display section 640. The display section 640 is composed of the organic EL display unit according to the foregoing embodiments.

Fifth Application Example

FIGS. 14A to 14G are an appearance of a mobile phone to which the organic EL display unit of the foregoing embodiments is applied. In the mobile phone, for example, an upper package 710 and a lower package 720 are jointed by a joint section (hinge section) 730. The mobile phone has a display 740, a sub-display 750, a picture light 760, and a camera 770. The display 740 or the sub-display 750 is composed of the organic EL display unit according to the foregoing embodiments.

Further, a description will be given of specific examples of the invention. Examples 1 to 6 are examples corresponding to the first embodiment, in which the blue organic EL device 10B has the hole transport layer 16BB on the hole injection layer 16AB. Example 7 is an example corresponding to the second embodiment, in which the blue organic EL device 20B does not have a hole transport layer and the common hole transport layer 26D is provided on the hole injection layer 26AB.

First, to confirm the improvement in transport characteristics of the holes and the electrons to the red light emitting layer 16CR or the green light emitting layer 16CG from the common hole transport layer 16D as a result of formation of the common hole transport layer 16D and the addition of the low molecular material to the red light emitting layer 16CR and the green light emitting layer 16CG, the following experiment was performed.

A "hole only device" that injects only the holes was formed, and the drive voltage thereof was measured. First, the drive voltage of the hole only device that is not provided with the common hole transport layer 16D and in which a low molecular material has been added to the red light emitting layer 16CR and the green light emitting layer 16CG, dropped by 3 V from that of a device in which a low molecular material has not been added. That is, as a result of the low molecular material being added to the red light emitting layer 16CR and the green light emitting layer 16CG made of a polymer material, increase in drive voltage is able to be inhibited. Thereby, hole transport characteristics have improved. Next, the drive voltage of a hole only device in which the low molecular material has not been added, and the common hole transport layer 16D is formed having a thickness of 1 nm to 20 nm, both inclusive, on the red light emitting layer 16CR and the green light emitting layer 16CG, dropped by 2 V to 4 V, both inclusive, compared to a device in which the common hole transport layer 16D was not provided. From the foregoing, it is inferred that the hole transport characteristics are further improved by the low molecular material being added to the red light emitting layer 16CR and the green light emitting layer 16CG, and the common hole transport layer 16D being provided.

Next, an "electron only device" that injects only electrons was formed, and the drive voltage thereof was measured. First, the drive voltage of the electron only device in which a low molecular material has not been added to the red light emitting layer 16CR and the green light emitting layer 16CG was measured. It became clear that the amount of electrons injected into the red light emitting layer 16CR and the green light emitting layer 16CG changes depending on the thickness of the common hole transport layer 16D, and the drive voltage increases as the thickness of the common hole transport layer 16D increases. Specifically, the drive voltage in the case where the thickness of the common hole transport layer 16D is 10 nm increased by about 0.2 V from the case where the thickness is 1 nm. Further, the drive voltage in the case where the thickness is 20 nm rose by 1.5 V. From the foregoing, it is expected that the function of the common hole transport layer 16D as an electron blocking layer increases as the thickness thereof increases. However, sufficient injection amount of electrons into the red light emitting layer 16CR and the green light emitting layer 16CG is ensured up to a thickness of about 20 nm. Thus, the thickness of the common hole transport layer 16D is preferably within a range of 1 nm to 20 nm, both inclusive, and more preferably 1 nm to 10 nm, both inclusive.

Next, the drive voltage in an electron only device having the common electrode transport layer 16D on the red light emitting layer 16CR and the green light emitting layer 16CG, and in which a low molecular material has been added to a polymer composing the red light emitting layer 16CR and the green light emitting layer 16CG at a ratio of 2:1 (polymer material to low molecular material) was measured. As a result of the measurement, the drive voltage dropped by 1.5 V compared to the electron only device in which the low molecular material has not been added. From the foregoing, it was confirmed that the electron injection characteristics further improve by the low molecular material being added to the red light emitting layer 16CR and the green light emitting layer 16CG, and the common hole transport layer 16D being formed on the red light emitting layer 16CR and the green light emitting layer 16CG.

From the foregoing results, it is clear that the transport characteristics of the holes and the electrons to the red light emitting layer 16CR and the green light emitting layer 16CG improve as a result of the common hole transport layer 16D being formed, and the low molecular material being added to the red light emitting layer 16CR and the green light emitting layer 16CG.

Based on the foregoing results, with the film thickness of the common hole transport layer 16D in Examples 1 to 7 set to 1 nm to 10 nm, both inclusive, life, emission efficiency, and the like of each organic EL device 10R, 10G, and 10B at each film thickness was measured.

Examples 1 to 6

The red organic EL device 10R, the green organic EL device 10G, and the blue organic EL device 10 were each formed using a 25 mm×25 mm substrate 11.

First, a glass substrate (25 mm×25 mm) was prepared as the substrate 11. On the substrate 11, a two-layer structure including a silver alloy layer composed of an Ag—Pd—Cu alloy with at thickness of 120 nm and a transparent conductive film composed of ITO with a thickness of 10 nm was formed as the lower electrode 14 (Step S101).

Next, after the lower electrode 14 was coated with ND 1501 (polyaniline manufactured by Nissan Chemical Industries, Ltd.) with a thickness of 15 nm by spin coat method in atmosphere, as the hole injection layers 16AR, 16AG, and 16AB, the resultant was thermally cured on a hotplate for 30 minutes at 220 deg C. (Step S104).

Then, in a $N_2$ atmosphere (dew point of −60 deg C. and oxygen concentration of 10 ppm), the hole injection layers 16AR and 16AG were coated with a polymer (polyvinyl carbazole) indicated in Formula 6 by spin coat method, as the hole transport layers 16BR and 16BG. The thickness of the hole transport layer 16BR for the red organic EL device 10R was 150 nm, and the thickness of the hole transport layer 16BG for the green organic EL device 10G was 20 nm. Then, in a $N_2$ atmosphere (dew point of −60 deg C. and oxygen concentration of 10 ppm), the resultant was thermally cured on a hotplate for 60 minutes at 180 deg C. (Step S105).

Formula 6

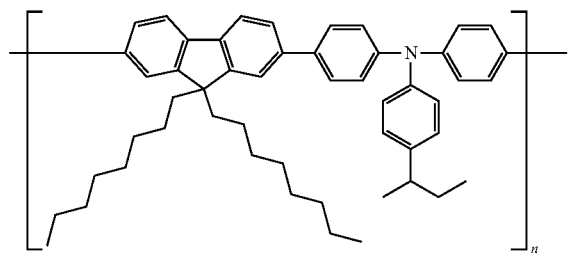

(6)

After the hole transport layers 16BR and 16BG were formed, a mixture in which a low molecular material such as that indicated in Formula (2-38) is mixed in a fluorenone polyarylene material having benzothiadiazole in a block at a weight ratio of 2:1 (fluorenone polyarylene material to low molecular material) was dissolved in xylene, and the hole transport layer 16BR of the red organic EL element 10R was coated with the resultant to a thickness of 80 nm by spin coat method, as the red light emitting layer 16CR. In addition, a mixture material in which a low molecular material such as that indicated in Formula (2-38) is mixed in a fluorenone polyarylene material having anthracene in a block at a weight ratio of 2:1 (fluorenone polyarylene material to low molecular material) was dissolved in xylene, and the hole transport layer 16BG of the green organic EL device 10G was coated with the resultant to a thickness of 80 nm by spin coat method, as the green light emitting layer 16CG. Then, in a $N_2$ atmosphere, (dew point of −60 deg C. and oxygen concentration of 10 ppm), the resultant was thermoset on a hotplate for 10 minutes at 130 deg C. (Step S106).

After the red light emitting layer 16CR and the green light emitting layer 16CG were formed, the hole injection layer 16AB for the blue organic EL device 10B was coated with, for example, the low molecular material indicated in Formula (2-66) to a thickness of 50 nm by spin coat method, as the hole transport layer 16BB. Then, in a $N_2$ atmosphere, (dew point of −60 deg C. and oxygen concentration of 10 ppm), the resultant was heated on a hotplate for 60 minutes at 100 deg C. (Step S107).

After the hole transport layer 16BB was formed, the substrate 11 for the red organic EL device 10R on which layers up to the red light emitting layer 16CR have been formed, the substrate 11 for the green organic EL device 10G on which layers up to the green light emitting layer 16CG have been formed, and the substrate 11 for the blue organic EL device 10B on which layers up to the hole transport layer 16BB have been formed, were moved to a vacuum evaporation device, and the common hole transport layer 16D and subsequent layers were deposited.

First, as the common hole transport layer 16D, for example, the low molecular material indicated in Formula (2-66) was deposited to a thickness of 1 nm, 2 nm, 5 nm, and 10 nm, respectively (Step S108). Next, as the blue light emitting layer 16CB, AND (9,10-di(2-naphthyl)anthracene) indicated in Formula (5-20) and a blue dopant indicated in Formula 7 were co-deposited at a weight ratio of 95:5 (Step S109).

Formula 7

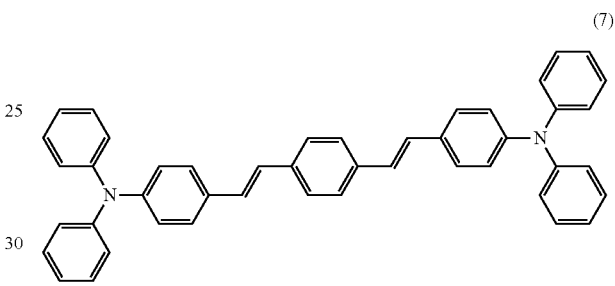

(7)

After the blue light emitting layer 16CB was formed, as the electron transport layer 16E, Alq3(8-hydroxyquinoline aluminum) indicated in Formula 8 was deposited to a thickness of 15 nm by vacuum evaporation method (Step S110). Next, by the same evaporation method, a LiF film was formed with a thickness of 0.3 nm as the electron injection layer 16F (Step S111), and Mg—Ag was formed with a thickness of 10 nm as the upper electrode 17 (Step S112). Finally, the protective layer 20 made of SiN was formed by CVD method, and solid sealing was performed using transparent resin. As a result of combining the red organic EL devices 10R, the green organic EL devices 10G, and the blue organic EL devices 10B obtained in this way, a full color organic EL display unit (Examples 1-1 to 6-4) was obtained.

Formula 8

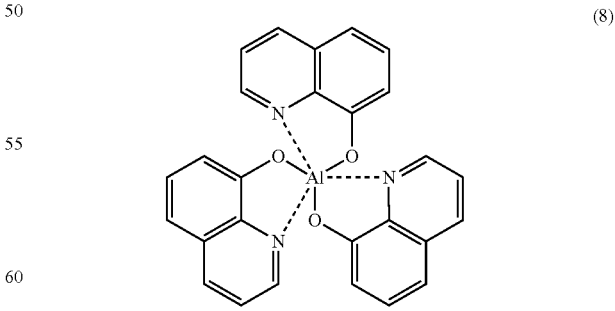

(8)

Example 7

In each of the red organic EL device 20R, the green organic EL device 20G, and the blue organic EL device 20B, in a manner similar to that in Example 1, a two-layer structure including a silver alloy layer composed of Ag—Pd—Cu with a thickness of 120 nm and a transparent conductive film composed of ITO with a thickness of 10 nm was formed on the 25 mm×25 mm substrate 11 as the lower electrode 14 (Step S101).

Next, after the lower electrode 14 was coated with ND 1501 (polyaniline manufactured by Nissan Chemical Industries, Ltd.) with a thickness of 65 nm by spin coat method in atmosphere, as the hole injection layers 26AR, 26AG, and 26AB, the resultant was thermally cured on a hotplate for 30 minutes at 220 deg C. (Step S104).

Then, in a manner similar to that of Example 1, in a $N_2$ atmosphere (dew point of −60 deg C. and oxygen concentration of 10 ppm), the hole injection layers 26AR and 26AG were coated with a polymer (polyvinyl carbazole) indicated in Formula 6 by spin coat method, as the hole transport layers 26BR and 26BG. The thickness of the hole transport layer 26BR for the red organic EL device 20R is 150 nm, and the thickness of the hole transport layer 26BG for the green organic EL device 20G is 20 nm. Then, in a $N_2$ atmosphere (dew point of −60 deg C. and oxygen concentration of 10 ppm), the resultant was thermally cured on a hotplate for 60 minutes at 130 deg C. (Step S105).

After the hole transport layers 26BR and 26BG were formed, a mixture in which a low molecular material such as that indicated in Formula (2-38) is mixed in a fluorenone polyarylene material having benzothiadiazole in a block at a weight ratio of 2:1 (fluorenone polyarylene material to low molecular material) was dissolved in xylene, and the hole transport layer 26BR of the red organic EL element 20R was coated with the resultant to a thickness of 80 nm by spin coat method, as the red light emitting layer 26CR. In addition, a mixture material in which a low molecular material such as that indicated in Formula (2-38) is mixed in a fluorenone polyarylene material having anthracene in a block at a weight ratio of 2:1 (fluorenone polyarylene material to low molecular material) was dissolved in xylene, and the hole transport layer 26BG of the green organic EL device 20G was coated with the resultant to a thickness of 80 nm by spin coat method, as the green light emitting layer 26CG. Then, in a $N_2$ atmosphere, (dew point of −60 deg C. and oxygen concentration of 10 ppm), the resultant was thermally cured on a hotplate for 10 minutes at 130 deg C. (Step S106).

Then, the substrate 11 for the red organic EL device 20R on which layers up to the red light emitting layer 26CR have been formed, the substrate 11 for the green organic EL device 20G on which layers up to the green light emitting layer 26CG have been formed, and the substrate 11 for the blue organic EL device 20B on which layers up to the hole injection layer 26AB have been formed, were moved to a vacuum evaporation device, and the common hole transport layer 26D and subsequent layers were deposited.

First, as the common hole transport layer 26D, for example, the low molecular material indicated in Formula (2-66) was deposited on the entire surfaces of the red light emitting layer 26CR, the green light emitting layer 26CG, and the blue hole injection layer 26AB, to a thickness of 5 nm and 10 nm, respectively. Next, as the blue light emitting layer 26CB, AND (9,10-di(2-naphthyl)anthracene) indicated in Formula (5-20) and a blue dopant indicated in Formula 7 were co-deposited at a weight ratio of 95:5 (Step S108).

After the blue light emitting layer 26CB was formed, in a manner similar to that in Example 1, the electron transport layer 26E, the electron injection layer 26F, and the upper electrode 17 were formed (Steps S109 to S111). Finally, the protective layer 20 made of SiN was formed by CVD method, and solid sealing was performed using transparent resin. As a result of combining the red organic EL devices 20R, the green organic EL devices 20G, and the blue organic EL devices 20B obtained in this way, a full color organic EL display unit (Example 7) was obtained.

Regarding the red organic EL devices 10R and 20R, the green organic EL devices 10G and 20G, and the green organic EL device 10B and 20B of the organic EL display units formed as Examples 1 to 7, luminance half-life time (life) when driven by a constant current with a current density of 100 mA/cm$^2$ was respectively measured. In addition, drive voltage (V), emission efficiency (cd/A), and chromaticity during drive with a current density of 10 mA/cm$^2$ were measured. A list of the compositions of Examples 1-1 to 6-4 and Example 7 are indicated in Table 1. Further, the results of the foregoing measurements are indicated in Tables 2 to 14.

TABLE 1

| | Common hole transport layer | | Blue organic EL device | Green organic EL device | Red organic EL device |
|---|---|---|---|---|---|
| | Material | Thickness (nm) | Hole transport layer | Light emitting layer | Low molecular material of light transmitting layer | Low molecular material of light transmitting layer |
| Example 1-1 | Formula (2-66) | 1 | Formula (2-66) | AND | Formula (2-38) | Formula (2-38) |
| Example 1-2 | Formula (2-66) | 2 | Formula (2-66) | AND | Formula (2-38) | Formula (2-38) |
| Example 1-3 | Formula (2-66) | 5 | Formula (2-66) | AND | Formula (2-38) | Formula (2-38) |
| Example 1-4 | Formula (2-66) | 10 | Formula (2-66) | AND | Formula (2-38) | Formula (2-38) |
| Example 2-1 | Formula (2-6) | 1 | Formula (2-6) | AND | Formula (2-6) | Formula (2-6) |
| Example 2-2 | Formula (2-6) | 2 | Formula (2-6) | AND | Formula (2-6) | Formula (2-6) |
| Example 2-3 | Formula (2-6) | 5 | Formula (2-6) | AND | Formula (2-6) | Formula (2-6) |
| Example 2-4 | Formula (2-6) | 10 | Formula (2-6) | AND | Formula (2-6) | Formula (2-6) |
| Example 3-1 | Formula (2-6) | 1 | Formula (2-38) | AND | Formula (2-6) | Formula (2-6) |
| Example 3-2 | Formula (2-6) | 2 | Formula (2-38) | AND | Formula (2-6) | Formula (2-6) |
| Example 3-3 | Formula (2-6) | 5 | Formula (2-38) | AND | Formula (2-6) | Formula (2-6) |
| Example 3-4 | Formula (2-6) | 10 | Formula (2-38) | AND | Formula (2-6) | Formula (2-6) |
| Example 4-1 | Formula (3-33) | 1 | Formula (3-13) | AND | Formula (3-13) | Formula (3-13) |
| Example 4-2 | Formula (3-33) | 2 | Formula (3-13) | AND | Formula (3-13) | Formula (3-13) |
| Example 4-3 | Formula (3-33) | 5 | Formula (3-13) | AND | Formula (3-13) | Formula (3-13) |
| Example 4-4 | Formula (3-33) | 10 | Formula (3-13) | AND | Formula (3-13) | Formula (3-13) |

TABLE 1-continued

|  | Common hole transport layer | | Blue organic EL device | | Green organic EL device | Red organic EL device |
|---|---|---|---|---|---|---|
|  | Material | Thickness (nm) | Hole transport layer | Light emitting layer | Low molecular material of light transmitting layer | Low molecular material of light transmitting layer |
| Example 5-1 | Formula (2-61) | 1 | Formula (3-17) | AND | Formula (3-22) | Formula (3-22) |
| Example 5-2 | Formula (2-61) | 2 | Formula (3-17) | AND | Formula (3-22) | Formula (3-22) |
| Example 5-3 | Formula (2-61) | 5 | Formula (3-17) | AND | Formula (3-22) | Formula (3-22) |
| Example 5-4 | Formula (2-61) | 10 | Formula (3-17) | AND | Formula (3-22) | Formula (3-22) |
| Example 6-1 | Formula (2-45) | 1 | Formula (2-14) | AND | Formula (2-38) | Formula (3-7) |
| Example 6-2 | Formula (2-45) | 2 | Formula (2-14) | AND | Formula (2-38) | Formula (3-7) |
| Example 6-3 | Formula (2-45) | 5 | Formula (2-14) | AND | Formula (2-38) | Formula (3-7) |
| Example 6-4 | Formula (2-45) | 10 | Formula (2-14) | AND | Formula (2-38) | Formula (3-7) |
| Example 7-1 | Formula (2-6) | 5 | — | AND | — | — |
| Example 7-2 | Formula (2-6) | 10 | — | AND | — | — |
| Reference example 1 | — | — | Formula (2-66) | AND | Formula (2-38) | Formula (2-38) |
| Reference example 2 | — | — | Formula (2-6) | AND | Formula (2-6) | Formula (2-6) |
| Reference example 3 | — | — | Formula (2-38) | AND | Formula (2-6) | Formula (2-6) |
| Reference example 4 | — | — | Formula (3-13) | AND | Formula (3-13) | Formula (3-13) |
| Reference example 5 | — | — | Formula (3-17) | AND | Formula (3-22) | Formula (3-22) |
| Reference example 6 | — | — | Formula (2-14) | AND | Formula (2-38) | Formula (3-7) |
| Reference example 7 | Formula (2-6) | 5 | Formula (2-66) | AND | — | — |
| Reference example 8 | Formula (2-6) | 10 | Formula (2-66) | AND | — | — |

TABLE 2

|  | Luminance half-life time | | |
|---|---|---|---|
|  | Blue organic EL device | Green organic EL device | Red organic EL device |
| Reference example 1 | 240 h | 300 h | 200 h |
| Example 1-1 | 480 h | 300 h | 200 h |
| Example 1-2 | 520 h | 300 h | 200 h |
| Example 1-3 | 530 h | 300 h | 200 h |
| Example 1-4 | 530 h | 300 h | 200 h |

TABLE 4

|  | Luminance half-life time | | |
|---|---|---|---|
|  | Blue organic EL device | Green organic EL device | Red organic EL device |
| Reference example 2 | 230 h | 270 h | 170 h |
| Example 2-1 | 460 h | 270 h | 170 h |
| Example 2-2 | 470 h | 270 h | 170 h |
| Example 2-3 | 475 h | 270 h | 170 h |
| Example 2-4 | 475 h | 270 h | 170 h |

TABLE 3

|  | Blue organic EL device | | | Green organic EL device | | | Red organic EL device | | |
|---|---|---|---|---|---|---|---|---|---|
|  | Emission efficiency (cd/A) | Voltage (V) | Chromaticity | Emission efficiency (cd/A) | Voltage (V) | Chromaticity | Emission efficiency (cd/A) | Voltage (V) | Chromaticity |
| Reference example 1 | 7.2 | 5.3 | 0.15 / 0.15 | 17.0 | 4.8 | 0.26 / 0.65 | 8.4 | 7.1 | 0.67 / 0.32 |
| Example 1-1 | 8.0 | 5.4 | 0.15 / 0.15 | 17.0 | 4.8 | 0.26 / 0.65 | 8.4 | 7.1 | 0.67 / 0.32 |
| Example 1-2 | 8.2 | 5.4 | 0.15 / 0.15 | 17.0 | 4.9 | 0.26 / 0.65 | 8.4 | 7.2 | 0.67 / 0.32 |
| Example 1-3 | 8.2 | 5.6 | 0.15 / 0.15 | 17.0 | 5.1 | 0.26 / 0.65 | 8.4 | 7.4 | 0.67 / 0.32 |
| Example 1-4 | 8.2 | 5.8 | 0.15 / 0.15 | 17.0 | 5.3 | 0.26 / 0.65 | 8.4 | 7.6 | 0.67 / 0.32 |

TABLE 5

| | Blue organic EL device | | | Green organic EL device | | | Red organic EL device | | |
|---|---|---|---|---|---|---|---|---|---|
| | Emission efficiency (cd/A) | Voltage (V) | Chromaticity | Emission efficiency (cd/A) | Voltage (V) | Chromaticity | Emission efficiency (cd/A) | Voltage (V) | Chromaticity |
| Reference example 2 | 7.3 | 5.3 | 0.15 / 0.15 | 13.2 | 5.2 | 0.26 / 0.65 | 8.0 | 7.5 | 0.67 / 0.32 |
| Example 2-1 | 8.0 | 5.4 | 0.15 / 0.15 | 13.2 | 5.3 | 0.26 / 0.65 | 8.0 | 7.6 | 0.67 / 0.32 |
| Example 2-2 | 8.1 | 5.4 | 0.15 / 0.15 | 13.2 | 5.4 | 0.26 / 0.65 | 8.0 | 7.7 | 0.67 / 0.32 |
| Example 2-3 | 8.1 | 5.5 | 0.15 / 0.15 | 13.2 | 5.5 | 0.26 / 0.65 | 8.0 | 7.8 | 0.67 / 0.32 |
| Example 2-4 | 8.1 | 5.5 | 0.15 / 0.15 | 13.2 | 5.5 | 0.26 / 0.65 | 8.0 | 7.8 | 0.67 / 0.32 |

TABLE 6

| | Luminance half-life time | | |
|---|---|---|---|
| | Blue organic EL device | Green organic EL device | Red organic EL device |
| Reference example 3 | 240 h | 270 h | 170 h |
| Example 3-1 | 475 h | 270 h | 170 h |
| Example 3-2 | 495 h | 270 h | 170 h |
| Example 3-3 | 500 h | 270 h | 170 h |
| Example 3-4 | 500 h | 270 h | 170 h |

TABLE 7

| | Blue organic EL device | | | Green organic EL device | | | Red organic EL device | | |
|---|---|---|---|---|---|---|---|---|---|
| | Emission efficiency (cd/A) | Voltage (V) | Chromaticity | Emission efficiency (cd/A) | Voltage (V) | Chromaticity | Emission efficiency (cd/A) | Voltage (V) | Chromaticity |
| Reference example 3 | 7.3 | 5.3 | 0.15 / 0.15 | 13.2 | 5.2 | 0.26 / 0.65 | 8.0 | 7.5 | 0.67 / 0.32 |
| Example 3-1 | 8.1 | 5.3 | 0.15 / 0.15 | 13.2 | 5.3 | 0.26 / 0.65 | 8.0 | 7.6 | 0.67 / 0.32 |
| Example 3-2 | 8.3 | 5.4 | 0.15 / 0.15 | 13.2 | 5.4 | 0.26 / 0.65 | 8.0 | 7.7 | 0.67 / 0.32 |
| Example 3-3 | 8.3 | 5.5 | 0.15 / 0.15 | 13.2 | 5.5 | 0.26 / 0.65 | 8.0 | 7.8 | 0.67 / 0.32 |
| Example 3-4 | 8.3 | 5.5 | 0.15 / 0.15 | 13.2 | 5.5 | 0.26 / 0.65 | 8.0 | 7.8 | 0.67 / 0.32 |

TABLE 8

| | Luminance half-life time | | |
|---|---|---|---|
| | Blue organic EL device | Green organic EL device | Red organic EL device |
| Reference example 4 | 200 h | 300 h | 200 h |
| Example 4-1 | 530 h | 300 h | 200 h |
| Example 4-2 | 540 h | 300 h | 200 h |
| Example 4-3 | 545 h | 300 h | 200 h |
| Example 4-4 | 545 h | 300 h | 200 h |

TABLE 9

| | Blue organic EL device | | | Green organic EL device | | | Red organic EL device | | |
|---|---|---|---|---|---|---|---|---|---|
| | Emission efficiency (cd/A) | Voltage (V) | Chromaticity | Emission efficiency (cd/A) | Voltage (V) | Chromaticity | Emission efficiency (cd/A) | Voltage (V) | Chromaticity |
| Reference example 4 | 7.3 | 4.5 | 0.15 0.15 | 16.0 | 4.8 | 0.26 0.64 | 8.4 | 7.1 | 0.65 0.33 |
| Example 4-1 | 7.6 | 4.6 | 0.15 0.15 | 16.0 | 4.8 | 0.26 0.65 | 8.4 | 7.1 | 0.66 0.32 |
| Example 4-2 | 7.6 | 4.6 | 0.15 0.15 | 16.0 | 4.9 | 0.26 0.64 | 8.4 | 7.2 | 0.67 0.32 |
| Example 4-3 | 7.6 | 4.6 | 0.15 0.15 | 16.0 | 5.1 | 0.26 0.65 | 8.4 | 7.4 | 0.67 0.32 |
| Example 4-4 | 7.6 | 4.6 | 0.15 0.15 | 16.1 | 5.3 | 0.27 0.65 | 8.4 | 7.6 | 0.67 0.32 |

TABLE 10

| | Luminance half-life time | | |
|---|---|---|---|
| | Blue organic EL device | Green organic EL device | Red organic EL device |
| Reference example 5 | 150 h | 322 h | 198 h |
| Example 5-1 | 445 h | 320 h | 199 h |
| Example 5-2 | 448 h | 321 h | 201 h |
| Example 5-3 | 450 h | 322 h | 200 h |
| Example 5-4 | 450 h | 321 h | 202 h |

TABLE 11

| | Blue organic EL device | | | Green organic EL device | | | Red organic EL device | | |
|---|---|---|---|---|---|---|---|---|---|
| | Emission efficiency (cd/A) | Voltage (V) | Chromaticity | Emission efficiency (cd/A) | Voltage (V) | Chromaticity | Emission efficiency (cd/A) | Voltage (V) | Chromaticity |
| Reference example 5 | 7.0 | 4.8 | 0.15 0.15 | 16.2 | 4.6 | 0.26 0.64 | 8.4 | 7.1 | 0.65 0.33 |
| Example 5-1 | 7.8 | 4.7 | 0.15 0.15 | 16.2 | 4.7 | 0.26 0.65 | 8.4 | 7.1 | 0.66 0.32 |
| Example 5-2 | 7.8 | 4.8 | 0.15 0.15 | 16.3 | 4.6 | 0.26 0.64 | 8.5 | 7.2 | 0.67 0.32 |
| Example 5-3 | 7.8 | 4.9 | 0.15 0.15 | 16.2 | 4.6 | 0.26 0.65 | 8.4 | 7.4 | 0.67 0.32 |
| Example 5-4 | 7.8 | 4.9 | 0.15 0.15 | 16.2 | 4.6 | 0.27 0.65 | 8.6 | 7.6 | 0.67 0.32 |

TABLE 12

| | Luminance half-life time | | |
|---|---|---|---|
| | Blue organic EL device | Green organic EL device | Red organic EL device |
| Reference example 6 | 190 h | 330 h | 180 h |
| Example 6-1 | 300 h | 328 h | 181 h |
| Example 6-2 | 310 h | 329 h | 182 h |
| Example 6-3 | 310 h | 330 h | 183 h |
| Example 6-4 | 310 h | 330 h | 183 h |

TABLE 13

| | Blue organic EL device | | | Green organic EL device | | | Red organic EL device | | |
|---|---|---|---|---|---|---|---|---|---|
| | Emission efficiency (cd/A) | Voltage (V) | Chromaticity | Emission efficiency (cd/A) | Voltage (V) | Chromaticity | Emission efficiency (cd/A) | Voltage (V) | Chromaticity |
| Reference example 6 | 6.5 | 6.1 | 0.15 0.15 | 16.1 | 4.6 | 0.25 0.64 | 8.4 | 7.3 | 0.65 0.31 |
| Example 6-1 | 6.6 | 6.1 | 0.15 0.15 | 16.2 | 4.7 | 0.26 0.65 | 8.4 | 7.3 | 0.66 0.32 |
| Example 6-2 | 6.6 | 6.1 | 0.15 0.15 | 16.2 | 4.6 | 0.26 0.64 | 8.5 | 7.2 | 0.66 0.32 |
| Example 6-3 | 6.6 | 6.2 | 0.15 0.15 | 16.2 | 4.6 | 0.26 0.65 | 8.4 | 7.4 | 0.67 0.32 |
| Example 6-4 | 6.7 | 6.2 | 0.15 0.15 | 16.2 | 4.6 | 0.27 0.65 | 8.6 | 7.3 | 0.67 0.33 |

TABLE 14

| | Blue organic EL device | | | |
|---|---|---|---|---|
| | Luminance half-life time | Emission efficiency (cd/A) | Voltage (V) | Chromaticity |
| Reference example 7 | 500 h | 8.3 | 5.5 | 0.15, 0.15 |
| Example 7-1 | 520 h | 8.2 | 5.2 | 0.15, 0.15 |
| Reference example 8 | 500 h | 8.3 | 5.5 | 0.15, 0.15 |
| Example 7-2 | 520 h | 8.2 | 5.2 | 0.15, 0.15 |

As evidenced in Table 2 (Example 1-1), as a result of the common hole transport layer 16 having a thickness of 1 nm being provided, luminance half-life time of the blue organic EL device 10B has improved from 240 hours to 480 hours compared to Reference example 1 in which the common hole transport layer 16D is not provided. Further, as evidenced in Table 3, emission efficiency has improved from 7.2 cd/A to 8.0 cd/A. A reason for this is considered to be that, as a result of the common hole transport layer 16D formed by deposition being inserted between the blue hole injection layer 16BB formed by spin coat method (coating method) and the blue light emitting layer 16CB formed by deposition, environmental contamination due to moisture, dust and the like in the air is reduced, and the interface of the blue light emitting layer 16CB is improved, thereby improving the hole transport capability.

In addition, as a result of the thickness of the common hole transport layer 16D being 2 nm, luminance half-life time and emission efficiency are further improved. That is, as a result of the common hole transport layer 16D having a thickness of 1 nm or more being provided, significant improvement in luminance half-life time and emission efficiency is seen. Moreover, as a result of the thickness being 2 nm or more, luminance half-life time and emission efficiency are further improved. However, as evidenced in Examples 1-2 to 1-4, since the drive voltage tends to increase as a result of the common hole transport layer 16D being made thick, the thickness of the common hole transport layer 16D is preferably suitably 1 nm to 10 nm, both inclusive.

As is evidenced in Table 4 to Table 13, the foregoing effects are not limited to the low molecular material used in Example 1, and are obtained regardless of the combination as long as the compounds given as specific examples in Formulas 1 to 3 are used. Specifically, the low molecular materials used in the red light emitting layer 16CR, the green light emitting layer 16CG, the blue hole transport layer 16BB, and the common hole transport layer 16D may all be the same as in Example 2, or the low molecular materials may all differ as in Example 5. Further, the low molecular materials added to the red light emitting layer 16CR and the green light emitting layer 16CG may differ as in Example 6. In this way, the characteristics of the blue organic EL device 10B improve as a result of the common hole transport layer 16D being provided. In particular, luminance half-life time is significantly improved by about twice or more a blue organic EL device.

As is evidenced in Table 8, even in Example 2 in which the blue hole transport layer 26BB is not provided and the common hole transport layer 26D is formed directly on the blue hole injection layer 26AB, effects similar to those of Examples 1-1 to 1-12 are obtained, and luminance half-life time in particular further improves.

Next, life, emission efficiency, drive voltage, and chromaticity of the blue organic EL device 10B were measured at each film thickness 1 nm to 10 nm, in the case where the polymer material (TFB) indicated in Formula (4-1) is used in the blue hole transport layer 16BB, and the low molecular material indicated in Formula (2-66) (Example 8) and the low molecular material indicated in Formula (2-6) (Example 9) are used in the common hole transport layer 16D. Table 15 is a list of the compositions of Examples 8 and 9. Table 16 indicates measurement results thereof. The composition, manufacturing method, and measurement conditions of the blue organic EL device 10B are similar to those of the foregoing Examples 1 to 6.

TABLE 15

| | Common hole transport layer | | Blue light emitting layer | |
|---|---|---|---|---|
| | Material | Thickness (nm) | Hole transport material | Light emitting layer |
| Example 8-1 | Formula (2-66) | 1 | Formula (4-1) | AND |
| Example 8-2 | Formula (2-66) | 2 | Formula (4-1) | AND |
| Example 8-3 | Formula (2-66) | 5 | Formula (4-1) | AND |
| Example 8-4 | Formula (2-66) | 10 | Formula (4-1) | AND |
| Example 9-1 | Formula (2-6) | 1 | Formula (4-1) | AND |
| Example 9-2 | Formula (2-6) | 2 | Formula (4-1) | AND |
| Example 9-3 | Formula (2-6) | 5 | Formula (4-1) | AND |
| Example 9-4 | Formula (2-6) | 10 | Formula (4-1) | AND |

TABLE 16

| | Blue organic EL device | | | |
|---|---|---|---|---|
| | Luminance half-life time | Emission efficiency (cd/A) | Voltage (V) | Chromaticity |
| Reference example 1 | 240 h | 7.2 | 5.3 | 0.15, 0.15 |
| Example 8-1 | 260 h | 7.5 | 5.4 | 0.15, 0.15 |
| Example 8-2 | 400 h | 8.0 | 5.5 | 0.15, 0.15 |
| Example 8-3 | 550 h | 8.3 | 5.6 | 0.15, 0.15 |
| Example 8-4 | 550 h | 8.3 | 5.7 | 0.15, 0.15 |
| Reference example 2 | 230 h | 7.3 | 5.3 | 0.15, 0.15 |
| Example 9-1 | 275 h | 7.6 | 5.3 | 0.15, 0.15 |
| Example 9-2 | 420 h | 8.0 | 5.4 | 0.15, 0.15 |
| Example 9-3 | 500 h | 8.2 | 5.5 | 0.15, 0.15 |
| Example 9-4 | 500 h | 8.2 | 5.5 | 0.15, 0.15 |

As is evidenced in Table 16, luminance half-life time when the thickness of the common hole transport layer 16D is 1 nm is almost equal to those of Reference examples 1 and 2, and improvement to the degree of that in Examples 1 to 6 that use a low molecular material in the blue hole transport layer 16BB could not be seen. However, as a result of the thickness of the common hole transport layer 16D being increased, luminance half-life time gradually improves, and an effect in which luminance half-life time obtained in Examples 1 to 6 is exceeded at a thickness of 5 nm or more is obtained. Reasons for this are considered to be as follows. First, although the degree of hole mobility in the oligomer material and the polymer material is decreased compared to that of the low molecular materials (particularly monomers) due to the molecular weight, as a result of the common hole transport layer 16D being provided, decrease in the degree of hole mobility in the blue hole transport layer 16BB is reduced and electrical characteristics are improved. Further, since glass transition point of a polymer material is generally higher than that of a monomer, heat treatment at a high temperature is able to be performed. In the result, residues of solvent and the like used during manufacturing that cause deterioration are able to be reduced. From the foregoing, the results of the foregoing examples are thought to be able to be obtained.

Figure 15:
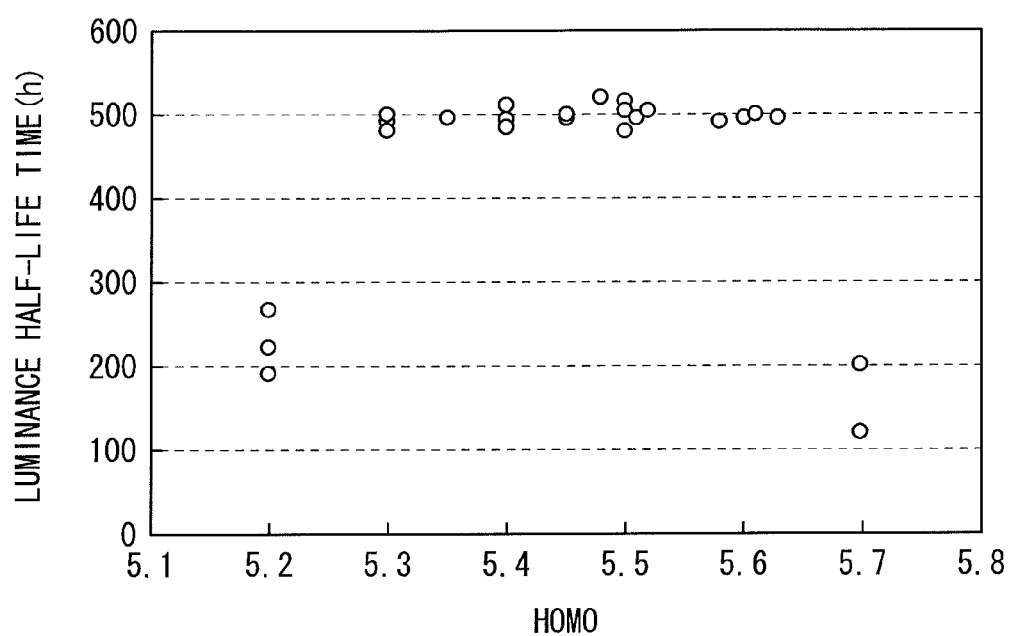
FIG. 15 is a characteristics diagram illustrating a relationship between HOMO value and luminance half-life time.

However, the effect of improvement in luminance half-life time as a result of a polymer material being used in the blue hole transport layer 16BB, as described above, is not obtained with all polymers, and is obtained by polymers having a characteristic in which the value of HOMO is within a certain range. FIG. 15 is a characteristics diagram illustrating a relationship between each HOMO value and luminance half-life time when polymer materials having various HOMO values are used in the blue hole transport layer 16BB. The material, film thickness, and other conditions of the common hole transport layer 16D are based on those of Example 9-4. The HOMO value indicated herein is a value measured by an atmospheric photoelectron spectroscopy. As is evidenced in FIG. 15, luminance half-life time in the case where a polymer material having a HOMO value within a range of 5.3 to 5.6, both inclusive, is used in the blue hole transport layer 16BB is significantly improved, whereas improvement in luminance half-life time is not seen or tends to worsen in the case where a polymer material having a HOMO value of 5.2 or less, or 5.7 or more, is used. Reasons for this is considered to be as follows. The HOMO value of many of the low molecular materials used in the common hole transport layer 16D indicates 5.4 to 5.6, both inclusive. In the case where a polymer material having a HOMO value of 5.2 or less, or 5.7 or more, is used in the blue hole transport layer 16BB, the difference in HOMO values between the common hole transport layer 16D and the blue hole transport layer 16BB increases, and the barrier during hole transport increases. In the result, the efficiency of hole injection into the blue light emitting layer 16CB decreases, and luminance half-life time worsens. The HOMO value of the TFB used in Examples 8 and 9 is 5.45. From the foregoing, as a result of a polymer material having a HOMO value of 5.3 to 5.6, both inclusive, being used in the blue hole transport layer 16BB, luminance half-life time is further improved.

In Examples 1 to 9, the hole injection layers 16AR, 16AG, and 16AB, and the hole transport layers 16BR, 16BG, and 16BB are formed using spin coat method. However, the method is not limited to a coating method. Results similar to those of the examples were able to be obtained even in an organic EL display unit formed using various printing methods, such as inkjet method, nozzle coat method, offset method, and flexographic method.

While the present invention has been described above with reference to the embodiments and the example, the invention is not limited to the foregoing embodiments and the foregoing examples, and various modifications may be made.

For example, the material, the thickness, the film-forming method, the film-forming conditions and the like of each layer are not limited to those described in the foregoing embodiments and the foregoing examples, and other material, other thickness, other film-forming method, and other film-forming conditions may be adopted.

Further, although a low molecular material (monomer) is used in the blue hole transport layer 16BB in the foregoing Examples 1 to 7, the material is not limited thereto, and polymerized oligomer materials and polymer materials may be used. For example, in addition to the polymer materials used in Examples 8 and 9, as long as the HOMO is within the foregoing suitable range, a plurality of molecules having different average molecular weight may be mixed to adjust hole transport capability. In the case where a low molecular material is used in a coating method such as spin coat method and inkjet method, since the viscosity of the solution to be used to coat generally decreases, adjustment range of the film thickness may be limited. This issue is solved by an oligomer material or a polymer material in which the molecular weight is increased being used.

Further, in the foregoing embodiments and the foregoing examples, the common hole transport layer 16D is formed by the evaporation method using one type of low molecular material. However, the characteristics of the blue organic EL device 10B is able to be improved by the common hole transport layer 16D being formed by co-evaporation method using a plurality of low molecular materials having differing molecular weight, such as Formula (2-9) and Formula (2-10), as well. Further, the effect of improvement in blue-color characteristics is obtained even in the case where the common hole transport layer 16D is formed by a combination of the low molecular materials in Formula (2-9) and Formula (2-10) with a thickness of 1 nm or more.

In addition, in the foregoing embodiments and the foregoing examples, hole transport characteristics are improved by a low molecular material being added to the red light emitting layer 16CR and the green light emitting layer 16CG. However, similar effects are able to be obtained by a structure handling hole transport or a polymer material having a substituent being used as the polymer material composing the red light emitting layer 16CR and the green light emitting layer 16CG.

Further, in the foregoing embodiments and the foregoing examples, the description has been specifically given of the structure of the organic light emitting devices 10R, 10G, and 10B. However, it is not necessary to provide all layers, and other layer may be further provided. In addition, in the foregoing embodiments and the foregoing examples, a display unit that includes the red and green organic EL devices as the organic EL devices other than the blue organic EL device is described. However, the present invention is also applicable to a display device composed of blue organic EL devices and yellow organic EL devices.

Still further, according to the foregoing embodiment, the description has been given of the active matrix display unit. However, the invention is also applicable to a passive matrix display unit. Furthermore, the configuration of the pixel drive circuit for driving the active matrix is not limited to the structure described in the foregoing embodiments and the foregoing examples. If necessary, a capacity device or a transistor may be added. In this case, according to the change of the pixel drive circuit, a necessary drive circuit may be added in addition to the foregoing signal line drive circuit 120 and the foregoing scanning line drive circuit 130.

The present application contains subject matter related to that disclosed in Japanese Priority Patent Application JP 2010-090724 filed in the Japan Patent Office on Apr. 9, 2010 and Japanese Priority Patent Application JP 2010-140561 filed in the Japan Patent Office on Jun. 21, 2010, the entire contents of which is hereby incorporated by references.

It should be understood by those skilled in the art that various modifications, combinations, sub-combinations and alternations may occur depending on design requirements and other factors insofar as they are within the scope of the appended claims or the equivalents thereof.

What is claimed is:
1. An organic electroluminescence display unit comprising:
    a respective lower electrode provided on a substrate for each of a first blue organic electroluminescence device and a second organic electroluminescence device of a color different from blue;
    a respective first hole injection/transport layer provided on the lower electrode for each of the first blue organic electroluminescence device and the second organic electroluminescence device;
    a respective organic light emitting layer of the color different from blue provided on the first hole injection/transport layer for the second organic electroluminescence device;
    a second hole injection/transport layer made of a low molecular material, and provided on the entire surfaces of the organic light emitting layer of the color different from blue and the first hole injection/transport layer for the first blue organic electroluminescence device;
    a blue organic light emitting layer provided on the entire surface of the second hole injection/transport layer; and
    an electron injection/transport layer and an upper electrode that are provided in sequence on the entire surface of the blue organic light emitting layer.
2. The organic electroluminescence display unit of claim 1, wherein the second organic electroluminescence device is at least one of a red organic electroluminescence device, a green organic electroluminescence device, and a yellow organic electroluminescence device.
3. The organic electroluminescence display unit of claim 2, wherein the organic light emitting layer of the color different from blue includes a polymer material and a low molecular material, and a mixture ratio of the polymer material to the low molecular material is 10:1 to 1:2, both inclusive.
4. The organic electroluminescence display unit of claim 1, wherein the blue organic light emitting layer includes a low molecular material.
5. The organic electroluminescence display unit of claim 1, wherein
    the first hole injection/transport layer comprises a hole injection layer and a hole transport layer formed on the hole injection layer,
    the hole transport layer of the first blue organic electroluminescence device includes a low molecular material, and
    the first hole injection/transport layer of the second organic electroluminescence device includes a polymer material.
6. The organic electroluminescence display unit of claim 1, wherein
    the first hole injection/transport layer comprises a hole injection layer and a hole transport layer formed on the hole injection layer,
    the hole transport layer of the first blue organic electroluminescence device includes a polymer material, and
    the first hole injection/transport layer of the second organic electroluminescence device includes a polymer material.
7. The organic electroluminescence display unit of claim 1, wherein
    the first hole injection/transport layer of the second organic electroluminescence device includes a polymer material, and
    the first blue organic electroluminescence device is composed of only the hole injection layer.
8. The organic electroluminescence display unit of claim 3, wherein the low molecular material is a compound expressed by Formula 1:

Formula 1

(1)

where A1 to A3 represent an aromatic hydrocarbon group, a heterocyclic group, or a derivative thereof.
9. The organic electroluminescence display unit of claim 3, wherein the low molecular material is a compound expressed in Formula 2; however, excluding the compounds included in Formula 1:

Formula 2

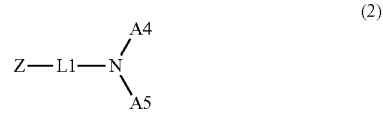
(2)

where Z represents a nitrogen-containing hydrocarbon group or a derivative thereof; L1 represents a group in which one to four bivalent aromatic ring groups are bonded, and specifically, a bivalent group in which one to four aromatic rings are bonded, or a derivative thereof; A4 and A5 represent an aromatic hydrocarbon group, an aromatic heterocyclic group, or a derivative thereof; however, A4 and A5 may bond to each other and form a ring-shaped structure.

10. The organic electroluminescence display unit of claim 3, wherein the low molecular material is a compound expressed in Formula 3; however, excluding the compounds included in Formula 1:

Formula 3

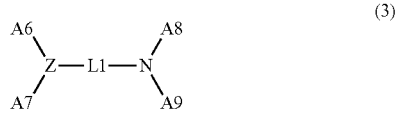

(3)

where L1 represents a group in which two to six bivalent aromatic ring groups are bonded, and specifically, a bivalent group in which two to six aromatic rings are bonded or a derivative thereof; A6 to A9 represent a group in which one to ten aromatic hydrocarbon groups, heterocyclic groups, or a derivative thereof are bonded.

11. The organic electroluminescence display unit of claim 3, wherein the blue organic light emitting layer is made of a compound expressed in Formula 4:

Formula 4

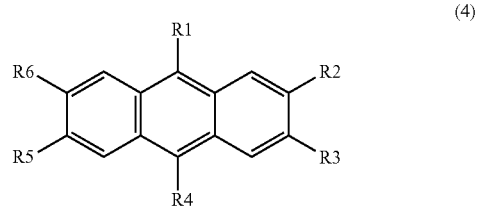

(4)

where R1 to R6 represent a hydrogen atom, a halogen atom, a hydroxyl group, a cyano group, a nitro group; a group having a carbonyl group with a carbon number of 20 or less; a group having a carbonyl ester group; an alkyl group, an alkenyl group, an alkoxyl group or a derivative thereof; a group having a silyl group with a carbon number of 30 or less; or a group having an aryl group, a group having a heterocyclic group, a group having an amino group, or a derivative thereof.

12. A method of manufacturing an organic electroluminescence display unit, comprising:
  forming a respective lower electrode on a substrate for each of a first blue organic electroluminescence device and a second organic electroluminescence device of a color different from blue;
  forming a respective first hole injection/transport layer on the lower electrode for each of the first blue organic electroluminescence device and the second organic electroluminescence device;
  forming a respective organic light emitting layer of the color different from blue on the first hole injection/transport layer for the second organic electroluminescence device;
  forming a second hole injection/transport layer made of a low molecular material on the entire surfaces of the organic light emitting layer of the color different from blue and the first hole injection/transport layer for the first blue organic electroluminescence device;
  forming a blue organic light emitting layer on the entire surface of the second hole injection/transport layer; and
  forming, in sequence, an electron injection/transport layer and an upper electrode on the entire surface of the blue organic light emitting layer.

13. The method of claim 12, wherein the organic light emitting layer of the color different from blue is formed by a coating method.

14. The method of claim 12, wherein the organic light emitting layer of the color different from blue is formed using a mixture including the low molecular material and a polymer material.

15. The method of claim 12, wherein the second hole injection/transport layer is formed by an evaporation method.

16. The method of claim 12, wherein the blue organic light emitting layer is formed by an evaporation method.

\* \* \* \* \*